(12) United States Patent
Roy et al.

(10) Patent No.: US 11,366,161 B2
(45) Date of Patent: Jun. 21, 2022

(54) TRUE SINGLE PHASE CLOCK (TSPC) PRE-CHARGE BASED FLIP-FLOP

(71) Applicant: SAMSUNG ELECTRONICS CO., LTD., Suwon-si (KR)

(72) Inventors: Arani Roy, Suwon-si (KR); Arava Prakash, Suwon-si (KR); Aroma Bhat, Suwon-si (KR); Mitesh Goyal, Suwon-si (KR); Abhishek Ghosh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/117,544

(22) Filed: Dec. 10, 2020

(65) Prior Publication Data
US 2021/0173006 A1     Jun. 10, 2021

(30) Foreign Application Priority Data

Dec. 10, 2019  (IN) .............................. 201941051135
Dec. 2, 2020   (IN) .............................. 201941051135

(51) Int. Cl.
*G01R 31/3177* (2006.01)
*G01R 31/317* (2006.01)
*H03K 3/037* (2006.01)

(52) U.S. Cl.
CPC ... *G01R 31/3177* (2013.01); *G01R 31/31727* (2013.01); *H03K 3/0372* (2013.01)

(58) Field of Classification Search
CPC .......... G01R 31/3177; G01R 31/31727; H03K 3/0372

(Continued)

(56) References Cited

U.S. PATENT DOCUMENTS

| 5,530,706 A | * | 6/1996 | Josephson | ...... | G01R 31/318541 |
| | | | | | 307/407 |
| 5,917,355 A | * | 6/1999 | Klass | ............... | H03K 3/356121 |
| | | | | | 327/208 |

(Continued)

FOREIGN PATENT DOCUMENTS

| CN | 102497201 A | 6/2012 |
| CN | 202444477 U | 9/2012 |

(Continued)

OTHER PUBLICATIONS

Grohoski et al., Single Clock CMOS Latch Compatible With Level-Sensitive Scan Design, Feb. 1, 1989, IP.com, pp. 1-3. (Year: 1989).*

(Continued)

*Primary Examiner* — John J Tabone, Jr.
(74) *Attorney, Agent, or Firm* — Sughrue Mion, PLLC

(57) ABSTRACT

A True Single Phase Clock (TSPC) pre-charge based flip-flop is provided. The flip-flop includes a scan section, a master section, and a slave section. The scan section receives a scan enable signal, a scan input signal, a clock signal, and feedback data from the master section, and outputs an internal signal to the master section based on the scan enable signal, the scan input signal, the clock signal, and the feedback data. The master section is coupled to the scan section and receives the internal signal and a data input, and outputs a master feedback signal to the slave section based on the internal signal, the data input, and the feedback data. The slave section is coupled to the master section and generates an output by latching the master feedback signal received from the master section according to the clock signal. The clock signal is a True-Single-Phase-Clock (TSPC).

20 Claims, 40 Drawing Sheets

(58) Field of Classification Search
USPC .......................................... 714/727, 726, 729
See application file for complete search history.

(56) References Cited

U.S. PATENT DOCUMENTS

| | | | | |
|---|---|---|---|---|
| 5,933,038 | A * | 8/1999 | Klass | ..................... H03K 3/037 |
| | | | | 327/208 |
| 6,023,179 | A * | 2/2000 | Klass | ................... H03K 3/0372 |
| | | | | 326/98 |
| 7,915,925 | B2 | 3/2011 | Cong | |
| 9,065,431 | B2 | 6/2015 | Kim et al. | |
| 9,196,329 | B1 * | 11/2015 | Yanni | ........................ G11C 7/22 |
| 10,659,017 | B1 * | 5/2020 | Rengarajan | .... G01R 31/318541 |
| 2010/0308864 | A1 | 12/2010 | Lee et al. | |
| 2011/0072326 | A1 * | 3/2011 | Vahidsafa | .............. G11C 29/32 |
| | | | | 714/731 |
| 2013/0043921 | A1 * | 2/2013 | Dixit | ............... H03K 3/356156 |
| | | | | 327/202 |
| 2021/0099161 | A1 * | 4/2021 | Rasouli | ................ H03K 3/0372 |

FOREIGN PATENT DOCUMENTS

| | | |
|---|---|---|
| CN | 105162438 B | 10/2017 |
| EP | 2 184 852 A1 | 5/2010 |

OTHER PUBLICATIONS

Ahlawat et al., A New Scan Flip Flop Design to Eliminate Performance Penalty of Scan, 2015, IEEE, pp. 25-30. (Year: 2015).*

Yuan et al., New TSPC Latches and Flipflops Minimizing Delay and Power, 1996, IEEE, pp. 160-161 (Year: 1996).*

Yuan et al., A True Single-Phase-Clock Dynamic CMOS, 1987, IEEE, pp. 899-901. (Year: 1987).*

Communication dated May 11, 2021, from the European Patent Office in European Application No. 20212565.4.

* cited by examiner

TRUE SINGLE PHASE CLOCK (TSPC) PRE-CHARGE BASED FLIP-FLOP

CROSS REFERENCE TO RELATED APPLICATION

This application is based on and claims priority from Indian Provisional Application 201941051135, filed on Dec. 10, 2019 in the Indian Patent Office, and from Indian Patent Application No. 201941051135, filed on Dec. 2, 2020 in the Indian Patent Office, the entire contents of each of which are incorporated by reference herein in their entireties.

BACKGROUND

1. Field

The present disclosure relates to the field of flip-flops and more particularly to a True-Single-Phase-Clock (TSPC) pre-charge based flip-flop.

2. Description of the Related Art

Flip-flops are commonly used in sequential logic circuits to temporarily store binary data or to perform scan test operations. Performance of the flip-flops may be analyzed in terms of System on Chip (SoC) area, delay and power.

Flip-flops may incorporate a multiplexer using a cross-coupled structure. In the cross-coupled structure, the multiplexer path for the data input signal D makes data input slower, thereby resulting in a larger delay in the data input to the output path (i.e. from a D to an output Q). Further, the multiplexer may be prone to more variations. In addition, manufacturing of the multiplexer with the cross-coupled structure may be expensive.

SUMMARY

It is an aspect to provide a True Single Phase Clock (TSPC) pre-charge based flip-flop.

It is another aspect to provide methods and systems for enabling the flip-flop to operate as a scan flip-flop by including a scan section, a master section, and a slave section, wherein the scan section is integrated with the TSPC that enables a faster arrival of data at the slave section and nodes of the scan section, the master section, and the slave section are pre-charged to enable changes in an input to reflect faster in an output on the slave section.

It is yet another aspect to provide methods and systems for enabling the scan flip-flop to perform a set operation, and a reset operation by including a set functionality, and a reset functionality respectively.

According to an aspect of one or more embodiments, there is provided flip-flop comprising a scan section; a master section; and a slave section, wherein the scan section is configured to receive a scan enable signal, a scan input signal, a clock signal, and feedback data from the master section, and output an internal signal to the master section based on the scan enable signal, the scan input signal, the clock signal, and the feedback data, wherein the master section is coupled to the scan section and is configured to receive the internal signal and a data input, and output a master feedback signal to the slave section based on the internal signal, the data input, and the feedback data, wherein the slave section is coupled to the master section and configured to generate an output by latching the master feedback signal received from the master section according to the clock signal, and wherein the clock signal is a True-Single-Phase-Clock (TSPC).

According to another aspect of one or more embodiments, there is provided a flip-flop comprising a scan section; a master section; and a slave section, wherein the scan section comprises a first scan stage configured to receive a scan enable signal, and output an inverted scan enable signal to a first scan-stage output node; a second scan stage configured to receive a clock signal, a scan input signal, and the scan enable signal, and output a signal SINCK as an AND-OR function of the clock signal, the scan input signal, and the scan enable signal to a second scan-stage output node; and a third scan stage configured to receive the signal SINCK from the second scan stage, the inverted scan enable signal from the first scan stage, and feedback data from the master section, the feedback data corresponding to previously stored data in the master section, and output inverted feedback data to a third scan-stage output node, wherein the master section comprises a first master stage configured to receive the signal SINCK from the second scan stage and output an inverted signal Nsin, which is an inversion of the signal SINCK, to a first master-stage output node; a second master stage configured to receive the inverted signal Nsin from the first master stage, the inverted scan enable signal from the first scan stage, a data input, the inverted feedback data from the third scan stage, a master feedback signal, and output the feedback data to a second master-stage output node; and a master-slave stage configured to receive the feedback data from the second master stage, and the clock signal, and output the master feedback signal to a common master-slave stage output node, wherein the slave section comprises an OR-AND-Invert logic (OAI) gate configured to receive the master feedback signal from the master-slave stage and the clock signal, and to provide an OAI output on an OAI gate output node, wherein the OAI output corresponds to 1 or 0; and a slave output stage configured to receive the OAI output of the OAI gate from the OAI gate output node, and generate an output on an output node, and wherein the clock signal is a True-Single-Phase-Clock (TSPC).

According to another aspect of one or more embodiments, there is provided a flip-flop comprising a scan section; a slave section; a master section connected between the scan section and the slave section; and a True-Single-Phase-Clock (TSPC) connected to the scan section, the slave section and the master section, wherein the master section receives a data input from outside the flip-flop and at least one internal signal from the scan section, and outputs feedback data to the scan section and master feedback data to the slave section, wherein the scan section receives a scan enable signal, a scan input signal, and the feedback data, and outputs the at least one internal signal to the master section based on the scan enable signal, the scan input signal, the TSPC, and the feedback data, and wherein the slave section generates an output by latching the master feedback signal according to the TSPC.

BRIEF DESCRIPTION OF FIGURES

These and other aspects will be better appreciated and understood when considered in conjunction with the following description and the accompanying drawings, in which.

DETAILED DESCRIPTION

The example embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The description herein is intended merely to facilitate an understanding of ways in which the example embodiments herein may be practiced and to further enable those of skill in the art to practice the example embodiments herein. Accordingly, this disclosure should not be construed as limiting the scope of the example embodiments herein.

Figure 1:
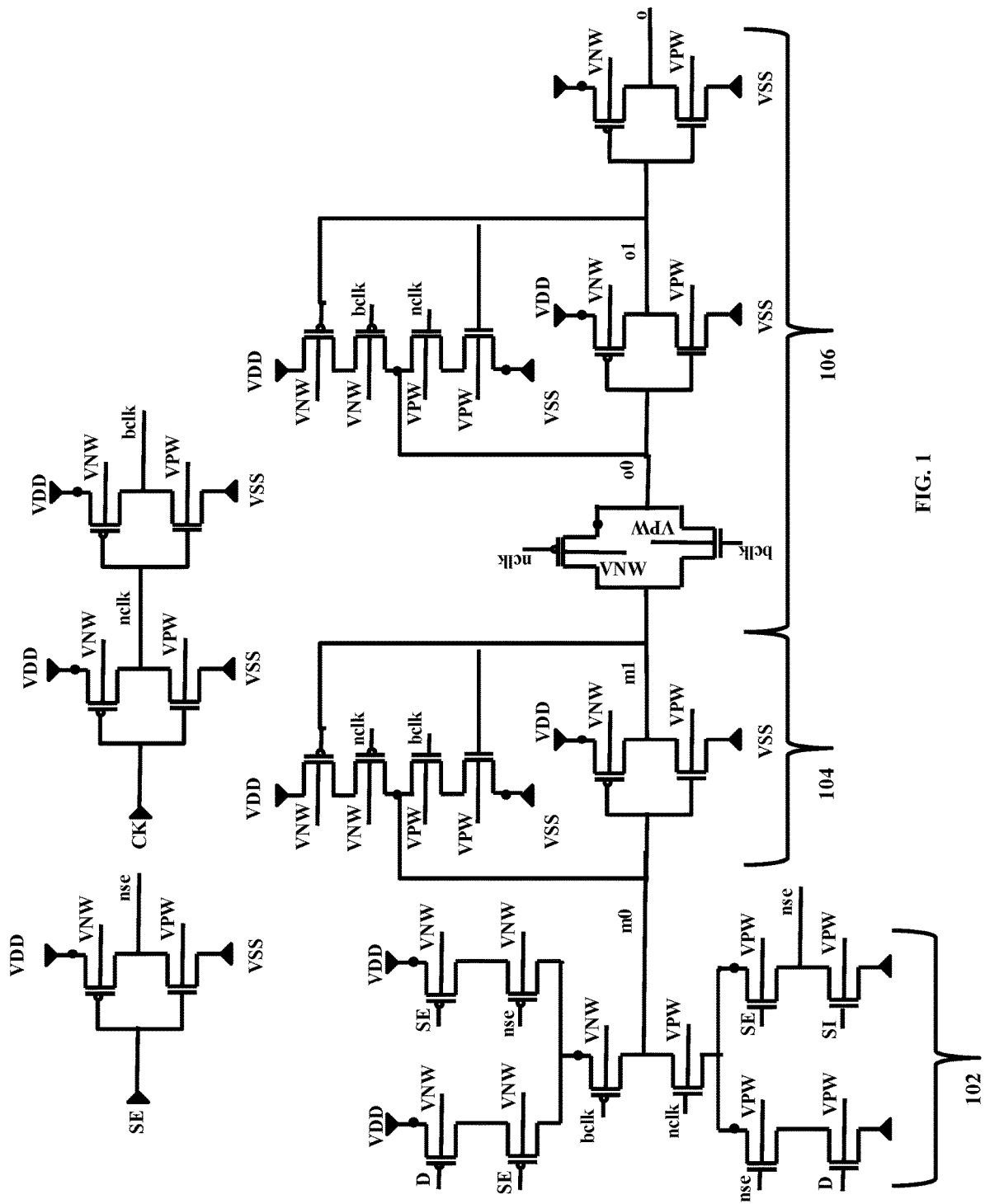
FIG. 1 is a circuit diagram depicting a scan flip-flop according to the related art.

FIG. 1 is a circuit diagram depicting a related art scan flip-flop. As depicted in FIG. 1, a scan flip-flop 100 includes a multiplexer 102, a master latch 104, and a slave latch 106. The multiplexer 102 may be implemented as a cross-coupled structure. The multiplexer 102 receives a data input signal D, and a scan input signal. The multiplexer 102 selects one signal from the data input signal D and the scan input signal IS depending on a logic level of a scan enable signal SE that indicates an operation mode and provides the selected signal as an internal signal (IS) to the master latch 104.

The master latch 104 may latch the internal signal IS based on a clock signal (CLK). The slave latch 106 may latch an output of the master latch 104 to supply an output signal Q based on the clock signal CLK. However, the multiplexer path for the data input signal D makes data input slower, thereby resulting in a larger delay in the data input to the output path (i.e. from the D to the output Q). Further, the multiplexer 102 with the cross-coupled structure may be prone to more variations. In addition, manufacturing of the multiplexer 102 with the cross-coupled structure may be expensive.

Various embodiments herein disclose a True Single Phase Clock (TSPC) pre-charge based flip-flop. Referring now to the drawings, and more particularly to FIGS. 2A through 16, where similar reference characters denote corresponding features consistently throughout the figures, there are shown various example embodiments.

Figure 2A:
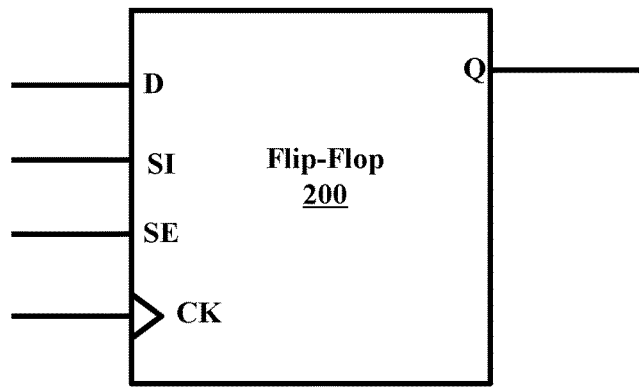
FIGS. 2A and 2B depict a True Single Phase Clock (TSPC) pre-charge based flip-flop, according to various embodiments.
Figure 2B:
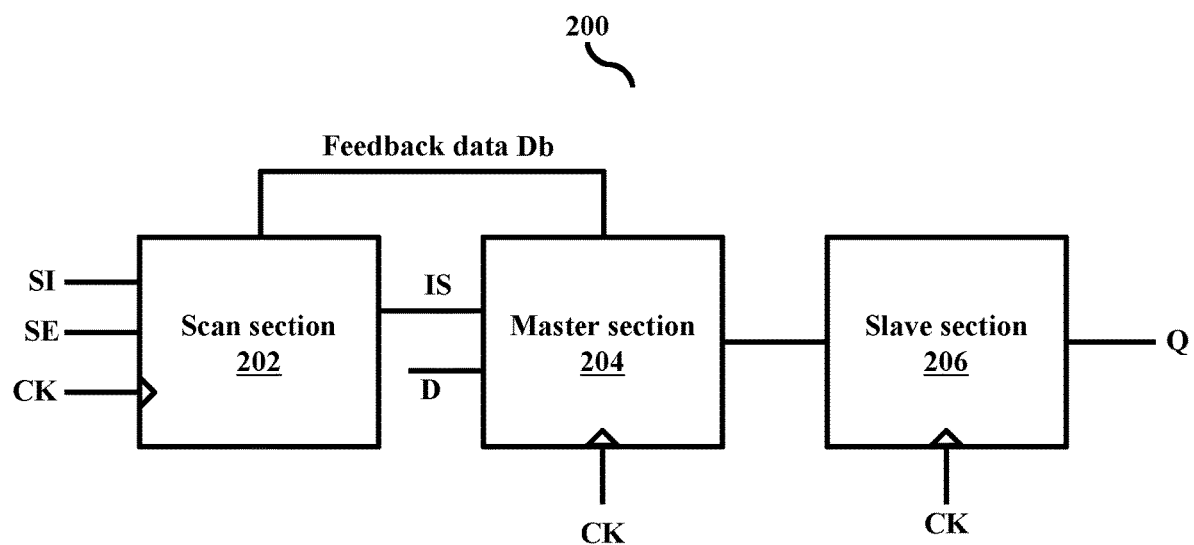

FIGS. 2A and 2B depict a True Single Phase Clock (TSPC) pre-charge based flip-flop 200, according to various embodiments. The flip-flop 200 may be implemented in an integrated circuit of an electronic device (not shown). Examples of the electronic device, may be, but are not limited to, a mobile phone, a smartphone, a tablet, a phablet, a personal digital assistant (PDA), a laptop, a computer, a wearable computing device, a server, a vehicle infotainment device, an Internet of Things (IoT) device, or any other device which may implement/use a flip-flop. In an embodiment, the integrated circuit may be defined by at least one of, but is not limited to, a plurality of cells/standardized logic circuit blocks, sequential logic circuits, high performance application processors, high-performance arithmetic blocks, and so on. The plurality of cells may be designed using a cell library. The cell library includes characteristic information of the plurality of cells such as, but not limited to, a name of a cell, a dimension, a gate width, a pin, delay characteristic, a leakage current, a threshold voltage, a function, and so on. The cell library set may also include basic cells such as, but not limited to, an AND gate, an OR gate, a NOR gate, an inverter, and so on. The cell library set may also include, complex cells such as, but not limited to, an OR/AND/INVERTER (OAI) gate, an AND/OR/INVERTER (AOI) gate, and so on.

In an embodiment, the flip-flop 200 may be a scan flip-flop. The scan flip-flop 200 may be an edge triggered D flip-flop including two inputs: a data input D and a scan input signal SI. The flip-flop 200 may operate in one of two modes by selecting one of the data input D and the scan input signal SI using a scan enable signal SE (i.e., a control signal). The modes may be a normal/functional mode, and a test/scan mode. When the scan enable signal SE is low, the flip-flop 200 operates in the normal mode. In the normal mode, the flip-flop 200 latches/stores the data input D. When the scan enable signal SE is high, the flip-flop 200 operates in the test mode. In the test mode, the flip-flop 200 selects the scan input signal SI and performs scan test operations. The scan test operations may include setting a certain number of flip-flops in a scan chain through the scan enable signal SE and the scan input signal SI, and implementing certain test patterns to check correctness at the output of the flip-flops in the scan chain.

In an embodiment as depicted in FIG. 2B, the flip-flop 200 may include a scan section 202, a master section 204, and a slave section 206. The master section 204 may also be referred to as a master latch, and the slave section 206 may also be referred to as a slave latch. In an embodiment, the flip-flop 200 may include a True-Single-Phase-Clock (TSPC) instead of clock buffers. The TSPC may include a single phase of the clock that may be either a clock signal or an inverted clock signal. The scan section 202, the master section 204 and the slave section 206 of the flip-flop 200 may be operated using the TSPC, which increases the performance of the flip-flop 200 and decreases consumption of an area on the integrated chip rather is used to implement the flip-flop 200. In an embodiment, the flip-flop 200 may be an edge-triggered flip-flop, wherein an output of the flip-flop 200 may change on a raising edge or a falling edge of the clock. In an embodiment, nodes of the scan section 202, the master section 204 and the slave section 206 of the flip-flop 200 may be pre-charged to at least one voltage level, so that any changes in the input reflect faster in the output of the flip-flop 200. The nodes of the scan section 202, the master section 204 and the slave section 206 of the flip-flop 200 may be pre-charged to enable passage of the data values to the output in a speedier process.

As depicted in FIG. 2B, the scan section 202 receives as inputs the scan enable signal SE, the scan input signal SI, and the clock signal CK. As described above, according to various embodiments, the clock signal CK may be a True-Single-Phase-Clock (TSPC). In an embodiment, the scan section 202 outputs at least one internal signal IS using the received inputs (i.e., the scan enable signal SE, the scan input signal SI, and the clock signal CK) and feedback data, which is previously stored data Db, of the master section 204. The scan section 202 provides the at least one internal signal IS to the master section 204. As compared to a related art scan flip flop, according to various embodiments, the scan section 202 may be separated from the input data D that enables an arrival of the input data D at the slave section 206 faster. In an embodiment, the scan section 202 may be integrated with the clock CK to decrease a setup time of the flip-flop 200, and to use the feedback data of the master section 204 for making the cell including the flip-flop 200 robust.

The master section 204 may be configured to latch the internal signal IS provided by the scan section 202 or to retain previously stored data based on the clock signal CK. The master section 204 may retain the previously stored data through a latch mode enablement, when the clock signal is at a high logic level (i.e., active high). The master section 204 operates in conjunction with the scan section 202 to accept the admission of the data input D or the SI input depending upon the scan enable signal SE, when the clock signal is at a low logic level (active low).

The slave section 206 may be configured to latch an output of the master section 204 based on the clock signal CK to supply the output signal Q. The output of the master section 204 may be a master feedback signal (Mfb). In an example, when CK=0 (active low), the slave section 206 latches the previously stored data and provides the latched previously stored data as the output Q of the slave section 206. When CK=1 (active high), the master section 204 passes the input data D or the SI input to the slave section 206, and the slave section 206 outputs the input data D as the output signal Q of the slave section 206.

Figure 3A:
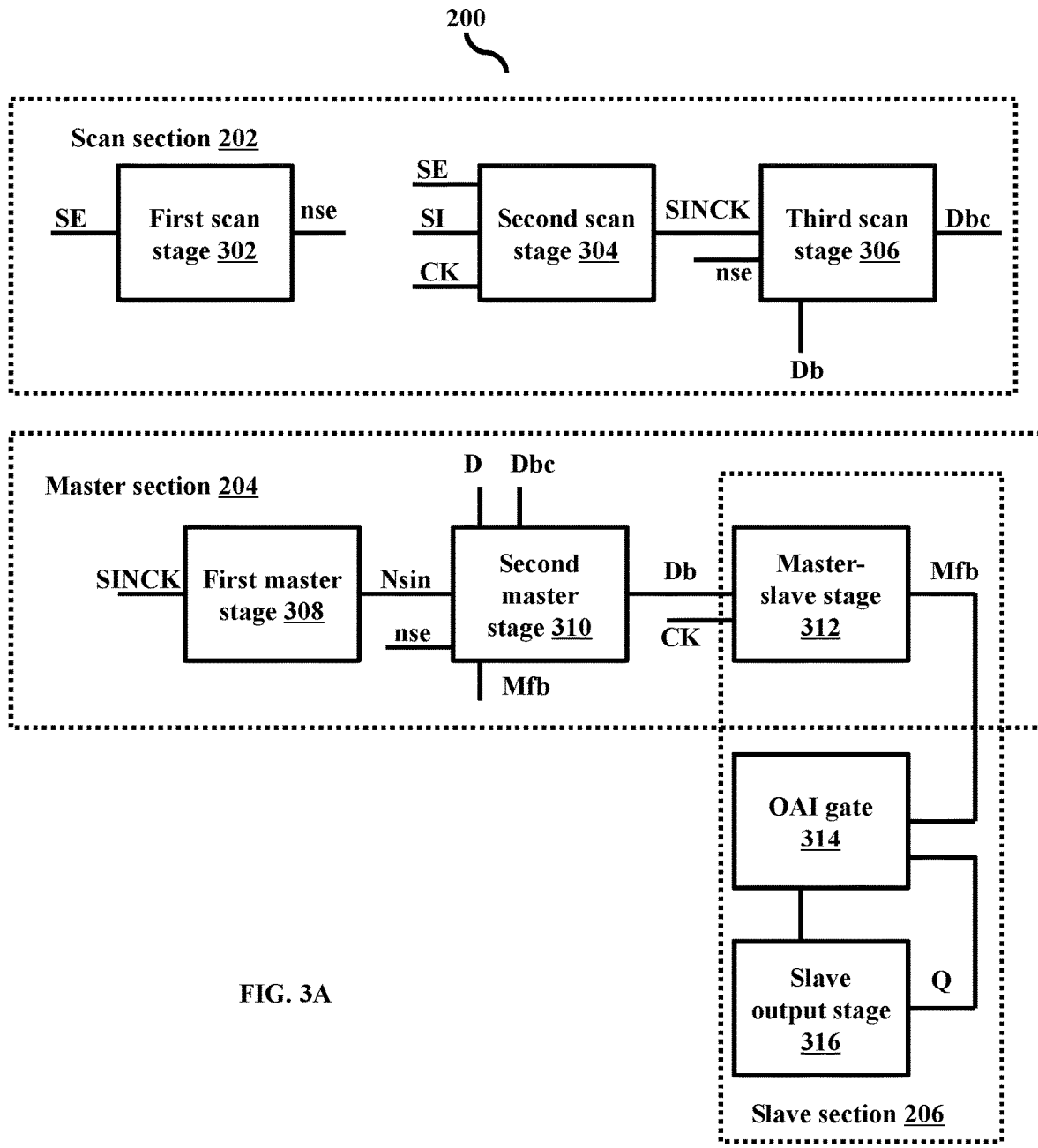
FIG. 3A is a block diagram depicting various components of the TSPC pre-charge based flip-flop, according to various embodiments.

FIG. 3A is a block diagram depicting various components of the TSPC pre-charge based scan flip-flop, according to various embodiments. The scan flip-flop 200 includes the scan section 202, the master section 204, and the slave section 206. In an embodiment, nodes/components of the flip-flop 200 may be pre-charged to the at least one voltage level.

The scan section 202 may be configured to output internal signals (e.g., an inverted scan enable signal nse, an internal signal SINCK, and inverted feedback data Dbc) on receiving the scan enable signal SE, the scan input signal SI, and the clock signal CK, and provide the internal signals (e.g., the inverted scan enable signal nse, the internal signal SINCK, and the inverted feedback data Dbc) to the master section 204. As depicted in FIG. 3A, the scan section 202 may include a plurality of stages: a first scan stage 302, a second scan stage 304, and a third scan stage 306. The scan section 202 is individually depicted in FIG. 3C.

Figure 3B:
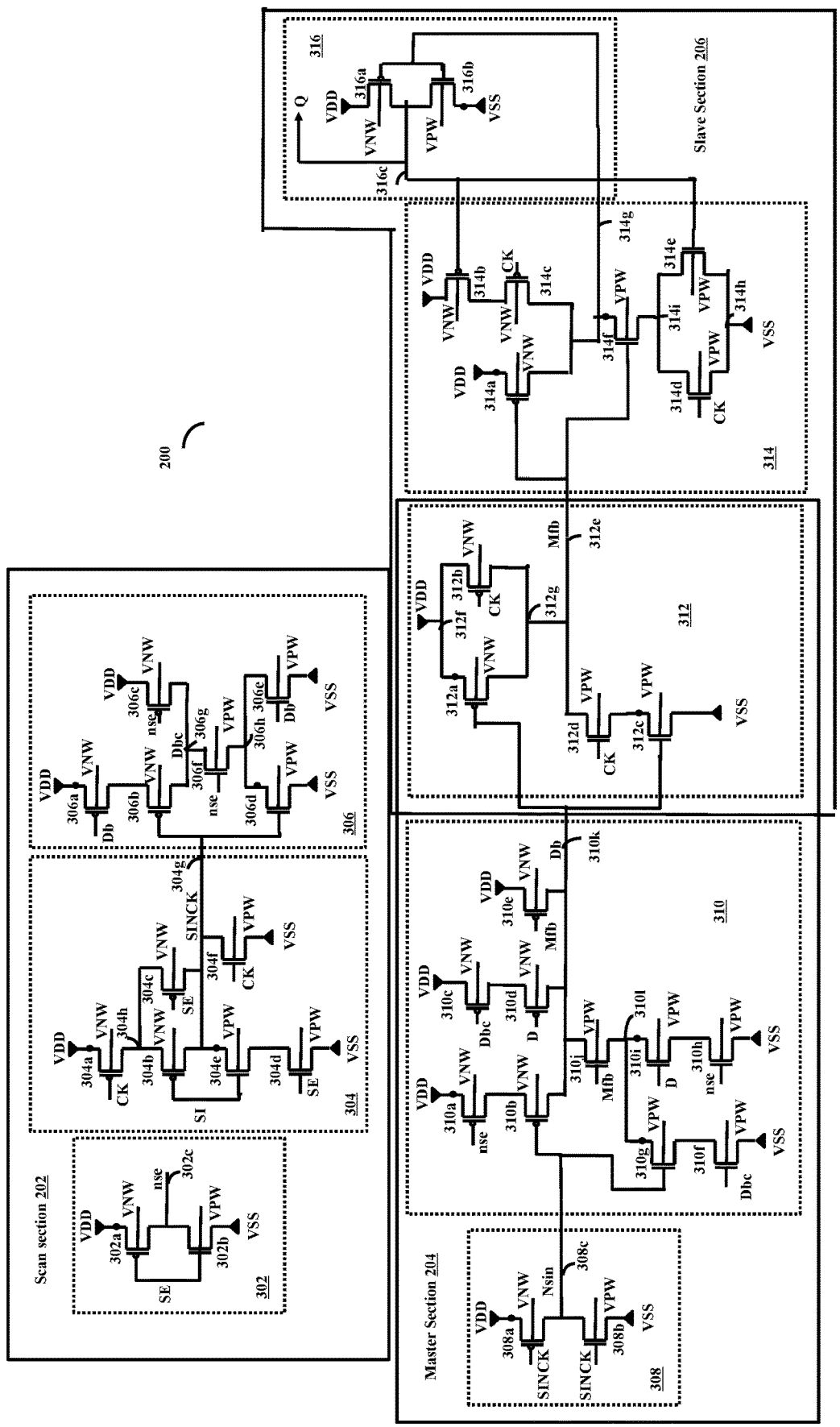
FIG. 3B is a circuit diagram depicting the TSPC pre-charge based scan flip-flop, according to various embodiments.
Figure 3C:
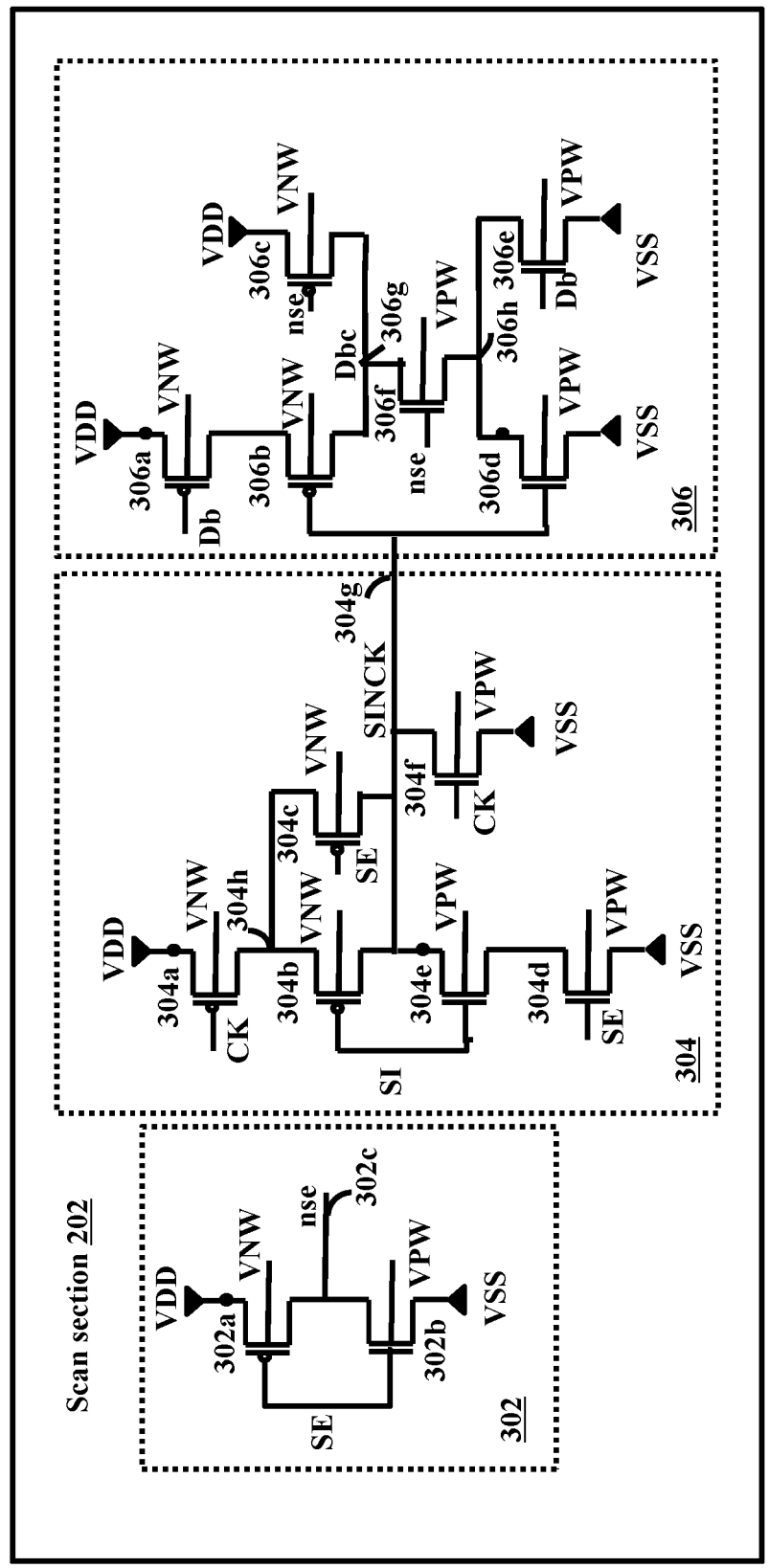
FIG. 3C is a circuit diagram depicting a scan section of the TSPC pre-charge based scan flip-flop, according to various embodiments.

As depicted in FIGS. 3A and 3B, the first scan stage 302 receives the scan enable signal SE, and outputs the inverted scan enable signal nse of the scan enable signal SE on a first scan-stage output node 302c. The first scan stage 302 performs an Invert operation on the scan enable signal SE to output the inverted scan enable signal nse. As depicted in FIGS. 3B and 3C, the first scan stage 302 includes a first P-type metal-oxide-semiconductor (PMOS) transistor 302a, and a first N-type metal-oxide-semiconductor (NMOS) transistor 302b for outputting the inverted scan enable signal nse on the first scan-stage output node 302c. The first PMOS transistor 302a includes a source connected to a power supply (VDD voltage), a drain connected to the first scan-stage output node 302c, and a gate connected to the scan enable signal SE. The first PMOS transistor 302a may maintain a body bias substrate voltage of VNW, which may be a high supply voltage or logic level of '1'. The body bias voltage may be maintained to reduce leakage through parasitics. The first NMOS transistor 302b includes a source connected to a ground (VSS voltage), a drain connected to the first scan-stage output node 302c, and a gate connected to the scan enable signal SE. The first NMOS transistor 302b may maintain the body bias substrate voltage of VPW, which may be a low supply voltage (generally grounded).

The second scan stage 304 receives as input signals the clock signal CK, the scan input signal SI, and the scan enable signal SE, and outputs the internal signal SINCK on a second scan-stage output node 304g. The second scan stage 304 may perform an AND-OR invert (AOI) operation of the clock signal CK, the scan input signal SI, and the scan enable signal SE to output the internal signal SINCK on the second scan-stage output node 304g. In an embodiment, the internal signal SINCK may be represented as SINCK=NOT (SE.SI+CK). When the scan enable signal SE=0, the internal signal SINCK may be generated as the inversion of the clock signal CK. When the scan enable signal SE=1, the internal signal SINCK may be generated as a NOR operation of the SI signal and the clock signal CK. In an example, when the clock signal CK=1, the internal signal SINCK may be SINCK=0 (active low). When the clock signal CK=0, the internal signal SINCK may be the SINCK=inversion of the SI signal.

As depicted in FIGS. 3B and 3C, the second scan stage 304 includes three PMOS transistors (a second PMOS transistor 304a, a third PMOS transistor 304b, a fourth PMOS transistor 304c), and three NMOS transistors (a second NMOS transistor 304d, a third NMOS transistor 304e, a fourth NMOS transistor 304f) for performing the AOI operation to output the internal signal SINCK.

The second PMOS transistor 304a may be connected to the VDD voltage, the clock signal CK and a first conjunction node 304h. The third PMOS transistor 304b may be connected to the first conjunction node 304h, the scan input signal SI, and the second scan-stage output node 304g. The fourth PMOS transistor 304c may be connected to the first conjunction node 304h, the scan enable signal SE, and the second scan-stage output node 304g. The second PMOS transistor 304a includes a source connected to the VDD voltage, a gate connected to the clock signal CK, and a drain connected to the first conjunction node 304h. The third PMOS transistor 304b includes a source connected to the first conjunction node 304h, a gate connected to the scan input signal SI and a drain connected to the second scan-stage output node 304g. The fourth PMOS transistor 304c includes a source connected to the first conjunction node 304h, a gate connected to the scan enable signal SE, and the drain connected to the second scan-stage output node 304g. The second, third, and fourth PMOS transistors (304a-304c) may maintain the body bias substrate voltage of VNW (high supply voltage or active high value of 1) to minimize the parasitic formation.

The second NMOS transistor 304d may be connected to the VSS voltage, the scan enable signal SE, and the third NMOS transistor 304e. The third NMOS transistor 304e may be connected to the scan input signal SI, and the second scan-stage output node 304g. The fourth NMOS transistor 304f may be connected to the second scan-stage output node 304g, the clock signal CK, and the VSS voltage. The second NMOS transistor 304d includes a source connected to the VSS voltage, a gate connected to the scan enable signal SE, and a drain connected to a source of the third NMOS transistor 304e. The third NMOS transistor 304e includes a gate connected to the scan input signal SI and a drain connected to the second scan-stage output node 304g. The fourth NMOS transistor 304f includes a source connected to the VSS voltage, a gate connected to the clock signal CK, and a drain connected to the second scan-stage output node 304g. The second, third, and fourth NMOS transistors (304d-304f) may maintain the body bias substrate voltage of VPW (low supply voltage or low value of 0) to minimize the parasitic formation.

The third scan stage 306 receives the internal signal SINCK, the inverted scan enable signal nse (from the first scan stage 302), and the feedback data Db from the master section 204, and outputs inverted feedback data Dbc that is an inversion of the feedback data Db from the master section 204 on a third scan-stage output node 306g. The third scan stage 306 performs an OR and Invert (OAI) operation of the SINCK, the feedback data Db, and the inverted scan enable signal nse to output the inverted feedback data Dbc on the third scan-stage output node 306g. The third scan stage 306 provides Dbc outputted on the third scan-stage output node 306g to the master section 204 as an input. As depicted in FIGS. 3B and 3C, the third scan stage 306 includes three PMOS transistors (a fifth PMOS transistor 306a, a sixth PMOS transistor 306b, and a seventh PMOS transistor 306c), and three NMOS transistors (a fifth NMOS transistor 306d, a sixth NMOS transistor 306e, and a seventh NMOS transistor 306f) for outputting the inverted feedback data Dbc on the third scan-stage output node 306g.

The fifth PMOS transistor 306a may be connected to the VDD voltage, the feedback data Db of the master section 204, and the sixth PMOS transistor 306b. The sixth PMOS transistor 306b may be connected to the internal signal SINCK on the second scan-stage output node 304g, and the third scan-stage output node 306g. The seventh PMOS transistor 306c may be connected to the VDD voltage, the inverted scan enable signal nse outputted on the first scan-stage output node 302c, and the third scan-stage output node 306g. The fifth PMOS transistor 306a includes a source connected to the VDD voltage, a gate connected to the feedback data Db of the master section 204, and a drain connected to a source of the sixth PMOS transistor 306b. The sixth PMOS transistor 306b includes a gate connected to the internal signal SINCK, and a drain connected to the third scan-stage output node 306g. The seventh PMOS transistor 306c includes a source connected to the VDD voltage, a gate connected to the inverted scan enable signal nse, and a drain connected to the third scan-stage output node 306g. The three PMOS transistors may maintain the body bias substrate voltage of VNW (the high supply voltage or the active high value of 1) to minimize the parasitic formation.

The fifth NMOS transistor 306d may be connected to the VSS voltage, the internal signal SINCK outputted on the second scan-stage output node 304g, and a second conjunction node 306h. The sixth NMOS transistor 306e may be connected to the VSS voltage, the feedback data Db of the master section 204, and the second conjunction node 306h. The seventh NMOS transistor 306f may be connected to the second conjunction node 306h, the inverted scan enable signal nse outputted on the first scan-stage output node 302c, and the third scan-stage output node 306g. The fifth NMOS transistor 306d includes a source connected to the VSS voltage, a gate connected to the internal signal SINCK, and a drain connected to the second conjunction node 306h. The sixth NMOS transistor 306e includes a source connected to the VSS voltage, a gate connected to the feedback data Db, and a drain connected to the second conjunction node 306h. The seventh NMOS transistor 306f includes a source connected to the second conjunction node 306h, a gate connected to the inverted scan inverted scan enable signal nse, and a drain connected to the third scan-stage output node 306h. The three NMOS transistors may maintain the body bias substrate voltage of VPW (the low supply voltage or the active low value of 0) to minimize the parasitic formation.

Consider an example scenario, wherein the scan section 202 receives the clock signal CK=0, the scan enable signal SE=0, and the scan input signal SI (for example the SI=0). In such a scenario, the first scan stage 302 of the scan section 202 may output the inverted scan enable signal nse as nse=1 on the first scan-stage output node 302c, since the scan enable signal SE=0. The second scan stage 304 of the scan section 202 may output the internal signal SINCK as SINCK=1 on the second scan-stage output node 304g, since the scan enable signal SE=0, the scan input signal SI=0, and the clock signal CK=0. The third scan stage 306 of the scan section 202 may output the internal signal: the inverted feedback data Dbc as Dbc=0 on the third scan-stage output node 306g, since the SINCK=1, the inverted scan enable signal nse=1, and the feedback data received from the master section Db=1. Thus, the scan section 202 outputs the inverted feedback data Dbc=0, when the clock signal CK=0, the scan enable signal SE=0, the inverted scan enable signal nse=1, and the internal signal SINCK=1. The scan section 202 provides the inverted feedback data Dbc (i.e., Dbc=0) to the master section 204 as the input to the master section 204.

Consider an example scenario, wherein the scan section 202 receives the clock signal CK=1, the scan enable signal SE=0, and the scan input signal SI (for example: the SI=0). In such a scenario, the first scan stage 302 of the scan section 202 may output the inverted scan enable signal nse as nse=1 on the first scan-stage output node 302c, since the scan enable signal SE=0. The second scan stage 304 of the scan section 202 may output the internal signal SINCK as SINCK=0 on the second scan-stage output node 304g, since the scan enable signal SE=0, the scan input signal SI=0, and the clock signal CK=1. The third scan stage 306 of the scan section 202 may output the inverted feedback data Dbc as Dbc=the data input D on the third scan-stage output node 306g, since the SINCK=0, the inverted scan enable signal nse=1, and the feedback data Db. The inverted feedback data Dbc may be the inversion of the feedback data Db, which is the output of the master section 204, wherein the feedback data Db is the inversion of the latched D input. Thus, the inverted feedback data Dbc may be the data input D when the clock signal CK=1, the scan enable signal SE=0, the inverted scan enable signal nse=1, and the internal signal SINCK=0. The scan section 202 provides the inverted feedback data Dbc to the master section 204 as the input to the master section 204.

Consider an example scenario, wherein the scan section 202 receives the clock signal CK=0, the scan enable signal SE=1, and the scan input signal SI. In such a scenario, the first scan stage 302 of the scan section 202 may output the inverted enable signal nse as nse=0 on the first scan-stage output node 302c, since the scan enable signal SE=1. The second stage 304 of the scan section 202 may output the internal signal SINCK as the SINCK=SI bar (an inversion of the scan input signal SI (NOT(SI))) on the second scan-stage output node 304g, since the scan enable signal SE=1 and the clock signal CK=0. The third scan stage 306 of the scan section 202 may output the inverted feedback data Dbc as Dbc=1 on the third scan-stage output node 306g, since the SINCK=SI bar, the inverted scan enable signal nse=0, and the feedback data Db=0. Thus, the scan section 202 outputs the inverted feedback data Dbc=1, when the clock signal CK=0, the scan enable signal SE=1, the inverted scan enable signal nse=0, and the internal signal SINCK=SI bar. The scan section 202 provides the inverted feedback data Dbc (i.e., Dbc=1) to the master section 204 as the input to the master section 204.

Consider an example scenario, wherein the scan section 202 receives the clock signal CK=1, the scan enable signal SE=1, and the scan input signal SI (for example: the SI=0 or 1). In such a scenario, the first stage 302 of the scan section 202 may output the inverted scan enable signal nse as nse=0 on the first scan-stage output node 302c, since the scan enable signal SE=1. The second scan stage 304 of the scan section 202 may output the internal signal SINCK as the SINCK=0 on the second scan-stage output node 304g, since the scan enable signal SE=1 and the clock signal CK=1. The third scan stage 306 of the scan section 202 may output the inverted feedback data Dbc as Dbc=1 on the third scan-stage output node 306g, since the SINCK=0, the inverted scan enable signal nse=0, and the feedback data Db=0. Thus, the scan section 202 outputs the inverted feedback data Dbc=1, when the clock signal CK=1, the scan enable signal SE=1, the inverted scan enable signal nse=0, and the internal signal SINCK=0.

As depicted in FIG. 3A, the master section 204 may be configured to receive the inverted feedback data Dbc as the internal signal from the scan section 202 and determine whether to latch the internal signal provided by the scan section 202 (i.e., the inverted feedback data Dbc) or to retain the previously stored data/feedback data Db based on the clock signal CK. The master section 204 further provides a Master feedback signal Mfb to the slave section 206 depending on whether the master section 204 latches the internal signal provided by the scan section 202 (i.e., the inverted feedback data Dbc) or retains the previously stored data/feedback data Db based on the clock signal CK.

As depicted in FIG. 3A, the master section 204 includes a first master stage 308, a second master stage 310, and a master-slave stage 312. In some embodiments, the master-slave stage 312 may be a same/common element included as part of both the master section 204, and the slave section 206. The master section 204 is individually depicted in FIG. 3D.

The first master stage 308 receives the internal signal SINCK from the second scan-stage output node 304g of the scan section 202 and outputs an inverted signal Nsin which is an inversion of the internal signal SINCK, on a first master-stage output node 308c. The first master stage 308 performs the invert operation on the internal SINCK to output the inverted signal Nsin on the first master-stage output node 308c. In an example, when the clock signal CK=1, and the internal signal SINCK=0, the inverted signal Nsin may be Nsin=1. When the clock signal CK=0, the scan enable signal SE=0, and the internal signal SINCK=1, the inverted signal Nsin may be Nsin=0. When the clock signal CK=0, the scan enable signal SE=1, and the internal signal SINCK=NOT(SI), the inverted signal Nsin may be Nsin=NOT(SINCK)=propagated SI signal.

Figure 3D:
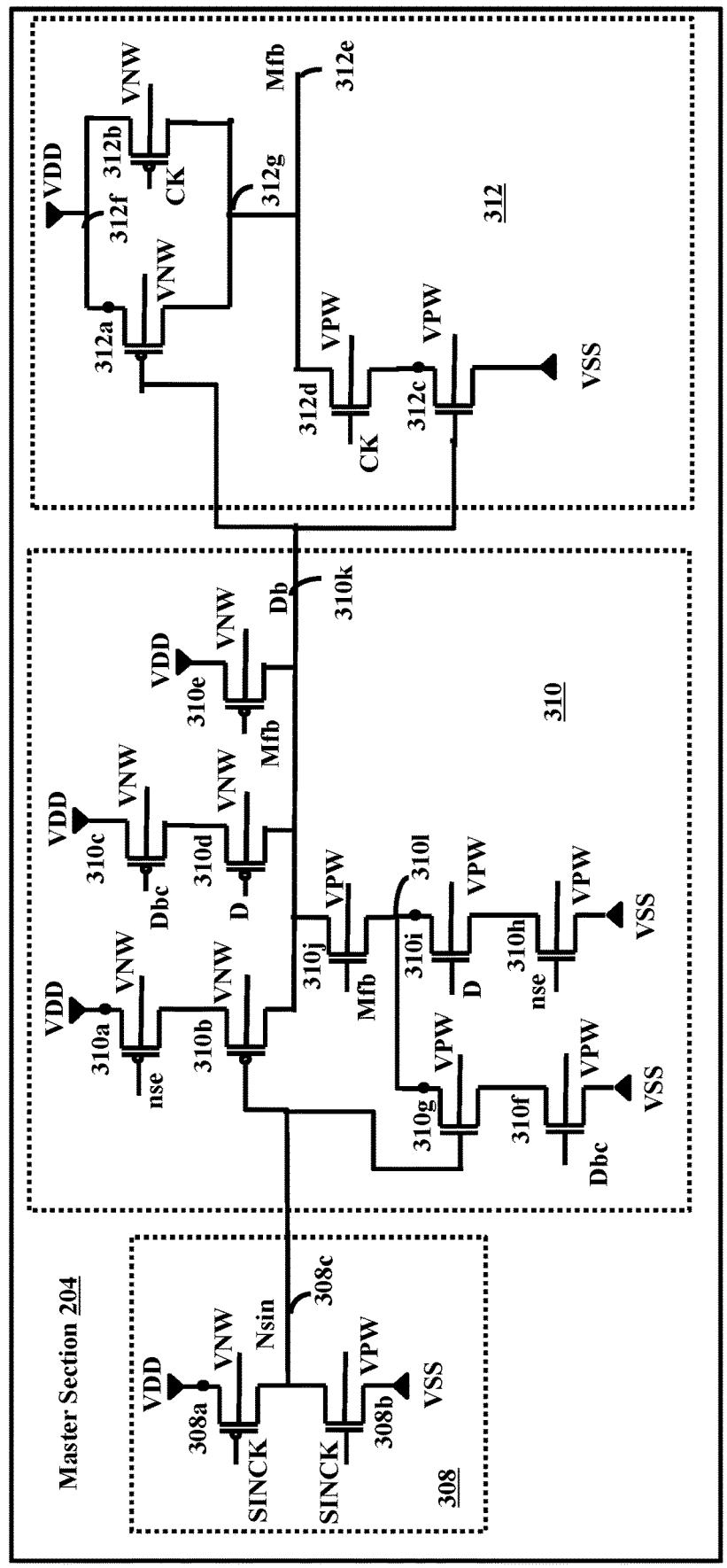
FIG. 3D is a circuit diagram depicting a master section of the TSPC pre-charge based scan flip-flop, according to various embodiments.

As depicted in FIGS. 3B and 3D, the first master stage 308 includes an eighth PMOS transistor 308a, and an eighth NMOS transistor 308b for outputting the inverted signal Nsin on the first master-stage output node 308c. The eighth PMOS transistor 308a includes a source connected to the VDD voltage, a gate connected to the internal signal SINCK, and a drain connected to the first master-stage output node 308c. The eighth PMOS transistor 302b may maintain the body bias substrate voltage of VNW (the high supply voltage or the active high value of 1) to minimize the parasitic formation. The eighth NMOS transistor 308b includes a source connected to the VSS voltage, a gate connected to the internal signal SINCK, and a drain connected to the first master-stage output node 308c. The eighth NMOS transistor 308b may maintain the body bias substrate voltage of VPW voltage (the low supply voltage of the active low value of 0) to minimize the parasitic formation.

The second master stage 310 receives the inverted signal Nsin (from the first master stage 308), the inverted scan enable signal nse (from the first scan stage 302 of the scan section 202), the data input D, the inverted feedback data Dbc (i.e. the inversion of the previously stored data/feedback data Db) from the third scan stage 306 of the scan section 202, the master feedback signal Mfb, and outputs the previously stored data/feedback data Db on a second master-stage output node 310k.

As depicted in FIG. 3B, the second master stage 310 includes five PMOS transistors (a ninth PMOS transistor 310a, a tenth PMOS transistor 310b, an eleventh PMOS transistor 310c, a twelfth PMOS transistor 310d, and a thirteenth PMOS transistor 310e), and five NMOS transistors (a ninth NMOS transistor 310f, a tenth NMOS transistor 310g, an eleventh NMOS transistor 310h, a twelfth NMOS transistor 310i, and a thirteenth NMOS transistor 310j) for outputting Db on the second master-stage output node 310k.

The ninth PMOS transistor 310a may be connected to the VDD voltage, the inverted scan enable signal nse outputted on the first scan-stage output node 302c, and the tenth PMOS transistor 310b. The tenth PMOS transistor 310b may be connected to the inverted signal Nsin outputted on the first master-stage output node 308c, and the second master-stage output node 310k. The eleventh PMOS transistor 310c may be connected to the VDD voltage, the inverted feedback data Dbc outputted on the third scan-stage output node 306g, and the twelfth PMOS transistor 310d. The twelfth PMOS transistor 310d may be connected to the data input D, and the second master-stage output node 310k. The thirteenth PMOS transistor 310e may be connected to the VDD voltage, the master feedback signal Mfb outputted on a common master-slave stage output node 312e of the master-slave stage 312, and the second master-stage output node 310k. The five PMOS transistors 310a-310d may maintain the body bias substrate voltage of VNW (the high supply voltage) to minimize the parasitic formation. The ninth PMOS transistor 310a includes a source connected to the VDD voltage, a gate connected to the inverted scan enable signal nse, and a drain connected to a source of the tenth PMOS transistor 310b. The tenth PMOS transistor 310b includes a gate connected to the inverted signal Nsin, and a drain connected to the second master stage output node 310k. The eleventh PMOS transistor 310c includes a source connected to the VDD voltage, a gate connected to the inverted feedback data Dbc, and a drain connected to a source of the twelfth transistor 310d. The twelfth PMOS transistor 310d includes a gate connected to the data input D, and a drain connected to the second master-stage output node 310k. The thirteenth PMOS transistor 310i includes a source connected to the VDD voltage, a gate connected to the master feedback signal Mfb, and a drain connected to the second master-stage output node 310k.

The ninth NMOS transistor 310f may be connected to the VSS voltage, the inverted feedback data Dbc outputted on the third scan-stage output node 306g, and the tenth NMOS transistor 310g. The tenth NMOS transistor 310g may be connected to the Nsin, and a third conjunction node 310l. The eleventh NMOS transistor 310h may be connected to the VSS voltage, the inverted scan enable signal nse outputted on the first scan-stage output node 302c, and the twelfth NMOS transistor 310i. The twelfth NMOS transistor 310i may be connected to the data input D, and the third conjunction node 310l. The thirteenth NMOS transistor 310j may be connected to the third conjunction node 310l, the master feedback signal Mfb outputted on the common master-slave stage output node 312e, and the second master-stage output node 310k. The five NMOS transistors 310f-310j may maintain the body bias substrate voltage of VPW (the low supply voltage) to minimize the parasitic formation. The ninth NMOS transistor 310f includes a source connected to the VSS voltage, a gate connected to the inverted feedback data Dbc, and a drain connected to a source of the tenth NMOS transistor 310g. The tenth NMOS transistor 310g includes a gate connected to the inverted signal Nsin, and a drain connected to the third conjunction node 310l. The eleventh NMOS transistor 310h includes a source connected to the VSS voltage, a gate connected to the inverted scan enable signal nse, and a drain connected to a source of the twelfth NMOS transistor 310i. The twelfth NMOS transistor 310i includes a gate connected to the data input D, and a drain connected to the third conjunction node 310l. The thirteenth NMOS transistor 310j includes a source connected to the third conjunction node 310l, a gate connected to the master feedback signal Mfb, and a drain connected to the second master-stage output node 310k.

Consider an example scenario, wherein the second master stage receives the clock signal CK=0, the scan enable signal SE=0, the Nsin=1, the nse=1, Dbc=0 from the scan section 202 and receives the Mfb=1 from the master slave stage 312. In such a case, the second master stage 310 outputs Db as Db=1, if the D=0 or outputs Db as Db=0, if the D=1.

Consider another example scenario, wherein the second master stage 310 receives Dbc=NOT(Db), (i.e., the inversion of the feedback signal Db from the master section 204) from the scan section 202. In such a case, Dbc is equivalent to the previous D signal arriving as an input to the second master stage 310. Further, Db signal may be passed to the master feedback signal Mfb, since CK=1. The master feedback signal Mfb is fed as feedback to second master stage 310 and Dbc is fed as feedback to second master stage 310.

Hence, the previously stored feedback data Db is outputted on the node on the second master-stage output node 310k.

The master-slave stage 312 receives the previously stored data/feedback data Db from the second master stage 310, and the clock signal CK, and outputs the master feedback signal Mfb on the common master-slave stage output node 312e. In an embodiment, the master-slave stage 312 outputs the master feedback signal Mfb as the inversion of the feedback data Db, when CK=1. In an embodiment, the master feedback signal Mfb may be pre-charged to the active high, when the clock signal CK=0. Thereby, when the positive edge of the clock signal CK arrives (i.e., when CK=1), the output of the previous stage (i.e., the second master stage 310) may be passed to the slave stages in a speedier process.

As depicted in FIGS. 3B and 3D, the master-slave stage 312 includes two PMOS transistors (a fourteenth PMOS transistor 312a, and a fifteenth PMOS transistor 312b), and two NMOS transistors (a fourteenth NMOS transistors 312c, and a fifteenth NMOS transistor 312d) for outputting the master feedback signal Mfb on the common mater-slave stage output node 312e. The fourteenth PMOS transistor 312a, may be connected to a fourth conjunction node 312f, the feedback data Db outputted on the second master-stage output node 310k, and a fifth conjunction node 312g. The fifteenth PMOS transistor 312b may be connected to the fourth conjunction node 312f, the clock signal, and the fifth conjunction node 312g. The fourth conjunction node 312f may be connected to the VDD voltage. The fifth conjunction node 312g may be connected to the common master-slave stage output node 312e. The fourteenth PMOS transistor 312a includes a source connected to the fourth conjunction node 312f, a gate connected to the previous stored data/feedback data Db, and a drain connected to the fifth conjunction node 312g. The fifteenth PMOS transistor 312b includes a source connected to the fourth conjunction node 312f, a gate connected to the clock signal CK, and a drain connected to the fifth conjunction node 312g. The fourteenth and fifteenth PMOS transistors may maintain the body bias substrate voltage of VNW (the high supply voltage) to minimize the parasitic formation.

The fourteenth NMOS transistor 312c may be connected to the VSS voltage, the feedback data Db outputted on the second master-stage output node 310k, and the fifteenth NMOS transistor 312d. The fifteenth NMOS transistor 312d may be connected to the clock signal CK, and the common master-slave stage output node 312e. The fourteenth NMOS transistor 312c includes a source connected to the VSS voltage, a gate connected to the previously stored data/feedback data Db, and a drain connected to a source of the fifteenth NMOS transistor 312d. The fifteenth NMOS transistor 312d includes a gate connected to the clock signal CK, and a drain connected to the common master-slave stage output node 312e. The fourteenth and fifteenth NMOS transistors may maintain the body bias substrate voltage of VPW (the low supply voltage) to minimize the parasitic formation.

Consider an example scenario, wherein the master section 204 receives the inputs clock signal CK=0, the scan enable signal SE=0, the internal signal SINCK=1 (from the second scan stage 304), and the inverted feedback data Dbc=0 (i.e. from the third scan stage of the scan section 202). In such a scenario, the first master stage 308 of the master section 204 may output the inverted signal Nsin as Nsin=0 on the first master-stage output node 308c, since the internal signal SINCK=1. The second master stage 310 of the master section 204 may output the previously stored data/feedback data Db as Db=D bar (inversion of the data input D) on the second master-stage output node 310k, since the inverted feedback data Dbc=0, and the inverted signal Nsin=0. The master-slave stage 312 of the master section 204 may output the master feedback signal Mfb as Mfb=1 on the common master-slave stage output node 312e, since Db=D bar and the clock signal CK=0. Thus, the master section 204 outputs the master feedback signal Mfb=1, when the clock signal CK=0, the scan enable signal SE=0, the internal signal SINCK=1, the inverted feedback data Dbc=0, and the feedback data Db=D bar.

Consider an example scenario, wherein the master section 204 receives the clock signal CK=1, the scan enable signal SE=0, the internal signal SINCK=0, and the inverted feedback data Dbc=0 (i.e. from the slave section). In such a scenario, the first master stage 308 of the master section 204 may output the inverted signal Nsin as Nsin=1 on the first master-stage output node 308c. The second master stage 312 of the master section 204 may output the previous stored data/feedback data Db as Db=1 on the second master-stage output node 310k, if the data input D is 0 at clock signal Ck=0, Dbc=0, and Nsin=1. The master-slave stage 312 of the master section 204 may output the master feedback signal Mfb as Mfb=0 on the common master-slave stage output node 312e, since Db=1, and CK=1. Thus, the master section 204 outputs Mfb=0, when the clock signal CK=1, the scan enable signal SE=0, the internal signal SINCK=1, Nsin=1, D is 0 at CK=0, Dbc=0, and Db=1.

Consider an example scenario, wherein the master section 204 receives the clock signal CK=1, the scan enable signal SE=0, the internal signal SINCK=0, and the inverted feedback data Dbc=1 (i.e. from the scan section 202). In such a scenario, the first master stage 308 of the master section 204 may output the inverted signal Nsin as Nsin=1 on the first master-stage output node 308c. The second master stage 310 of the master section 204 may output the previously stored data/feedback data Db as Db=0 on the second master-stage output node 310k, if the data input D was 1 at clock signal CK=1, Dbc=1, and Nsin=1. The master-slave stage 312 of the master section 204 may output the master feedback signal Mfb as Mfb=1 on the common master-slave stage output node 312e, since Db=0 and the clock signal CK=1. Thus, the master section 204 outputs Mfb=1, when the clock signal CK=1, the scan enable signal SE=0, the internal signal SINCK=1, Nsin=1, D was 1 at CK=0, Dbc=1, and Db=0.

Consider an example scenario, wherein the master section 204 receives the clock signal CK=0, the scan enable signal SE=1, the internal signal SINCK=SI bar and the inverted feedback data Dbc=1 (i.e. from the scan section 202). In such a scenario, the first master stage 308 of the master section 204 may output the inverted signal Nsin as Nsin=SI on the first master-stage output node 308c. The second master stage 310 of the master section 204 may output the previous stored data/feedback data Db as Db=SI bar (inversion of the scan input signal SI) on the second master-stage output node 310k, since Dbc=1, and Nsin=SI bar. The master-slave stage 312 of the master section 204 may output the master feedback signal Mfb as Mfb=1 on the common master-slave stage output node 312e, since Db=SI bar and the clock signal CK=0. Thus, the master section 204 outputs Mfb=1, when the clock signal CK=0, the scan enable signal SE=1, the internal signal SINCK=SI bar, Nsin=1, Dbc=1, and Db=SI bar.

Consider an example scenario, wherein the master section 204 receives the clock signal CK=1, the scan enable signal SE=1, the internal signal SINCK=0, and the inverted feedback data Dbc=1 (i.e. from the scan section 202). In such a scenario, the first master stage 308 of the master section 204 may output the inverted signal Nsin as Nsin=1 on the first master-stage output node 308c, since SINCK=0. The second master stage 310 of the master section 204 may latch the received inverted feedback data Dbc on the second master-stage output node 310k through the master feedback signal Mfb (i.e. Db=latched through the Mfb), since Dbc=1 and Nsin=1. The master-slave stage 312 of the master section 204 may output the master feedback signal Mfb as Mfb=SI on the common master-slave stage output node 312e, since Db=latched through the Mfb, and the clock signal CK=1. Thus, the master section 204 may output the master feedback signal Mfb=SI, if the clock signal CK=0, the scan enable signal SE=1, the internal signal SINCK=0, Nsin=1, Dbc=1, and Db is latched through the Mfb.

The master section 204 may be effectively latched, when the clock signal CK=1, and Dbc=previous data input D. When the clock signal CK=0, SE=0, and Dbc=0, the data input D may be enabled in the second master stage 310. When CK=0, the SE=1, and Dbc=1, the scan section 202 may enable the SI input/data and pass the SI through the SINCK to the first and second master stages of the master section 204.

The slave section 206 may be configured to fetch the master feedback signal Mfb from the master section 204, and to provide the output Q. The slave section 206 provides the output Q depending upon the values received from the master section 204 and the clock signal CK. As depicted in FIG. 3A, the slave section 206 includes the master-slave stage 312, an OR-AND-Invert logic (OAI) gate 314, and a slave output stage 316. The slave section 206 is individually depicted in FIG. 3E.

The OAI gate 314 fetches the master feedback signal Mfb and provides an output (OAI output) on the OAI gate output node 314g based on the clock signal CK and the fetched internal signal Mfb, wherein the output corresponds to 1 or 0. The OAI gate 314 performs the OAI operation on the clock signal CK, the output Q, and the master feedback signal Mfb to generate the output on the OAI gate output node 314g. When CK=0, the slave section 206 may be latched. In such a case, the OAI gate provides the output that corresponds to the inversion of the output Q. When CK=1, the OAI gate 314 generates the output that corresponds to the inversion of the master feedback signal Mfb.

Figure 3E:
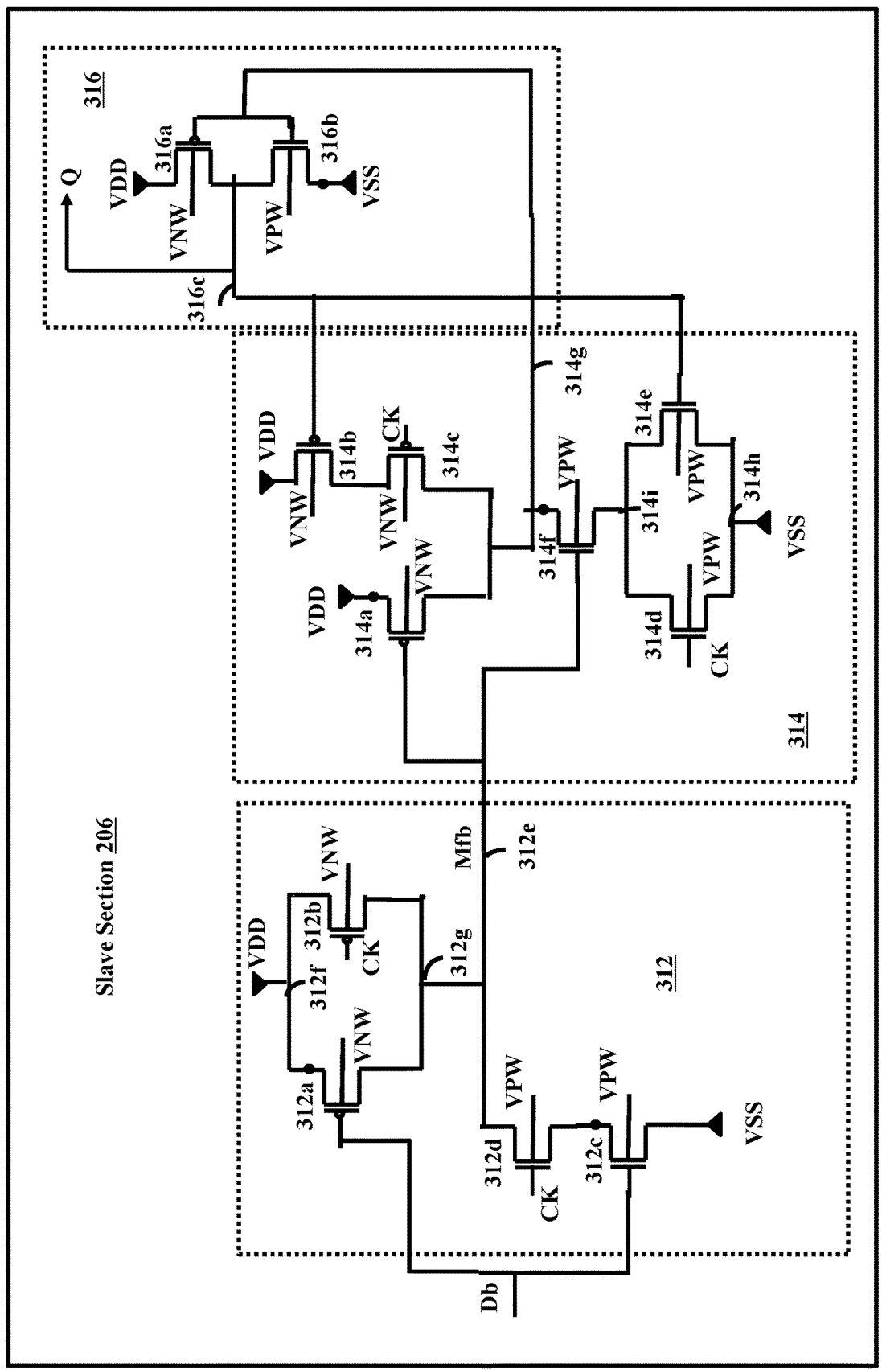
FIG. 3E is a circuit diagram depicting a slave section of the TSPC pre-charge based scan flip-flop, according to various embodiments.

As depicted in FIGS. 3B and 3E, the OAI gate 314 includes three PMOS transistors (a sixteenth PMOS transistor 314a, a seventeenth PMOS transistor 314b, and an eighteenth PMOS transistor 314c), and three NMOS transistors (a sixteenth NMOS transistor 314d, a seventeenth NMOS transistor 314e, and an eighteenth NMOS transistor 314f).

The sixteenth PMOS transistor 314a may be connected to the VDD voltage, the master feedback signal Mfb on the common master-slave output stage node 312e, and the OAI gate output node 314g. The seventeenth PMOS transistor 314b may be connected to the VDD voltage, the output Q on an output node 316c of the slave output stage 316, and the eighteenth PMOS transistor 314c. The eighteenth PMOS transistor 314c may be connected to the clock signal CK, and the OAI gate output node 314g. The three PMOS transistors may maintain the body bias substrate voltage of VNW (the high supply voltage) to minimize the parasitic formation. The sixteenth PMOS transistor 314a includes a source connected to the VDD voltage, a gate connected to the master feedback signal Mfb, and a drain connected to the OAI gate output node 314g. The seventeenth PMOS transistor 314b includes a source connected to the VDD voltage, a gate connected to the output Q present on the output node 316c of the slave output stage 316, and a drain connected to a source of the eighteenth PMOS transistor 314c. The eighteenth PMOS transistor 314c includes a gate connected to the clock signal CK, and a drain connected to the OAI gate output node 314g.

The sixteenth NMOS transistor 314d may be connected to a sixth conjunction node 314h, the clock signal, and a seventh conjunction node 314i. The sixth conjunction node 314h may be connected to the VSS voltage. The seventeenth NMOS transistor 314e may be connected to the sixth conjunction node 314h, the output Q present on the output node 316c of the slave output stage 316, and the seventh conjunction node 314i. The eighteenth NMOS transistor 314f may be connected to the master feedback signal Mfb outputted on the common master-slave output node 312e, the seventh conjunction node 314i, and the OAI gate output node 314g. The three NMOS transistors may maintain the body bias substrate voltage of VPW (the low level voltage) to minimize the parasitic formation). The sixteenth NMOS transistor 314d includes a source connected to the sixth conjunction node 314h, a gate connected to the clock signal CK, and a drain connected to the seventh conjunction node 314i. The seventeenth NMOS transistor 314e includes a source connected to the sixth conjunction node 314h, a gate connected to the output Q present on the output node 316c of the slave output stage 316, and a drain connected to the seventh conjunction node 314i. The eighteenth NMOS transistor 314f includes a source connected to the seventh conjunction node 314i, a gate connected to the master feedback signal Mfb, and a drain connected to the OAI gate output node 314g.

The slave output stage 316 receives the output of the OAI gate 314 from the OAI gate output node 314g, and provides the output Q on the output node 316c. The slave output stage 316 is an inverter, which inverts the received output of the OAI gate and provides the output Q on the output node 316c. Thus, the output Q may be the inversion of the output of the OAI gate 314. As depicted in FIGS. 3B and 3E, the slave output stage 316 includes a PMOS transistor (a nineteenth PMOS transistor 316a), and a NMOS transistor (a nineteenth NMOS transistor 316b). The nineteenth PMOS transistor 316a, and the nineteenth NMOS transistor 316b may be connected to the OAI gate output node 314g, and the output node 316c. The nineteenth PMOS transistor 316a includes a source connected to the VDD voltage, a gate connected to the OAI gate output node 314g, and a drain connected to the output node 316c. The nineteenth PMOS transistor 316b includes a source connected to the VSS voltage, a gate connected to the OAI gate output node 314g, and a drain connected to the output node 316c.

Consider an example scenario, wherein the slave section 206 fetches the master feedback signal Mfb=1 from the master section 204 and receives the clock signal CK=0. In such a case, the OAI gate 314 provides the output Q=Q bar (an inversion of the output Q), since the master feedback signal=1 and the clock signal CK=0. Therefore, the slave section 206 is latched.

Consider an example scenario, wherein the slave section 206 fetches the master feedback signal Mfb=1 from the master section 204 and receives the clock signal CK=1, wherein the master feedback signal Mfb follows the same polarity as the data input D. In such a case, the OAI gate 314 outputs 0, if the previously stored data/feedback data Db=0. The output stage 316 outputs the Q as Q=1 on the output node 316c, since the output of the OAI gate is 0.

Consider an example scenario, wherein the slave section 206 fetches the master feedback signal Mfb=0 from the master section 204 and receives the clock signal CK=1. In such a case, the OAI gate 314 outputs 1, if the previously stored data/feedback data Db=1. The output stage 316 outputs the Q as Q=0, since the output of the OAI gate is 0.

Figure 4A:
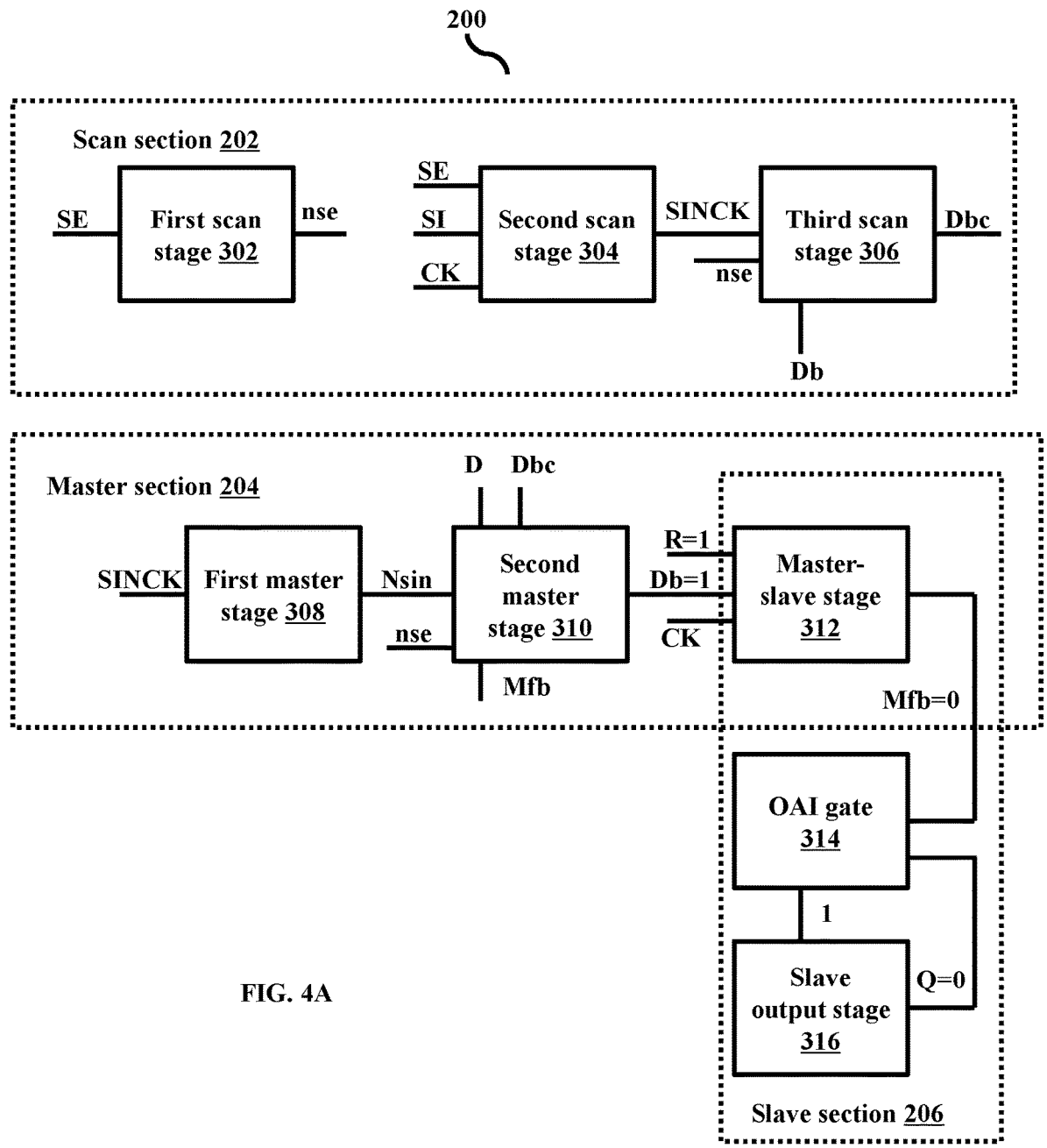
FIGS. 4A and 4B depict a flip-flop including a reset functionality, according to various embodiments.
Figure 4B:
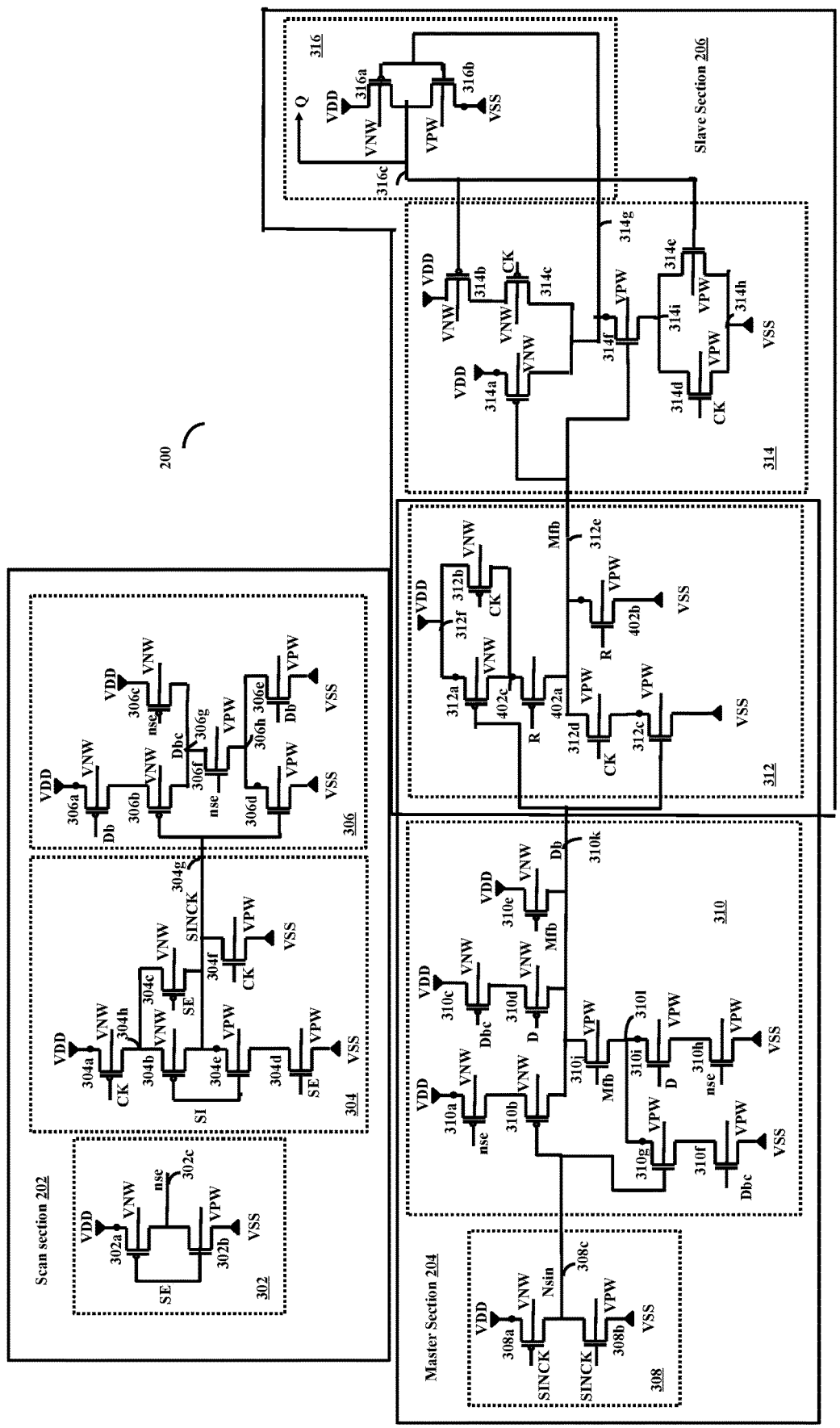

FIGS. 4A and 4B depict the flip-flop 200 including a reset functionality, according to various embodiments. Embodiments enable the flip-flop 200 to perform a reset operation by including the reset functionality. In an embodiment, the reset functionality may be achieved by implementing two transistors (a twentieth PMOS transistor 402a, and a twentieth NMOS transistor 402b) in the master-slave stage 312 of the master section 204, and by applying a reset control signal R to the two transistors 402a, and 402b. For example, the flip-flop 200 may perform the normal operation or the scan test operation if the reset control signal R has a logic low level. The flip-flop 200 may perform the reset operation if the reset control signal R has a logic high level.

The flip-flop 200 enabled with the reset functionality includes the scan section 202, the master section 204, and the slave section 206. The scan section 202 includes the first scan stage 302, the second scan stage 304, and the third scan stage 306. The first scan stage 302 receives the scan enable signal SE, and outputs the inverted scan enable signal nse on the first scan-stage output node 302c. As depicted in FIG. 4B, the first scan stage 302 includes the first PMOS transistor 302a, and the first NMOS transistor 302b for outputting the inverted scan enable signal nse. The configurations of the transistors of the first scan stage 302, and their intended functions are depicted in FIGS. 3B and 3C, and thus a repeated description thereof is omitted for conciseness.

The second scan stage 304 receives the clock signal CK, the scan input signal SI, and the scan enable signal SE, and outputs the internal signal SINCK on the second scan-stage output node 304g. As depicted in FIG. 4B, the second scan stage 304 includes the second PMOS transistor 304a, the third PMOS transistor 304b, the fourth PMOS transistor 304c, the second NMOS transistor 304d, the third NMOS transistor 304e, and the fourth NMOS transistor 304f for outputting the internal signal SINCK on the second scan-stage output node 304g. The configurations of the transistors of the second scan stage 304 are depicted in FIGS. 3B and 3C, and thus a repeated description thereof is omitted for conciseness.

The third scan stage 306 receives the internal signal SINCK, the inverted scan enable signal nse (from the first scan stage 302), and the feedback data Db from the master section 204, and outputs the inverted feedback data Dbc on the third scan-stage output node 306g. As depicted in FIG. 4B, the third scan stage 306 includes the fifth PMOS transistor 306a, the sixth PMOS transistor 306b, the seventh PMOS transistor 306c, the fifth NMOS transistor 306d, the sixth NMOS transistor 306e, and the seventh NMOS transistor 306f for outputting the inverted feedback data Dbc on the third scan-stage output node 306g. The configurations of the transistors of the third scan stage 306, and their intended functions are depicted in FIGS. 3B and 3C, and thus a repeated description thereof is omitted for conciseness.

The master section 204 includes the first master stage 308, the second master stage 310, and the master-slave stage 312. The first master stage 308 receives the internal signal SINCK, and outputs the inverted signal Nsin on the first master-stage output node 308c. As depicted in FIG. 4B, the first master stage 308 includes the eighth PMOS transistor 308a, and the eighth NMOS transistor 308b for outputting the inverted signal Nsin. The configurations of the transistors of the first master stage 308 and their intended functions are depicted in FIGS. 3B and 3D, and thus a repeated description thereof is omitted for conciseness.

The second master stage 310 receives the inverted signal Nsin (from the first master stage 308), the inverted scan enable signal nse (from the first scan stage 302 of the scan section 202), the data input D, the inverted feedback data Dbc (i.e. the inversion of the previously stored data/feedback data Db) from the third scan stage 306 of the scan section 202, the master feedback signal Mfb from the master-slave stage 312, and outputs the previously stored data/feedback data Db on the second master-stage output node 310k. As depicted in FIG. 4B, the second master stage 310 includes the ninth PMOS transistor 310a, the tenth PMOS transistor 310b, the eleventh PMOS transistor 310c, the twelfth PMOS transistor 310d, the thirteenth PMOS transistor 310e, the ninth NMOS transistor 310f, the tenth NMOS transistor 310g, the eleventh NMOS transistor 310h, the twelfth NMOS transistor 310i, and the thirteenth NMOS transistor 310j for outputting Db on the second master-stage output node 310k. The configurations of the transistors of the second master stage 310, and their intended functions are depicted in FIGS. 3B and 3D, and thus a repeated description thereof is omitted for conciseness.

The master-slave stage 312 receives the previously stored data/feedback data Db, the clock signal CK, and the reset control signal R, and outputs the master feedback signal Mfb on the common master-slave stage output node 312e.

Figure 4C:
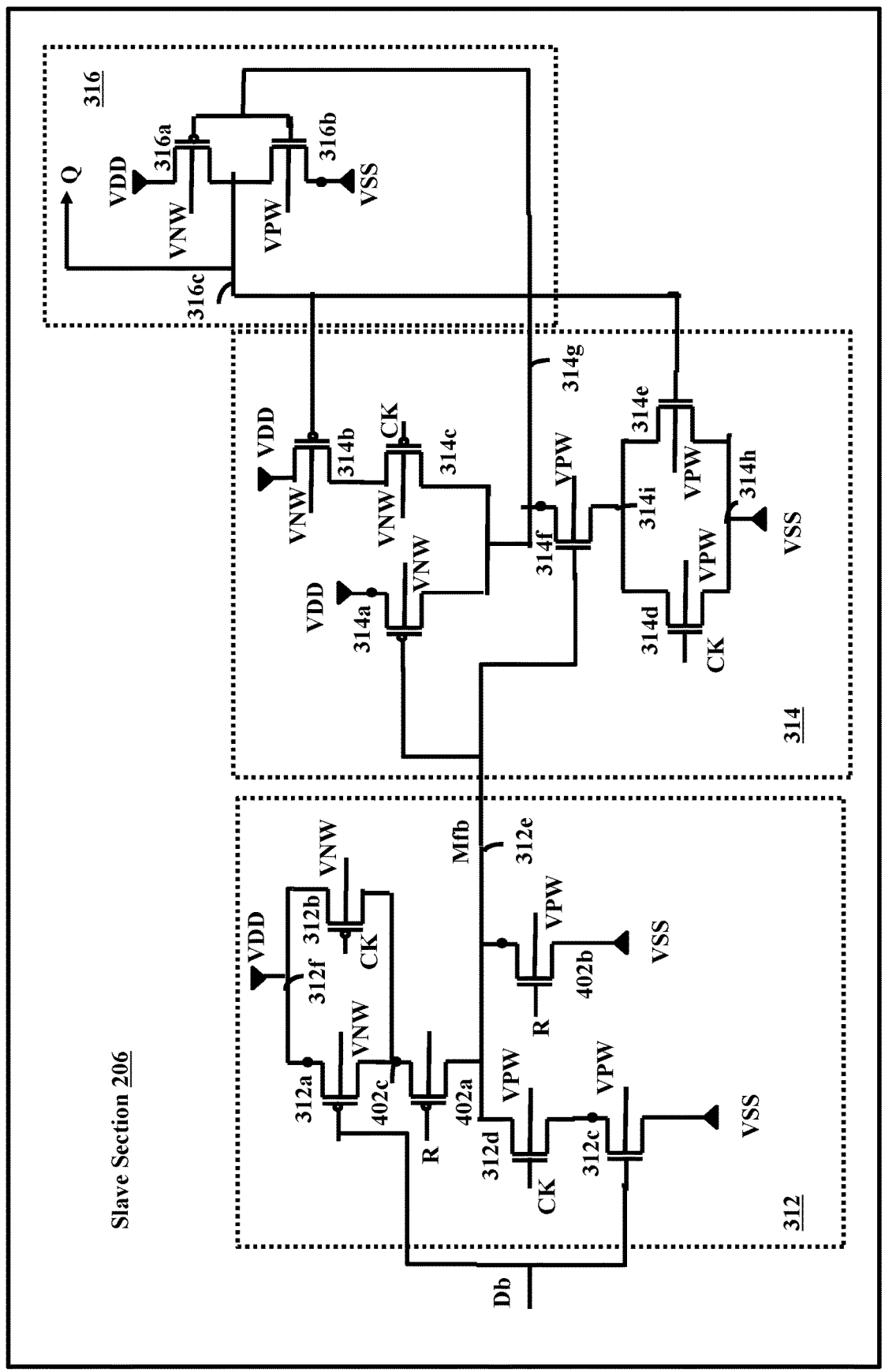
FIG. 4C is a circuit diagram depicting a slave section of the flip-flop including the reset functionality, according to various embodiments.

As depicted in FIGS. 4B and 4C, the master-slave stage 312 includes the fourteenth PMOS transistor 312a, the fifteenth PMOS transistor 312b, the fourteenth NMOS transistors 312c, the fifteenth NMOS transistor 312d, the twentieth PMOS transistor 402a, and the twentieth NMOS transistor 402b. The fourteenth PMOS transistor 312a may be connected to the fourth conjunction node 312f, the feedback data Db outputted on the second master-stage output node 310k, and an eighth conjunction node 402c. The fourth conjunction node 312f may be connected to the VDD voltage. The fifteenth PMOS transistor 312b may be connected to the fourth conjunction node 312f, the clock signal CK, and the eighth conjunction node 402c. The twentieth PMOS transistor 402a may be connected to the eighth conjunction node 402c, the reset control signal R, and the common master-slave stage output node 312e. The fourteenth PMOS transistor 312a includes the source connected to the fourth conjunction node 312f, the gate connected to the previous stored data/feedback data Db, and the drain connected to the eighth conjunction node 402c. The fifteenth PMOS transistor 312b includes the source connected to the fourth conjunction node 312f, the gate connected to the clock signal CK, and the drain connected to the eighth conjunction node 402c. The twentieth PMOS transistor 402a includes a source connected to the eighth conjunction node 402c, a gate connected to the reset control signal R, and a drain connected to the common master-slave stage output node 312e. The fourteenth, fifteenth, and twentieth PMOS transistors may maintain the body bias substrate voltage of VNW (the high supply voltage) to minimize the parasitic formation.

The fourteenth NMOS transistor 312c may be connected to the VSS voltage, the feedback data Db outputted on the second master-stage output node 310k, and the fifteenth NMOS transistor 312d. The fifteenth NMOS transistor 312d may be connected to the clock signal CK, and the common master-slave stage output node 312e. The twentieth NMOS transistor 402b may be connected to the VSS voltage, the reset control signal R, and the common master-slave stage output node 312e. The fourteenth NMOS transistor 312c includes the source connected to the VSS voltage, the gate connected to the previously stored data/feedback data Db, and the drain connected to a source of the fifteenth NMOS transistor 312d. The fifteenth NMOS transistor 312d includes the gate connected to the clock signal CK, and the drain connected to the common master-slave stage output node 312e. The twentieth NMOS transistor 402b includes a source connected to the VSS voltage, a gate connected to the reset control signal R, and a drain connected to the common master-slave stage output node 312e. The fourteenth, fifteenth, and twentieth NMOS transistors may maintain the body bias substrate voltage of VPW (the low supply voltage) to minimize the parasitic formation.

In an embodiment, the twentieth NMOS transistor 402b of the master-slave stage 312 may be turned ON only when the reset control signal R=1 is applied. In such a case the master-slave stage 312 outputs the master feedback signal Mfb as Mfb=0. If the reset control signal R=0, the master-slave stage 312 operates as depicted in the scan D flip-flop (as depicted in FIGS. 3A, 3B and 3D).

The slave section 206 includes the master-slave stage 312, the OAI gate 314, and the slave output stage 316. The OAI gate 314 fetches the master feedback signal Mfb and provides the output on the OAI gate output node 314g based on the clock signal CK, and the fetched master feedback signal Mfb, wherein the output corresponds to 1 or 0. As depicted in FIG. 4B, the OAI gate 314 includes the sixteenth PMOS transistor 314a, the seventeenth PMOS transistor 314b, and the eighteenth PMOS transistor 314c, the sixteenth NMOS transistor 314d, the seventeenth NMOS transistor 314e, and the eighteenth NMOS transistor 314f The sixteenth PMOS transistor 314a may be connected to the VDD voltage and the OAI gate output node 314g. The configurations of the transistors of the OAI gate 314 and their intended functions are depicted in FIGS. 3B and 3E, and thus a repeated description thereof is omitted for conciseness.

The slave output stage 316 receives the output of the OAI gate 314 from the OAI gate output node 314g, and provides the output Q on the output node 316c. As depicted in FIG. 4B, the slave output stage 316 includes the nineteenth PMOS transistor 316a, and the nineteenth NMOS transistor 316b. The configurations of the transistors of the slave output stage 316 are depicted in FIGS. 3B and 3E, and thus a repeated description thereof is omitted for conciseness.

In an embodiment, for enabling the flip-flop 200 to perform the reset operation, the reset control signal R=1 (high logic level) may be applied to the gate of the twentieth PMOS transistor 402a and the gate of the twentieth NMOS transistor 402b of the master-slave stage 312, when the previously stored/feedback data Db=1. The master-slave stage 312 outputs the master feedback signal Mfb as Mfb=0, since the reset control signal R=1. The OAI gate 314 of the slave section 206 fetches the master feedback signal Mfb=0 from the master-slave stage 312, and provides 1 as the output. The slave output stage 316 of the slave section 206 receives the output of the OAI gate (i.e. 1) and provides the output Q as Q=0. Thus, performing the reset operation.

Figure 5A:
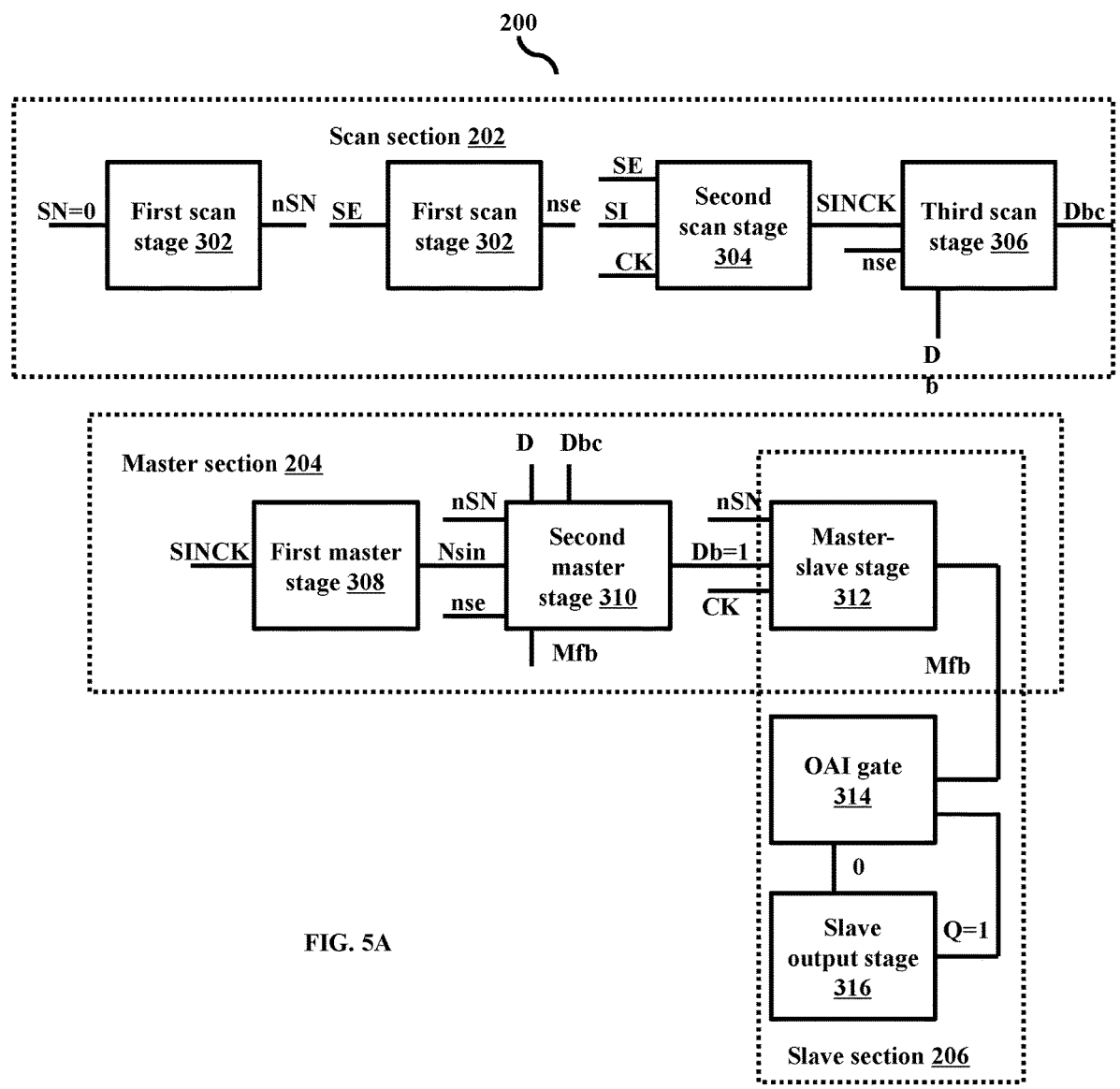
FIGS. 5A and 5B depict a flip-flop including a set functionality, according to various embodiments.
Figure 5B:
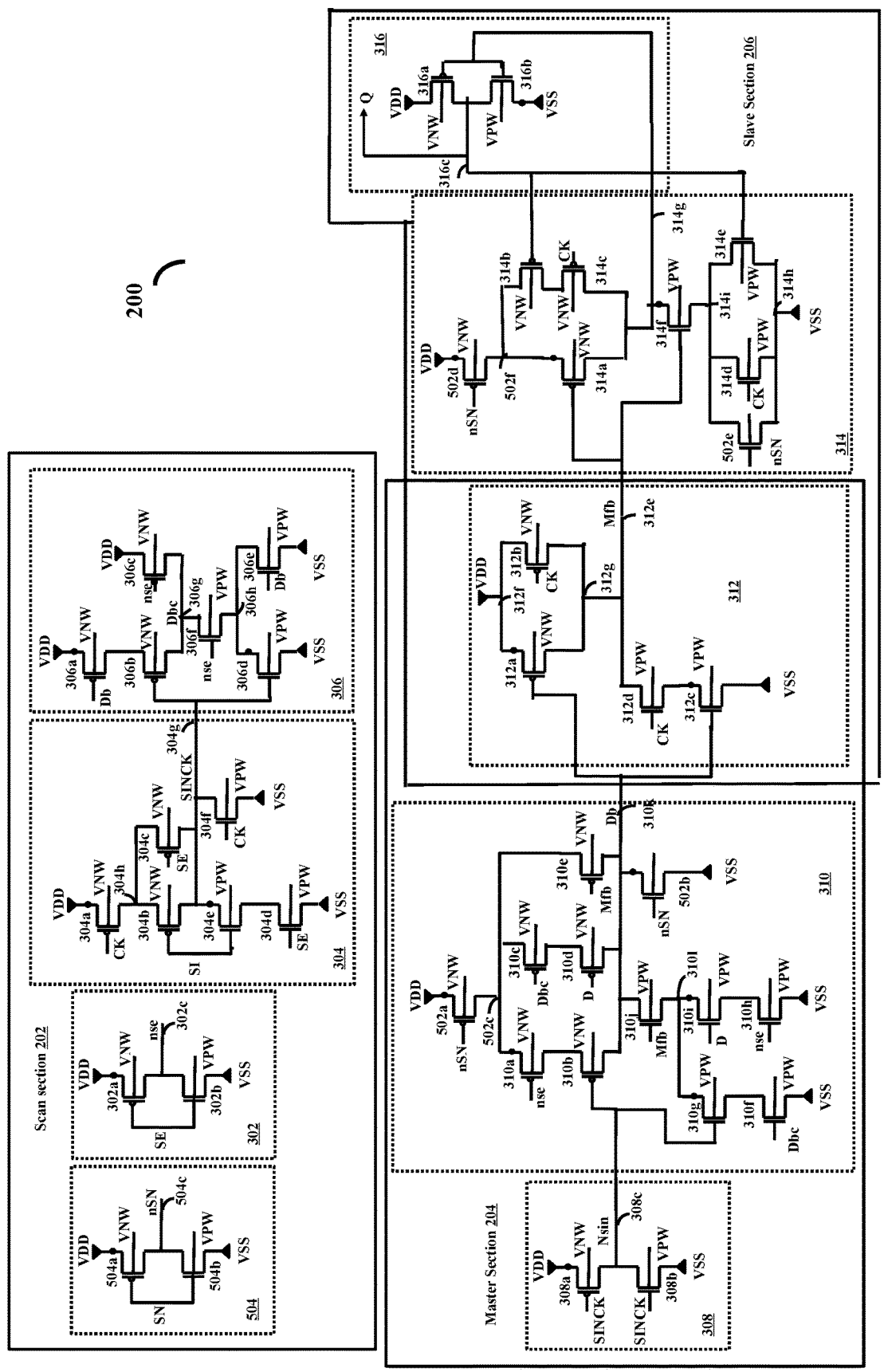
Figure 5C:
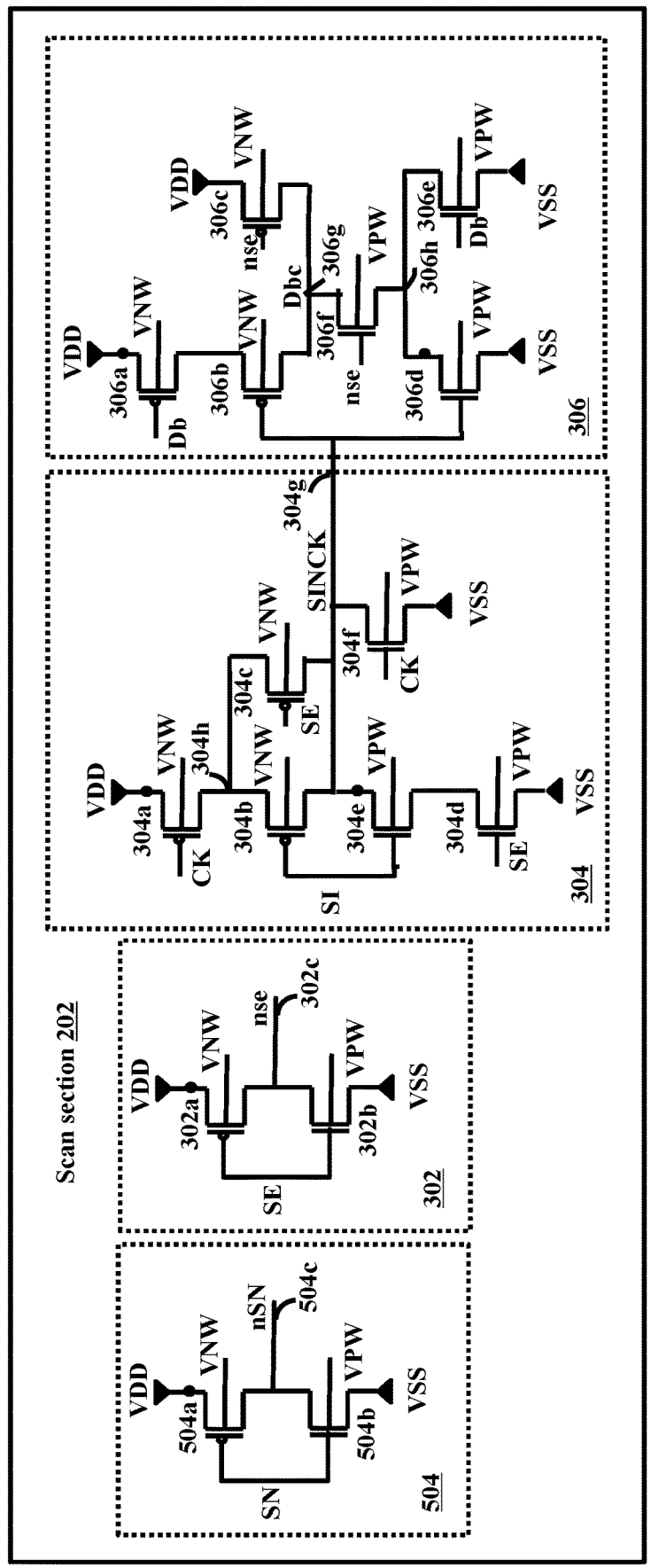
FIG. 5C is a circuit diagram depicting a scan section of the flip-flop including the set functionality, according to various embodiments.

FIGS. 5A and 5B depict the flip-flop 200 including a set functionality, according to various embodiments. Embodiments enable the flip-flop 200 to perform a set operation by including the set functionality. In an embodiment, the set functionality may be achieved by implementing two transistors (a twenty-first PMOS transistor 502a, and a twenty-first NMOS transistor 502b) in the second master stage 310 of the master section 204, two transistors (a twenty-second PMOS transistor 502d, and a twenty-second NMOS transistor 502e) in the OAI gate 314 of the slave section 206, and by applying an inversion of a set control signal to the four transistors 502a, 502b, 502d, and 502e. For example, the flip-flop 200 may perform the normal operation or the scan test operation if a set control signal SN has a logic high level. The flip-flop 200 may perform the set operation if the set control signal SN has a logic low level.

The flip-flop 200 enabled with the set functionality includes the scan section 202, the master section 204, and the slave section 206. The scan section 202 includes a peripheral circuit 504 (see FIGS. 5B and 5C), the first scan stage 302, the second scan stage 304, and the third scan stage 306. The peripheral circuit 504 receives the set control signal SN and outputs an inverted set control signal nSN which is an inversion of a set control signal SN, on a peripheral output node 504c. The peripheral circuit 504 may be an inverter. In an example, when SN=0, the peripheral circuit 504 outputs nSN=1, and vice versa. As depicted in FIG. 5B, the peripheral circuit 504 includes a twenty-third PMOS transistor 504a, and a twenty-third NMOS transistor 504b. The twenty-third PMOS transistor 504a may be connected to the VDD voltage, the set control signal SN, and the peripheral output node 504c. The twenty-third PMOS transistor 504a includes a source connected to the VDD voltage, a gate connected to the set control signal SN, and a drain connected to the peripheral output node 504c. The twenty-third PMOS transistor 504a may maintain a body bias substrate voltage of VNW (the high supply voltage) to minimize the parasitic formation. The twenty-third NMOS transistor 504b may be connected to the VSS voltage, the set control signal SN, and the peripheral output node 504c. The twenty-third NMOS transistor 504b includes a source connected to the VSS voltage, a drain connected to the peripheral output node 504c, and a gate connected to the set control signal SN. The twenty-third NMOS transistor 504b may maintain the body bias substrate voltage of VPW (the low supply voltage) to minimize the parasitic formation.

The first scan stage 302 receives the scan enable signal SE, and outputs the inverted scan enable signal nse on the first scan-stage output node 302c. As depicted in FIG. 5B, the first scan stage 302 includes the first PMOS transistor 302a, and the first NMOS transistor 302b. The configurations of the transistors of the first scan stage 302, and their intended functions are depicted in FIGS. 3B and 3C, and repeated descriptions thereof are omitted for conciseness.

The second scan stage 304 receives the clock signal CK, the scan input signal SI, and the scan enable signal SE, and outputs the internal signal SINCK on the second scan-stage output node 304g. As depicted in FIG. 5B, the second scan stage 304 includes the second PMOS transistor 304a, the third PMOS transistor 304b, the fourth PMOS transistor 304c, the second NMOS transistor 304d, the third NMOS transistor 304e, and the fourth NMOS transistor 304f for outputting the internal signal SINCK. The configurations of the transistors of the second scan stage 304, and their intended functions are depicted in FIGS. 3B and 3C, and repeated descriptions thereof are omitted for conciseness.

The third scan stage 306 receives the internal signal SINCK, the inverted scan enable signal nse (from the first scan stage 302), and the feedback data Db from the master section 204, and outputs the inverted feedback data Dbc on the third scan-stage output node 306g. As depicted in FIG. 5B, the third scan stage 306 includes the fifth PMOS transistor 306a, the sixth PMOS transistor 306b, the seventh PMOS transistor 306c, the fifth NMOS transistor 306d, the sixth NMOS transistor 306e, and the seventh NMOS transistor 306f for outputting the inverted feedback data Dbc on the third scan-stage output node 306g. The configurations of the transistors of the third scan stage 306, and their intended functions are depicted in FIGS. 3B and 3C, and repeated descriptions thereof are omitted for conciseness.

The master section 204 includes the first master stage 308, the second master stage 310, and the master-slave stage 312. The first master stage 308 receives the internal signal SINCK, and outputs the inverted signal Nsin. The configurations of the transistors of the first master stage 308, and their intended functions are depicted in FIGS. 3B and 3D, and repeated descriptions thereof are omitted for conciseness.

Figure 5D:
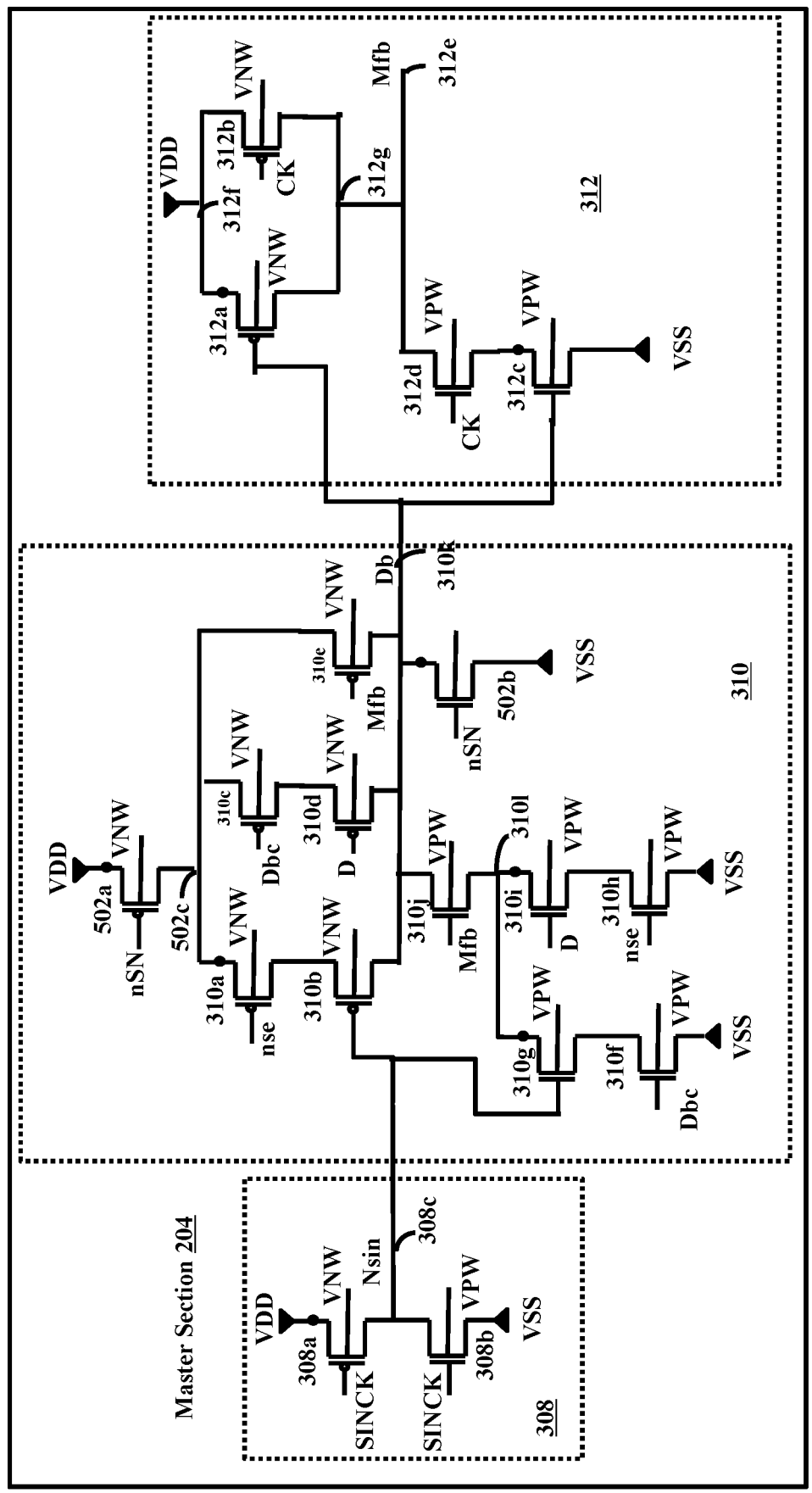
FIG. 5D is a circuit diagram depicting a master section of the flip-flop including the set functionality, according to various embodiments.

As depicted in FIGS. 5B and 5D, the second master stage 310 receives the inverted signal Nsin, the inverted scan enable signal nse, the data input D, the inverted feedback data Dbc, the master feedback signal Mfb, and the inverted set control signal nSN and outputs the previously stored data/feedback data Db.

As depicted in FIGS. 5B and 5D, the second master stage 310 includes the ninth PMOS transistor 310a, the tenth PMOS transistor 310b, the eleventh PMOS transistor 310c, the twelfth PMOS transistor 310d, the thirteenth PMOS transistor 310e, and the twenty-first PMOS transistor 502a. The second master stage 310 also includes the ninth NMOS transistor 310f, the tenth NMOS transistor 310g, the eleventh NMOS transistor 310h, the twelfth NMOS transistor 310i, the thirteenth NMOS transistor 310j, and the twenty-first NMOS transistor 502b.

The ninth PMOS transistor 310a may be connected to a ninth conjunction node 502c, the inverted scan enable signal nse outputted on the first scan-stage output node 302c, and the tenth PMOS transistor 310b. The tenth PMOS transistor 310b may be connected to Nsin outputted on the first master-stage output node 308c, and the second master-stage output node 310k. The eleventh PMOS transistor 310c may be connected to the ninth conjunction node 502c, the inverted feedback data Dbc outputted on the third scan-stage output node 306g, and the twelfth PMOS transistor 310d. The twelfth PMOS transistor 310d may be connected to the data input D, and the second master-stage output node 310k. The thirteenth PMOS transistor 310e may be connected to the ninth conjunction node 502c, the master feedback signal Mfb outputted on the common master-slave output node 312e, and the second master-stage output node 310k. The twenty-first PMOS transistor 502a may be connected to the ninth conjunction node 502c, the inverted set control signal nSN outputted on the peripheral output node 504c, and the VDD voltage. The six PMOS transistors (310a-310e, and 502a) may maintain the body bias substrate voltage of VNW (the high supply voltage) to minimize the parasitic formation. The ninth PMOS transistor 310a includes the source connected to the ninth conjunction node 502c, the gate connected to the inverted scan enable signal nse, and the drain connected to the source of the tenth PMOS transistor 310b. The tenth PMOS transistor 310b includes the gate connected to the inverted signal Nsin, and the drain connected to the second master stage output node 310k. The eleventh PMOS transistor 310c includes the source connected to the ninth conjunction node 502c, the gate connected to the inverted feedback data Dbc, and the drain connected to a source of the twelfth transistor 310d. The twelfth PMOS transistor 310d includes the gate connected to the data input D, and the drain connected to the second master-stage output node 310k. The thirteenth PMOS transistor 310i includes the source connected to the ninth conjunction node 502c, the gate connected to the master feedback signal Mfb, and the drain connected to the second master-stage output node 310k. The twenty-first PMOS transistor 502a includes a source connected to the VDD voltage, a gate connected to the inverted set control signal nSN, and a drain connected to the ninth conjunction node 502c.

The ninth NMOS transistor 310f may be connected to the VSS voltage, the outputted on the third scan-stage output node 306g, and the tenth NMOS transistor 310g. The tenth NMOS transistor 310g may be connected to Nsin outputted on the first master-stage output node 308c, and the third conjunction node 310l. The eleventh NMOS transistor 310h may be connected to the VSS voltage, the inverted scan enable signal nse outputted on the first scan-stage output node 302c, and the twelfth NMOS transistor 310i. The twelfth NMOS transistor 310i may be connected to the data input D, and the third conjunction node 310l. The thirteenth NMOS transistor 310j may be connected to the third conjunction node 310l, the master feedback signal outputted on the common master-slave output node 312e, and the second master-stage output node 310k. The twenty-first NMOS transistor 502b may be connected to the VSS voltage, the inverted set control signal nSN outputted on the peripheral output node 504c, and the second master-stage output node 310k. The six NMOS transistors (310f-310j, and 502b) may maintain the body bias substrate voltage of VPW (the low supply voltage) to minimize the parasitic formation. The ninth NMOS transistor 310f includes the source connected to the VSS voltage, the gate connected to the inverted feedback data Dbc, and the drain connected to the source of the tenth NMOS transistor 310g. The tenth NMOS transistor 310g includes the gate connected to the inverted signal Nsin, and the drain connected to the third conjunction node 310l. The eleventh NMOS transistor 310h includes the source connected to the VSS voltage, the gate connected to the inverted scan enable signal nse, and the drain connected to a source of the twelfth NMOS transistor 310i. The twelfth NMOS transistor 310i includes the gate connected to the data input D, and the drain connected to the third conjunction node 310l. The thirteenth NMOS transistor 310j includes the source connected to the third conjunction node 310l, the gate connected to the master feedback signal Mfb, and the drain connected to the second master-stage output node 310k. The twenty-first NMOS transistor 502b includes a source connected to the VSS voltage, the gate connected to the inverted set control signal nSN, and the drain connected to the second master-stage output node 310k.

In an embodiment, the twenty-first NMOS transistor 502b turns ON only when the inverted set control signal nSN=1. In such a case, the second master stage 310 outputs Db=0. When nSN=0, the second master stage 310 operates similar to the scan flip-flop as depicted in FIGS. 3A, 3B and 3D, and repeated descriptions thereof are omitted for conciseness.

The master-slave stage 312 receives the previously stored data/feedback data Db from the second master stage 310, and the clock signal CK, and outputs the master feedback signal Mfb on the common master-slave stage output node 312e. As depicted in FIG. 5B, the master-slave stage 312 includes the fourteenth PMOS transistor 312a, the fifteenth PMOS transistor 312b, the fourteenth NMOS transistors 312c, and the fifteenth NMOS transistor 312d. The fourteenth PMOS transistor 312a, and the fifteenth PMOS transistor 312b may be connected to the fourth conjunction node 312f, and the fifth conjunction node 312g. The configurations of the transistors of the master-slave stage, and their intended functions are depicted in FIGS. 3B and 3D, and repeated descriptions thereof are omitted for conciseness.

The slave section 206 includes the master-slave stage 312, the OAI gate 314, and the slave output stage 316. The OAI gate 314 receives the master feedback signal Mfb from the master-slave stage 312, the inverted set control signal nSN and provides the output corresponding to 0 or 1. When nSN=1, the output of the OAI gate 314 may be 0. When nSN=0, and CK=0, the OAI gate 314 may provide the output corresponding to the inversion of the output Q. When nSN=0, and CK=1, the OAI gate 314 provides the output corresponding to the inversion of the master feedback signal Mfb.

Figure 5E:
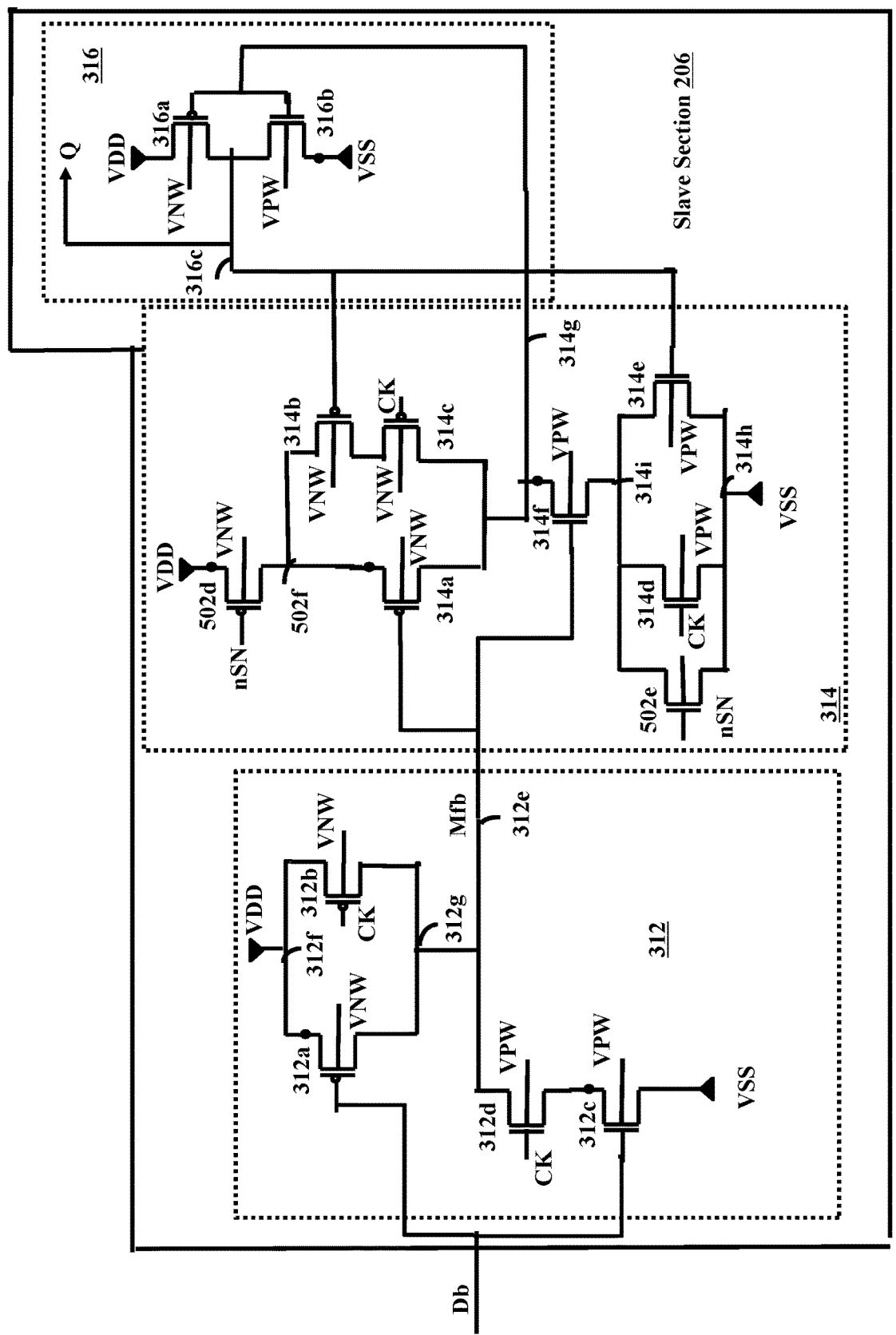
FIG. 5E is a circuit diagram depicting a slave section of the flip-flop including the set functionality, according to various embodiments.

As depicted in FIGS. 5B and 5E, the OAI gate 314 includes the sixteenth PMOS transistor 314a, the seventeenth PMOS transistor 314b, the eighteenth PMOS transistor 314c, the twenty-second PMOS transistor 502d, the sixteenth NMOS transistor 314d, the seventeenth NMOS transistor 314e, the eighteenth NMOS transistor 314f, and the twenty-second NMOS transistor 502e for providing the output 0 or 1 on the OAI gate output node 314g.

The sixteenth PMOS transistor 314a may be connected to a tenth conjunction node 502f, the master feedback signal Mfb outputted on the common master-slave output node 312e, and the OAI gate output node 314g. The seventeenth PMOS transistor 314b may be connected to the tenth conjunction node 502f, the output Q present on the output node 316c of the slave output stage 316, and the eighteenth PMOS transistor 314c. The eighteenth PMOS transistor 314c may be connected to the clock signal CK, and the OAI gate output node 314g. The four PMOS transistors (314a-314c, and 502d) may maintain the body bias substrate voltage of VNW (the high supply voltage) to minimize the parasitic capacitance. The sixteenth PMOS transistor 314a includes the source connected to the tenth conjunction node 502f, the gate connected to the master feedback signal Mfb, and the drain connected to the OAI gate output node 314g. The seventeenth PMOS transistor 314b includes the source connected to the tenth conjunction node 502f, the gate connected to the output Q present on the output node 316c of the slave section 206, and the drain connected to the source of the eighteenth PMOS transistor 314c. The eighteenth PMOS transistor 314c includes the gate connected to the clock signal CK, and the drain connected to the OAI gate output node 314g. The twenty-second PMOS transistor 502d includes a source connected to the VDD voltage, a gate connected to the inverted set control signal nSN, and a drain connected to the tenth conjunction node 502f.

The sixteenth NMOS transistor 314d may be connected to the clock signal CK, the sixth conjunction node 314h and the seventh conjunction node 314i. The sixth conjunction node 314h may be connected to the VSS voltage. The seventeenth NMOS transistor 314e may be connected to the output Q present on the output node 316c of the slave output stage 316, the sixth conjunction node 314h and the seventh conjunction node 314i. The eighteenth NMOS transistor 314f may be connected to the master feedback signal Mfb outputted on the common master-slave stage output node 312e, and the seventh conjunction node 314i. The twenty-second NMOS transistor 502e may be connected to the sixth conjunction node 314h, the inverted set control signal nSN, and the seventh conjunction node 314i. The four NMOS transistors (314d-314f, and 502e) may maintain the body bias substrate voltage of VPW (the low supply voltage) to minimize the parasitic formation. The sixteenth NMOS transistor 314d includes the source connected to the sixth conjunction node 314h, the gate connected to the clock signal CK, and the drain connected to the seventh conjunction node 314i. The seventeenth NMOS transistor 314e includes the source connected to the sixth conjunction node 314h, the gate connected to the output Q of the slave section 206, and the drain connected to the seventh conjunction node 314i. The eighteenth NMOS transistor 314f includes the source connected to the seventh conjunction node 314i, the gate connected to the master feedback signal Mfb, and the drain connected to the OAI gate output node 314g. The twenty-second NMOS transistor 502e may include a source connected to the sixth conjunction node 314h, a gate connected to the inverted set control signal nSN, and a drain connected to the seventh conjunction node 314i.

The slave output stage 316 receives the output of the OAI gate 314, and provides the output Q on the output node 316c. As depicted in FIG. 5B, the slave output stage 316 includes the nineteenth PMOS transistor 316a, and the nineteenth NMOS transistor 316b. The configurations of the transistors of the slave output stage 316 are depicted in FIGS. 3B and 3D, and repeated descriptions thereof are omitted for conciseness.

In an embodiment, for enabling the flip-flop 200 to perform the set operation, the set control signal SN=0 (logic low level) may be applied to the peripheral circuit 504, which outputs the inverted set control signal nSN=1. The inverted set control signal nSN=1 may be applied to the gate of the twenty-first PMOS transistor 502a and the gate of the twenty-first NMOS transistor 502b of the second master stage 310, which outputs the previously stored data Db as Db=0. The master-slave stage 312 of the master section 204 receives Db=0, and outputs the master feedback signal Mfb as Mfb=1. The master feedback signal Mfb=1 may be provided to the OAI gate 314. Also, the inverted set control signal nSN=1 may be applied to the gate of the twenty-second PMOS transistor 502d and the gate of the twenty-second NMOS transistor 502d of the second master stage 310. The OAI gate 314 provides the output as 0. The slave output stage 316 of the slave section 206 receives the output of the OAI gate (i.e. 0) and provides the output Q as Q=1. Thus, performing the set operation.

Figure 6:
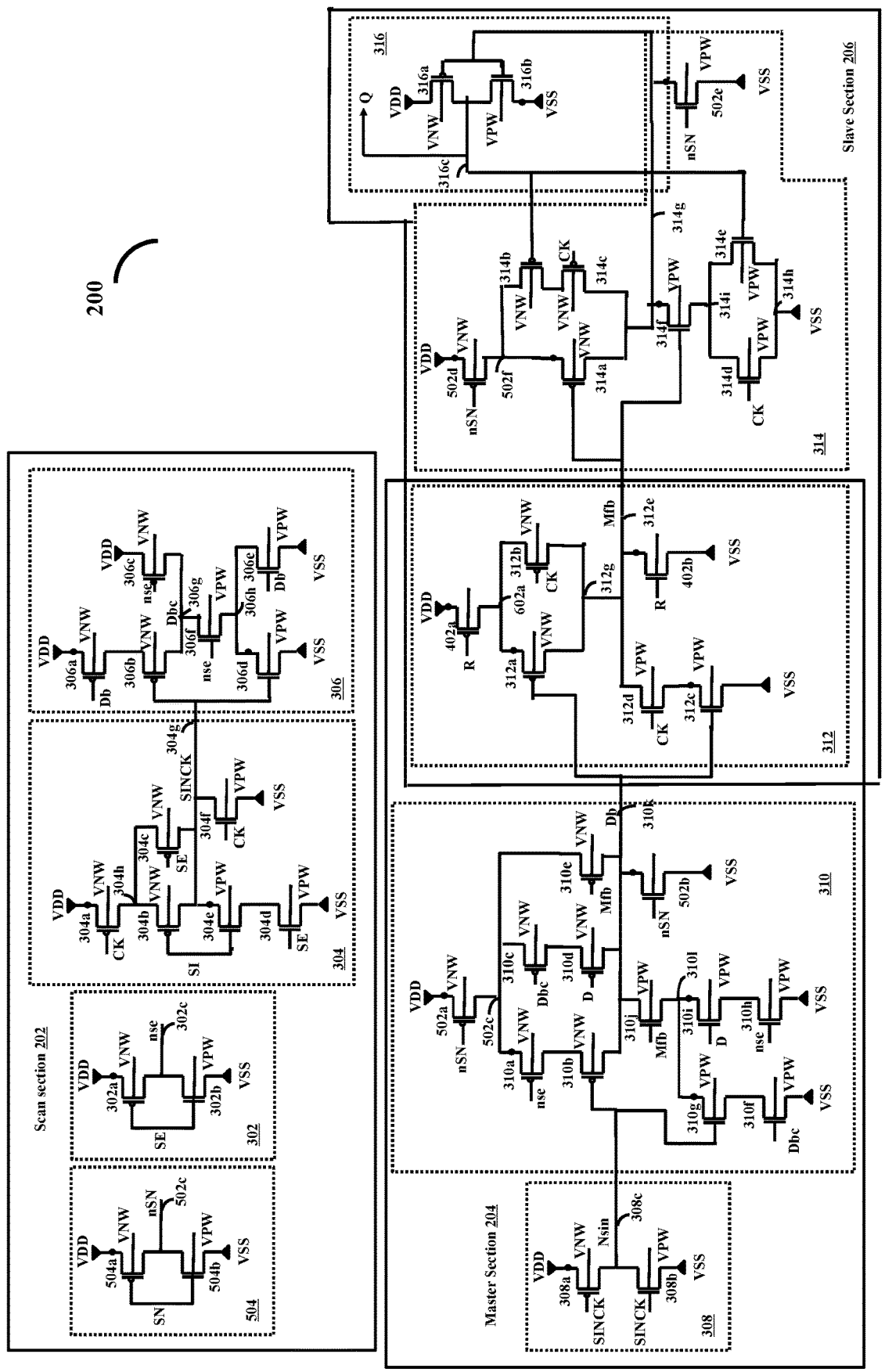
FIG. 6 is a circuit diagram depicting a flip-flop with a set-reset functionality, according to various embodiments.

FIG. 6 is a circuit diagram depicting the flip-flop 200 with a set-reset functionality, according to various embodiments. Embodiments enable the flip-flop 200 to perform the set operation or the reset operation by including the set-reset functionality. In an embodiment, the set-reset functionality may be achieved by implementing two transistors (the twenty-first PMOS transistor 502a, and the twenty-first NMOS transistor 502b) in the second master stage 310 of the master section 204, the two transistors in the master-slave stage 312 (the twentieth PMOS transistor 402a, and the twentieth NMOS transistor 402b), and the two transistors (the twenty-second PMOS transistor 502d, and the twenty-second NMOS transistor 502e) in the OAI gate 314 of the slave section 206.

The flip-flop 200 may perform the set operation or the reset operation based on the set control signal SN and the reset control signal R. For example, the flip-flop 200 may perform the set operation, if the set control signal SN has the logic low level. The flip-flop 200 may perform the reset operation, if the reset control signal R has the logic high level. The flip-flop 200 may perform the set operation, if the set control signal SN has the logic low level, and the reset control signal has the logic high level, and the set control signal SN has priority. The flip-flop 200 may perform the normal operation or the scan test operation if the set control signal SN has the logic high level, and the reset control signal has the logic low level.

The flip-flop 200 enabled with the set-reset functionality includes the scan section 202, the master section 204, and the slave section 206. The scan section 202 includes the peripheral circuit 504, the first scan stage 302, the second scan stage 304, and the third scan stage 306. The peripheral circuit 504 receives the set control signal SN, and outputs the inverted set control signal nSN on the peripheral output node 504c. The peripheral circuit 504 includes the twenty-third PMOS transistor 504a, and the twenty-three NMOS transistor 504b for outputting the inverted set control signal nSN. The first scan stage 302 receives the scan enable signal SE, and outputs the inverted scan enable signal nse on the first scan-stage output node 302c. The first scan stage 302 includes the first PMOS transistor 302a, and the first NMOS transistor 302b for outputting the inverted scan enable signal nse. The second scan stage 304 receives the receives the clock signal CK, the scan input signal SI, and the scan enable signal SE, and outputs the internal signal SINCK on the second scan-stage output node 304g. The second scan stage 304 includes the second PMOS transistor 304a, the third PMOS transistor 304b, the fourth PMOS transistor 304c, the second NMOS transistor 304d, the third NMOS transistor 304e, and the fourth NMOS transistor 304f for outputting the internal signal SINCK. The third scan stage 306 receives the internal signal SINCK, the inverted scan enable signal nse (from the first scan stage 302), and the feedback data Db from the master section 204, and outputs the inverted feedback data Dbc on the third scan-stage output node 306g. The third scan stage 306 includes the fifth PMOS transistor 306a, the sixth PMOS transistor 306b, the seventh PMOS transistor 306c, the fifth NMOS transistor 306d, the sixth NMOS transistor 306e, and the seventh NMOS transistor 306f for outputting the inverted feedback data Dbc. The configurations of the transistors of the first scan stage 302, the second scan stage 304, and the third scan stage 306, and their intended functions are depicted in FIGS. 3B and 3C, and repeated descriptions thereof are omitted for conciseness.

The master section 204 includes the first master stage 308, the second master stage 310, and the master-slave stage 312. The first master stage 308 receives the internal signal SINCK from the second scan-stage output node 304g of the scan section 202 and outputs the inverted signal Nsin on the first master-stage output node 308c. The first master stage 308c includes the eighth PMOS transistor 308a, and the eighth NMOS transistor 308b for outputting the inverted signal Nsin. The configurations of the transistors of the first master stage 308 and their intended functions are depicted in FIGS. 3B and 3D, and repeated descriptions thereof are omitted for conciseness.

The second master stage 310 receives Nsin, the inverted scan enable signal nse, the data input D, the inverted set control signal nSN, the inverted feedback data Dbc, the master feedback signal Mfb, and the inverted set control signal nSN and outputs the previously stored data/feedback data Db on the second master-stage output node 310k. The second master stage 310 includes the ninth PMOS transistor 310a, the tenth PMOS transistor 310b, the eleventh PMOS transistor 310c, the twelfth PMOS transistor 310d, the thirteenth PMOS transistor 310e, and the twenty-first PMOS transistor 502a. The second master stage 310 also includes the ninth NMOS transistor 310f, the tenth NMOS transistor 310g, the eleventh NMOS transistor 310h, the twelfth NMOS transistor 310i, the thirteenth NMOS transistor 310j, and the twenty-first NMOS transistor 502b.

The ninth PMOS transistor 310a may be connected to the ninth conjunction node 502c, the inverted scan enable signal nse, and the tenth PMOS transistor 310b. The tenth PMOS transistor 310b may be connected to the Nsin, and the second master-stage output node 310k. The eleventh PMOS transistor 310c may be connected to the ninth conjunction node 502c, the inverted feedback data Dbc, and the twelfth PMOS transistor 310d. The twelfth PMOS transistor 310d may be connected to the data input D, and the second master-stage output node 310k. The thirteenth PMOS transistor 310e may be connected to the ninth conjunction node 502c, the master feedback signal Mfb, and the second master-stage output node 310k. The twenty-first PMOS transistor 502a may be connected to the ninth conjunction node 502c, the inverted set control signal nSN, and the VDD voltage. The ninth NMOS transistor 310f may be connected to the VSS voltage, the inverted feedback data Dbc, and the tenth NMOS transistor 310g. The tenth NMOS transistor 310g may be connected to Nsin, and the third conjunction node 310l. The eleventh NMOS transistor 310h may be connected to the VSS voltage, the inverted scan enable signal nse, and the twelfth NMOS transistor 310i. The twelfth NMOS transistor 310i may be connected to the data input D, and the third conjunction node 310l. The thirteenth NMOS transistor 310j may be connected to the third conjunction node 310l, the master feedback signal Mfb, and the second master-stage output node 310k. The twenty-first NMOS transistor 502b may be connected to the VSS voltage, the inverted set control signal nSN, and the second master-stage output node 310k. The configurations of the transistors of the second master stage 310 and their intended functions are depicted in FIG. 5B, and repeated descriptions thereof are omitted for conciseness.

The master-slave stage 312 receives Db, the clock signal CK, the reset control signal R, and outputs the master feedback signal Mfb on the common master-slave stage output node 312e. The master-slave stage 312 includes the fourteenth PMOS transistor 312a, the fifteenth PMOS transistor 312b, the fourteenth NMOS transistors 312c, the fifteenth NMOS transistor 312d, the twentieth PMOS transistor 402a, and the twentieth NMOS transistor 402b. The fourteenth PMOS transistor 312a may be connected to an eleventh conjunction node 602a, the feedback data Db, and the fifth conjunction node 312g. The fifteenth PMOS transistor 312b may be connected to the eleventh conjunction node 602a, the clock signal CK, and the fifth conjunction node 312g. The fifth conjunction node 312g may be connected to the common master-slave stage output node 312e. The twentieth PMOS transistor 402a may be connected to the VDD voltage, the reset control signal R, and the eleventh conjunction node 602a. The fourteenth PMOS transistor 312a includes the source connected to the eleventh conjunction node 602a, the gate connected to the feedback data Db, and the drain connected to the fifth conjunction node 312g. The fifteenth PMOS transistor 312b includes the source connected to the eleventh conjunction node 602a, the gate connected to the clock signal CK, and the drain connected to the fifth conjunction node 312g. The twentieth PMOS transistor 402a includes the source connected to the VDD voltage, the gate connected to the reset control signal R, and the drain connected to the eleventh conjunction node 602a. The fourteenth NMOS transistor 312c may be connected to the VSS voltage, the feedback data Db, and the fifteenth NMOS transistor 312d. The fifteenth NMOS transistor 312d may be connected to the clock signal CK, and the common master-slave stage output node 312e. The twentieth NMOS transistor 402b may be connected to the VSS voltage, the reset control signal R, and the common master-slave stage output node 312e. The fourteenth NMOS transistor 312c includes the source connected to the VSS voltage, the gate connected to the feedback data Db, and the drain connected to source of the fifteenth NMOS transistor 312d. The fifteenth NMOS transistor 312d includes the gate connected to the clock signal CK, and the drain connected to the common master-slave stage output node 312e. The twentieth NMOS transistor 402b includes the source connected to the VSS voltage, the gate connected to the reset control signal R, and the drain connected to the common master-slave stage output node 312e.

The OAI gate 314 receives the master feedback signal Mfb from the master-slave stage 312, the clock signal CK, and the inverted set control signal nSN and provides the output corresponding to 0 or 1. The OAI gate 314 includes the sixteenth PMOS transistor 314a, the seventeenth PMOS transistor 314b, the eighteenth PMOS transistor 314c, the twenty-second PMOS transistor 502d, the sixteenth NMOS transistor 314d, the seventeenth NMOS transistor 314e, the eighteenth NMOS transistor 314f, and the twenty-second NMOS transistor 502e for providing the output 0 or 1. The sixteenth PMOS transistor 314a may be connected to the tenth conjunction node 502f, the master feedback signal Mfb, and the OAI gate output node 314g. The seventeenth PMOS transistor 314b may be connected to the tenth conjunction node 502f, the output Q on the output node 316c, and the eighteenth PMOS transistor 314c. The eighteenth PMOS transistor 314c may be connected to the clock signal CK, and the OAI gate output node 314g. The twenty-second PMOS transistor 502d may be connected to the VDD voltage, the inverted set control signal nSN, and the tenth conjunction node 502f The sixteenth PMOS transistor 314a includes the source connected to the tenth conjunction node 502f, the gate connected to the master feedback signal Mfb, and the OAI gate output node 314g. The seventeenth PMOS transistor 314b includes the source connected to the tenth conjunction node 502f, the gate connected to the output Q on the output node 316c, and the drain connected to the source of the eighteenth PMOS transistor 314c. The eighteenth PMOS transistor 314c includes the source connected to the clock signal CK, and the drain connected to the OAI gate output node 314g. The twenty-second PMOS transistor 502d includes the source connected to the VDD voltage, the gate connected to the inverted set control signal nSN, and the drain connected to the tenth conjunction node 502f The sixteenth NMOS transistor 314d may be connected to the sixth conjunction node 314h, the clock signal, and the seventh conjunction node 314i. The sixth conjunction node 314h may be connected to the VSS voltage. The seventeenth NMOS transistor 314e may be connected to the sixth conjunction node 314h, the output Q present on the output node 316c, and the seventh conjunction node 314i. The eighteenth NMOS transistor 314f may be connected to the seventh conjunction node 314i, the master feedback signal, and the OAI gate output node 314g. The twenty-second NMOS transistor 502e may be connected to the VSS voltage, the inverted set control signal nSN, and the OAI gate output node 314g. The sixteenth NMOS transistor 314d includes the source connected to the sixth conjunction node 314h, the gate connected to the clock signal, and the drain connected to the seventh conjunction node 314i. The seventeenth NMOS transistor 314e includes the source connected to the sixth conjunction node 314h, the gate connected to the output Q present on the output node 316c, and the drain connected to the seventh conjunction node 314i. The eighteenth NMOS transistor 314f includes the source connected to the seventh conjunction node 314i, the gate connected to the master feedback signal Mfb, and the drain connected to the OAI gate output node 314g. The twenty-second NMOS transistor 502e includes the source connected to the VSS voltage, the gate connected to the inverted set control signal nSN, and the drain connected to the OAI gate output node 314g.

The slave output stage 316 receives the output of the OAI gate 314, and provides the output Q. As depicted in FIG. 6, the slave output stage 316 includes the nineteenth PMOS transistor 316a, and the nineteenth NMOS transistor 316b. The configurations of the transistors of the slave output stage 316 and their intended functions are depicted in FIGS. 3B and 3E, and repeated descriptions thereof are omitted for conciseness.

In an embodiment, for enabling the flip-flop 200 with the set-reset functionality to perform the set operation, the set control signal SN=0 (logic low level) may be applied to the peripheral circuit 504, which outputs the inverted set control signal nSN=1. The inverted set control signal nSN=1 may be applied to the gate of the twenty-first PMOS transistor 502a and the gate of the twenty-first NMOS transistor 502b of the second master stage 310, which outputs the previously stored data Db as Db=0. Db=0 may be provided to the master-slave stage 312. Further, the reset control signal R=0 may be applied to the gate of the twentieth PMOS transistor 402a and the gate of the twentieth NMOS transistor 402b of the master-slave stage 312. The master-slave stage 312 outputs the master feedback signal Mfb as Mfb=1, since Db=0, and R=0. The master feedback signal Mfb=1 may be provided to the OAI gate 314. Also, the inverted set control signal nSN=1 may be applied to the gate of the twenty-second PMOS transistor 502d and the gate of the twenty-second NMOS transistor 502d of the OAI gate 314. The OAI gate 314 provides the output as 0. The slave output stage 316 of the slave section 206 receives the output of the OAI gate (i.e. 0) and provides the output Q as Q=1. Thus, performing the set operation.

In an embodiment, for enabling the flip-flop 200 with the set-reset functionality to perform the reset operation, the set control signal SN=1 (logic high level) may be applied to the peripheral circuit 504, which outputs the inverted set control signal nSN=0. The inverted set control signal nSN=0 may be applied to the gate of the twenty-first PMOS transistor 502a and the gate of the twenty-first NMOS transistor 502b of the second master stage 310, which outputs the previously stored data Db as Db=1. Db=1 may be provided to the master-slave stage 312. Further, the reset control signal R=1 may be applied to the gate of the twentieth PMOS transistor 402a and the gate of the twentieth NMOS transistor 402b of the master-slave stage 312. The master-slave stage 312 outputs the master feedback signal Mfb as Mfb=0, Db=1, and R=1. The master feedback signal Mfb=0 may be provided to the OAI gate 314. Also, the inverted set control signal nSN=0 may be applied to the gate of the twenty-second PMOS transistor 502d and the gate of the twenty-second NMOS transistor 502d of the OAI gate 314. The OAI gate 314 provides the output as 1. The slave output stage 316 of the slave section 206 receives the output of the OAI gate (i.e. 1) and provides the output Q as Q=0. Thus, performing the reset operation.

In an embodiment, for enabling the flip-flop 200 with the set-reset functionality to perform the set operation with the set priority, the set control signal SN=0 (logic low level) may be applied to the peripheral circuit 504, which outputs the inverted set control signal nSN=1. The inverted set control signal nSN=1 may be applied to the gate of the twenty-first PMOS transistor 502a and the gate of the twenty-first NMOS transistor 502b of the second master stage 310, which outputs the previously stored data Db as Db=0. Db=0 may be provided to the master-slave stage 312. Further, the reset control signal R=1 may be applied to the gate of the twentieth PMOS transistor 402a and the gate of the twentieth NMOS transistor N20 402b of the master-slave stage 312. The master-slave stage 312 outputs the master feedback signal Mfb as Mfb=0, since Db=0, and R=1. The master feedback signal Mfb=0 may be provided to the OAI gate 314. Also, the inverted set control signal nSN=1 may be applied to the gate of the twenty-second PMOS transistor 502d and the gate of the twenty-second NMOS transistor 502d of the OAI gate 314. The OAI gate 314 provides the output as 0 due to nSN. The slave output stage 316 of the slave section 206 receives the output of the OAI gate (i.e. 0) and provides the output Q as Q=1. Thus, performing the set operation.

Figure 7A:
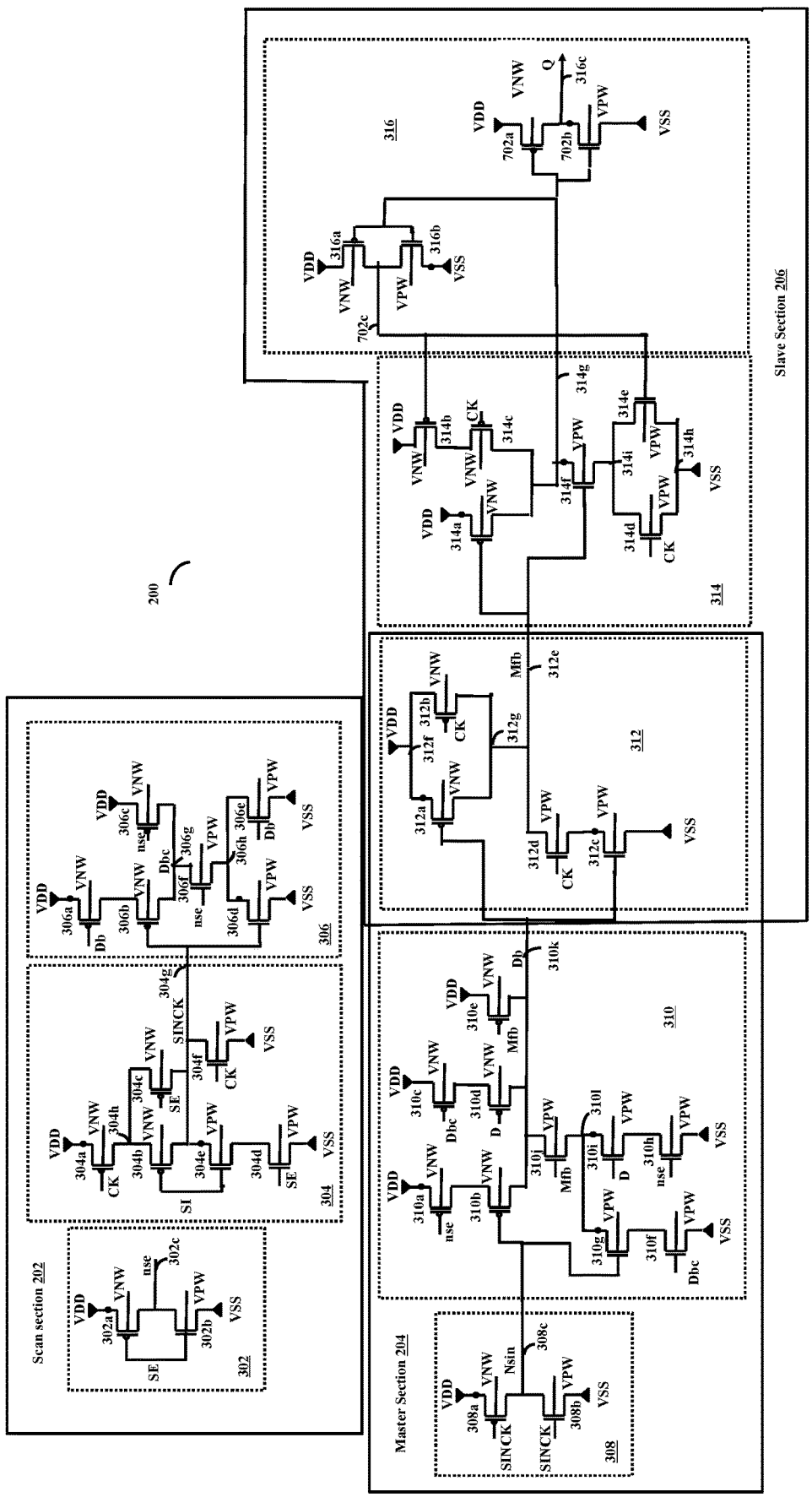
FIG. 7A is a circuit diagram depicting a flip-flop with an unbarred output, according to various embodiments.

FIG. 7A is a circuit diagram depicting the flip-flop 200 with an unbarred output, according to various embodiments. Embodiments enable the flip-flop 200 to include the unbarred output by implementing two transistors (a twenty-fourth PMOS transistor 702a, and a twenty-fourth NMOS transistor 702b) in the slave output stage 316 of the slave section 206.

The flip-flop 200 with the unbarred output includes the scan section 202, the master section 204, and the slave section 206. The scan section 202 includes the first scan stage 302, the second scan stage 304, and the third scan stage 306. The first scan stage 302 receives the scan enable signal SE, and outputs the inverted scan enable signal nse on the first scan-stage-output node 302c. The first scan stage 302 includes the first PMOS transistor 302a, and the first NMOS transistor 302b for outputting the inverted scan enable signal nse. The second scan stage 304 receives the scan enable signal SE, the scan input signal SI, and the clock signal CK, and outputs the internal signal SINCK on the second scan-stage output node 304g. The second scan stage 304 includes the second PMOS transistor 304a, the third PMOS transistor 304b, the fourth PMOS transistor 304c, the second NMOS transistor 304d, the third NMOS transistor 304e, and the fourth NMOS transistor 304f for outputting the internal signal SINCK. The third scan stage 306 receives the internal signal SINCK, the feedback data Db, and the inverted scan enable signal nse, and outputs the inverted feedback data Dbc on the third scan-stage output node 306g, which may be provided to the master section 204. The third scan stage 306 includes the fifth PMOS transistor 306a, the sixth PMOS transistor 306b, the seventh PMOS transistor 306c, the fifth NMOS transistor 306d, the sixth NMOS transistor 306e, and the seventh NMOS transistor 306f for outputting the inverted feedback data Dbc. The configurations of the transistors of the first scan stage 302, the second scan stage 304, and the third scan stage 306, and their intended functions are depicted in FIGS. 3B and 3C, and repeated descriptions thereof are omitted for conciseness.

The master section 204 includes the first master stage 308, the second master stage 310, and the master-slave stage 312. The first master stage 308 receives the internal signal SINCK, and outputs the inverted signal Nsin on the first master-stage output node 308c. The first master stage 308 includes the eighth PMOS transistor 308a, and the eighth NMOS transistor 308b for outputting the inverted signal Nsin. The second master stage 310 receives the inverted signal Nsin, the inverted scan enable signal nse, the data input D, the master feedback signal Mfb, and the inverted feedback data Dbc, and outputs the previously stored data Db. The second master stage 310 includes the ninth PMOS transistor 310a, the tenth PMOS transistor 310b, the eleventh PMOS transistor 310c, the twelfth PMOS transistor 310d, the thirteenth PMOS transistor 310e, the ninth NMOS transistor 310f, the tenth NMOS transistor 310g, the eleventh NMOS transistor 310h, the twelfth NMOS transistor 310i, and the thirteenth NMOS transistor 310j for outputting the previously stored data/feedback data Db. The master-slave stage 312 receives the previously stored data Db and the clock signal CK, and outputs the master feedback signal Mfb on the common master-slave output node 312e. The configurations of the transistors of the first master stage 308, the second master stage 310, and the master-slave stage 312, and their intended functions are described in FIGS. 3A, 3B and 3D, and repeated descriptions thereof are omitted for conciseness.

Figure 7B:
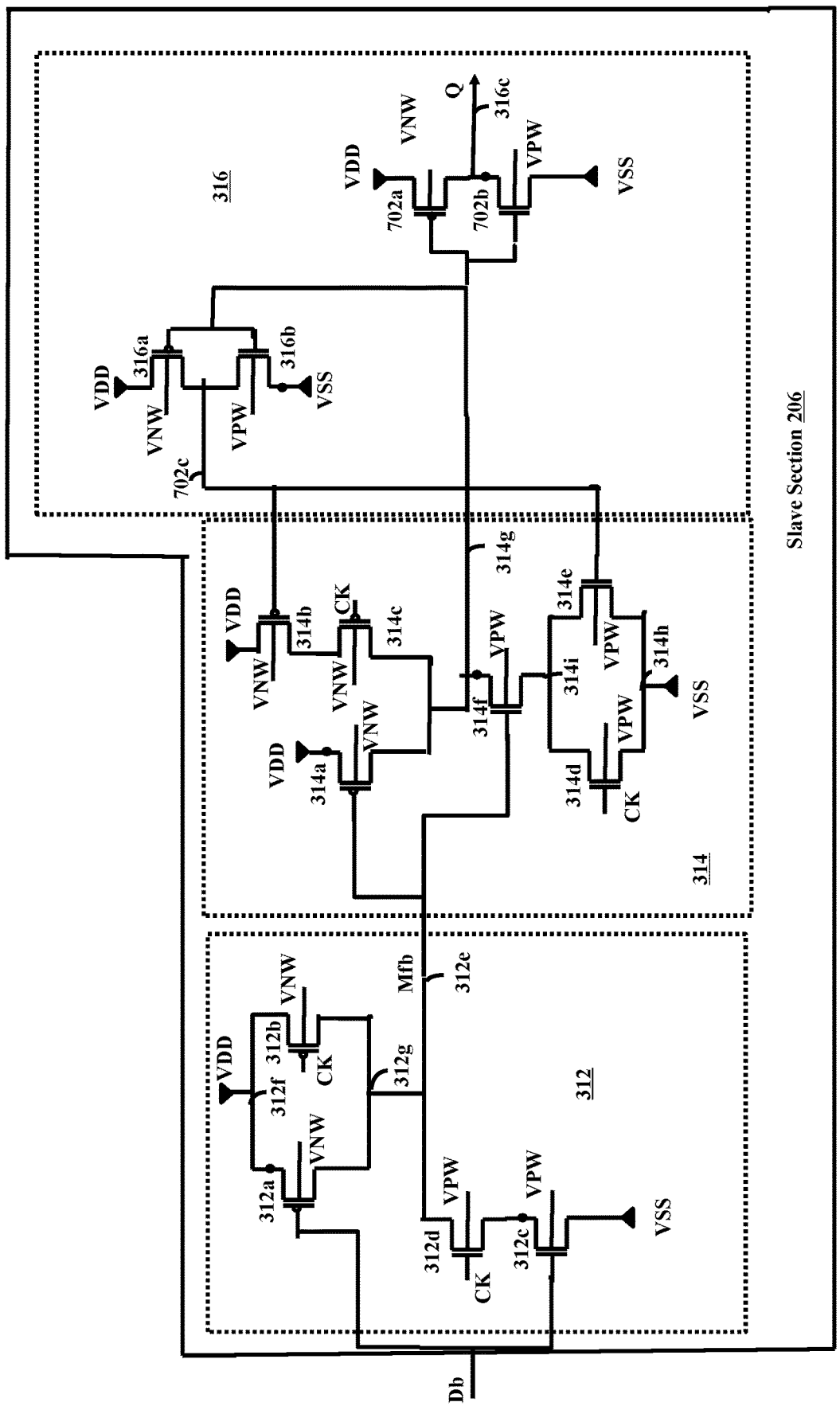
FIG. 7B is a circuit diagram depicting a slave section of the flip-flop with the unbarred output, according to various embodiments.

As depicted in FIGS. 7A and 7B, the slave section 206 includes the OAI gate 314, and the slave output stage 316. The OAI gate 314 fetches the master feedback signal Mfb and provides the output on the OAI gate output node 314g based on the clock signal CK, and the fetched master feedback signal Mfb, wherein the output corresponds to 1 or 0. The OAI gate 314 includes the sixteenth PMOS transistor 314a, the seventeenth PMOS transistor 314b, the eighteenth PMOS transistor 314c, the sixteenth NMOS transistor 314d, the seventeenth NMOS transistor 314e, and the eighteenth NMOS transistor 314f.

The sixteenth PMOS transistor 314a may be connected to the VDD voltage, the master feedback signal Mfb, and the OAI gate output node 314g. The seventeenth PMOS transistor 314b may be connected to the VDD voltage, a first output node 702c of the slave output stage 316, and the eighteenth PMOS transistor 314c. The eighteenth PMOS transistor 314c may be connected to the clock signal CK, and the OAI gate output node 314g. The three PMOS transistors (314a, 314b, and 314c) may maintain the body bias substrate voltage of VNW (the high supply voltage) to minimize the parasitic formation. The sixteenth PMOS transistor 314a includes the source connected to the VDD voltage, the gate connected to the master feedback signal Mfb, and the drain connected to the OAI gate output node 314g. The seventeenth PMOS transistor 314b includes the source connected to the VDD voltage, the gate connected to the first output node 702c of the slave output stage 316, and the drain connected to the source of the eighteenth PMOS transistor 314c. The eighteenth PMOS transistor 314c includes the gate connected to the clock signal CK, and the drain connected to the OAI gate output node 314g. The sixteenth NMOS transistor 314d may be connected to the sixth conjunction node 314h, the clock signal CK, and the seventh conjunction node 314i. The sixth conjunction node 314h may be connected to the VSS voltage. The seventeenth NMOS transistor 314e may be connected to the sixth conjunction node 314h, the first output node 702c of the slave output stage 316, and the seventh conjunction node 314i. The eighteenth NMOS transistor 314f may be connected to the OAI gate output node 314g, the master feedback signal, and the seventh conjunction node 314i. The three NMOS transistors (314d, 314e, and 314f) may maintain the body bias substrate voltage of VPW (the low supply voltage) to minimize the parasitic formation. The sixteenth NMOS transistor 314d includes the source connected to the sixth conjunction node 314h, the gate connected to the clock signal CK, and the drain connected to the seventh conjunction node 314i. The seventeenth NMOS transistor 314e includes the source connected to the sixth conjunction node 314h, the gate connected to the first output node 702c, and the drain connected to the seventh conjunction node 314*i*. The eighteenth NMOS transistor 314*f* includes the source connected to the seventh conjunction node 314*i*, the gate connected to the master feedback signal Mfb, and the drain connected to the OAI gate output node 314*g*.

The slave output stage 316 receives the output of the OAI gate 314 from the OAI gate output node 314*g*, and outputs the output Q on the output node 316*c*. The slave output stage 316 includes the nineteenth PMOS transistor 316*a*, the nineteenth NMOS transistor 316*b*, the twenty-fourth PMOS transistor 702*a*, and the twenty-fourth NMOS transistor 702*b*. The nineteenth PMOS transistor 316*a* may be connected to the VDD voltage, the OAI gate output node 314*g* and the first output node 702*c*. The twenty-fourth PMOS transistor 702*a* may be connected to the VDD voltage, the OAI gate output node 314*g*, and the output node 316*c*. The twenty-fourth NMOS transistor 702*b* may be connected to the VSS voltage, the OAI gate output node 314*g*, and the output node 316*c*. The nineteenth NMOS transistor 316*b* may be connected to the VSS voltage, the OAI gate output node 314*g* and the first output node 702*c*. The nineteenth PMOS transistor 316*a* includes the source connected to the VDD voltage, the gate connected to the OAI gate output node 314*g*, and the drain connected to the first output node 702*c*. The nineteenth NMOS transistor 316*b* includes the source connected to the VSS voltage, the gate connected to the OAI gate output node 314*g*, and the drain connected to the first output node 702*c*. The twenty-fourth PMOS transistor 702*a* includes a source connected to the VDD voltage, a gate connected to the OAI gate output node 314*g*, and a drain connected to the output node 316*c*. The twenty-fourth NMOS transistor 702*b* includes a source connected to the VSS voltage, a gate connected to the OAI gate output node 314*g*, and a drain connected to the output node 316*c*.

Figure 8A:
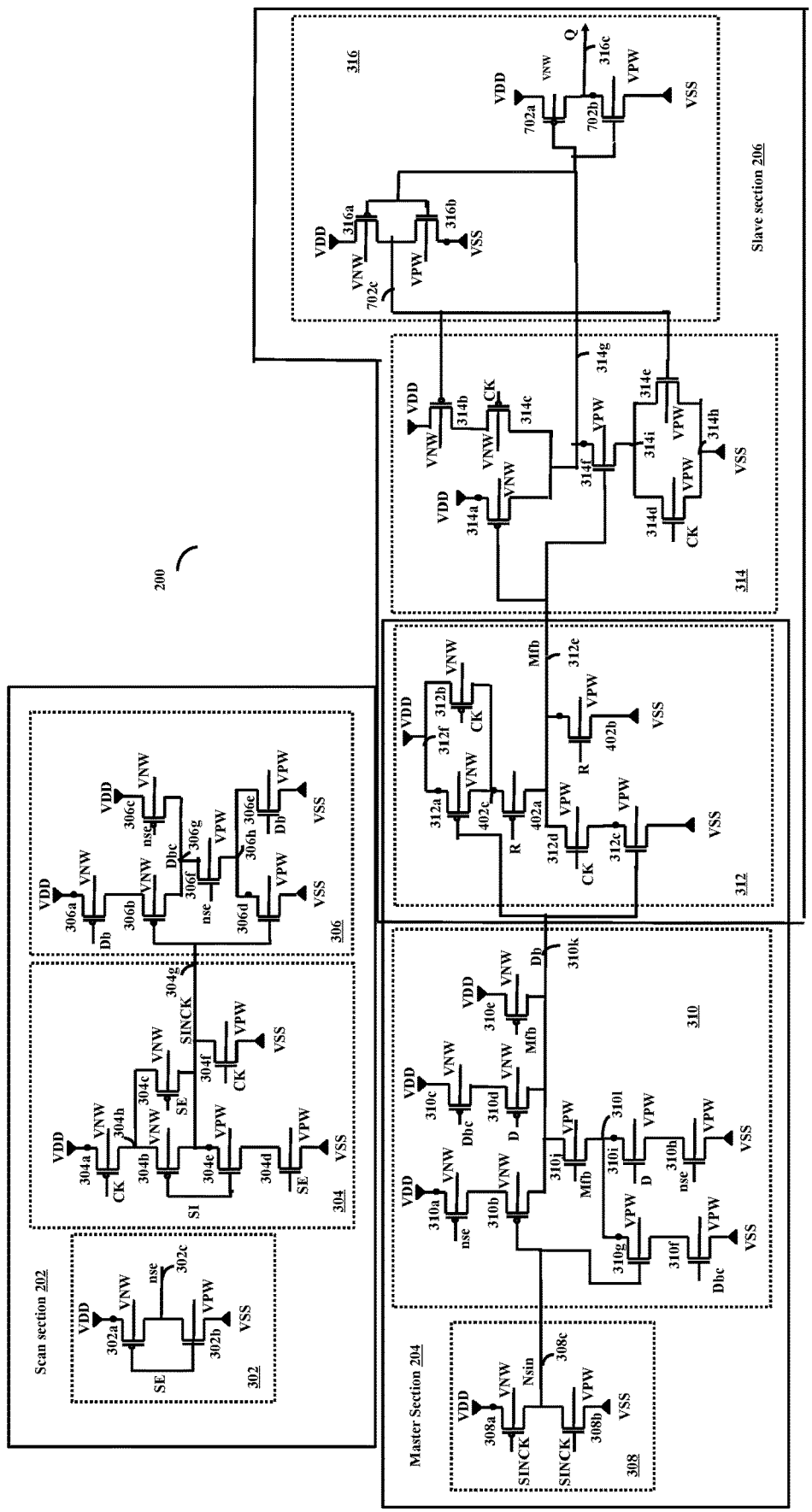
FIG. 8A is a circuit diagram depicting a flip-flop including the unbarred output, and the reset functionality, according to various embodiments.

FIG. 8A is a circuit diagram depicting the flip-flop 200 including the unbarred output and the reset functionality, according to various embodiments.

The flip-flop 200 with the unbarred output to perform the reset operation includes the scan section 202, the master section 204, and the slave section 206. The scan section 202 includes the first scan stage 302, the second scan stage 304, and the third scan stage 306. The first scan stage 302 receives the scan enable signal SE, and outputs the inverted scan enable signal nse on the first scan-stage-output node 302*c*. The first scan stage 302 includes the first PMOS transistor 302*a*, and the first NMOS transistor 302*b* for outputting the inverted scan enable signal nse. The second scan stage 304 receives the scan enable signal SE, the scan input signal SI, and the clock signal CK, and outputs the internal signal SINCK on the second scan-stage output node 304*g*. The second scan stage 304 includes the second PMOS transistor 304*a*, the third PMOS transistor 304*b*, the fourth PMOS transistor 304*c*, the second NMOS transistor 304*d*, the third NMOS transistor 304*e*, and the fourth NMOS transistor 304*f* for outputting the internal signal SINCK. The third scan stage 306 receives the internal signal SINCK, the feedback data Db, and the inverted scan enable signal nse, and outputs the inverted feedback data Dbc on the third scan-stage output node 306*g*, which may be provided to the master section 204. The third scan stage 306 includes the fifth PMOS transistor 306*a*, the sixth PMOS transistor 306*b*, the seventh PMOS transistor 306*c*, the fifth NMOS transistor 306*d*, the sixth NMOS transistor 306*e*, and the seventh NMOS transistor 306*f* for outputting the inverted feedback data Dbc. The configurations of the transistors of the first scan stage 302, the second scan stage 304, and the third scan stage 306, and their intended functions are depicted in FIGS. 3B, 3C and 4B, and repeated descriptions thereof are omitted for conciseness.

The master section 204 includes the first master stage 308, the second master stage 310, and the master-slave stage 312. The first master stage 308 receives the internal signal SINCK, and outputs the inverted signal Nsin on the first master-stage output node 308*c*. The first master stage 308 includes the eighth PMOS transistor 308*a*, and the eighth NMOS transistor 308*b* for outputting the inverted signal Nsin. The second master stage 310 receives Nsin, the inverted scan enable signal nse, the data input D, the master feedback signal Mfb, and the inverted feedback data Dbc, and outputs the previously stored data Db. The second master stage 310 includes the ninth PMOS transistor 310*a*, the tenth PMOS transistor 310*b*, the eleventh PMOS transistor 310*c*, the twelfth PMOS transistor 310*d*, the thirteenth PMOS transistor 310*e*, the ninth NMOS transistor 310*f*, the tenth NMOS transistor 310*g*, the eleventh NMOS transistor 310*h*, the twelfth NMOS transistor 310*i*, and the thirteenth NMOS transistor 310*j* for outputting the previously stored data/feedback data Db. The configurations of the transistors of the first master stage 308, and the second master stage 310, and their intended functions are described in FIGS. 3A, 3B and 3D, and repeated descriptions thereof are omitted for conciseness.

Figure 8B:
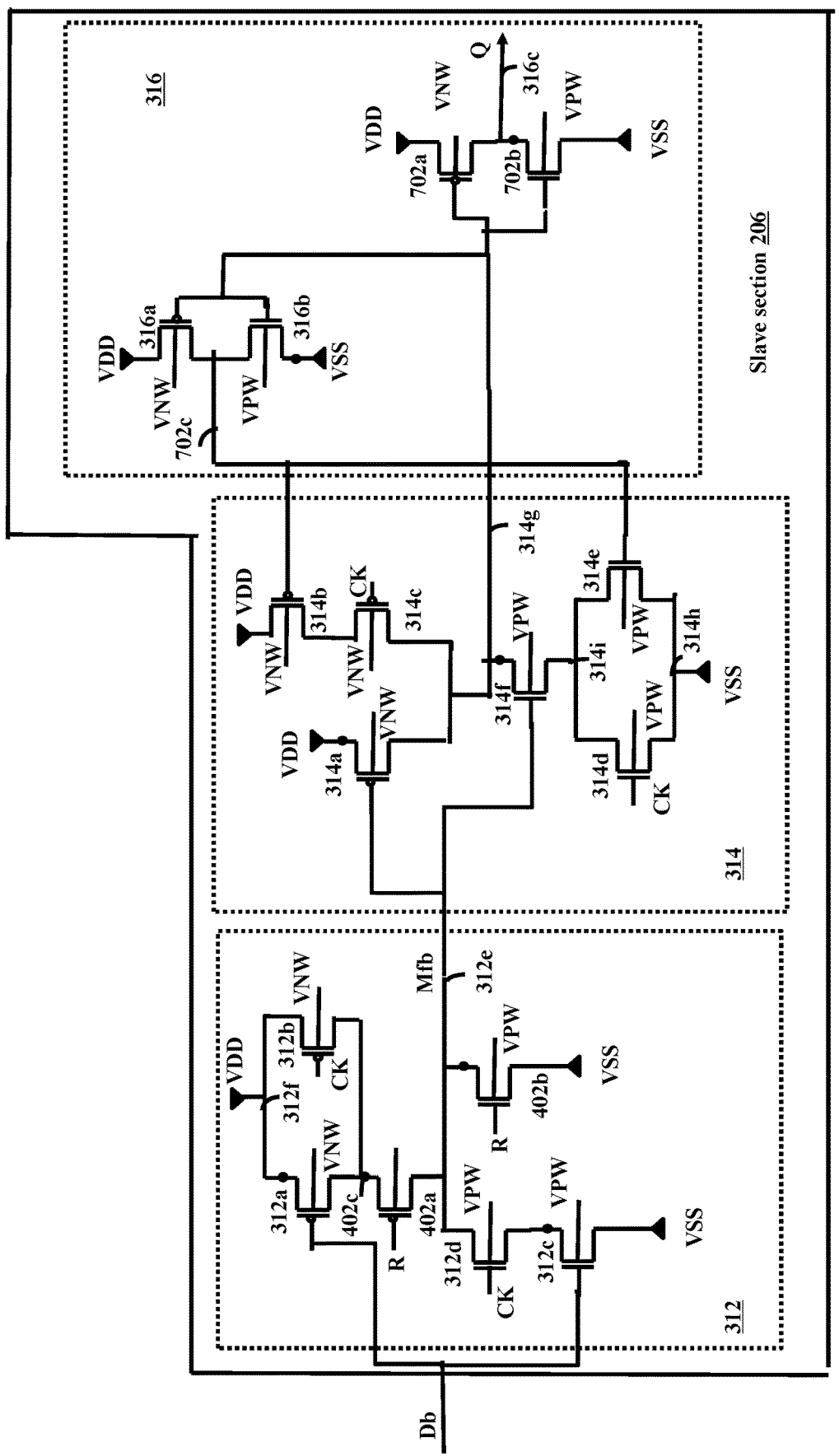
FIG. 8B is a circuit diagram depicting a slave section of the flip-flop including the unbarred output, and the reset functionality, according to various embodiments.

As depicted in FIGS. 8A and 8B, the master-slave stage 312 receives the previously stored data Db, the reset control signal R and the clock signal CK, and outputs the master feedback signal Mfb on the common master-slave output node 312*e*. The master-slave stage 312 includes the fourteenth PMOS transistor 312*a*, the fifteenth PMOS transistor 312*b*, the fourteenth NMOS transistors 312*c*, the fifteenth NMOS transistor 312*d*, the twentieth PMOS transistor 402*a*, and the twentieth NMOS transistor 402*b* for outputting the master feedback signal Mfb. The configurations of the transistors of the master-slave stage 312, and their intended functions are described in FIG. 4B, and repeated descriptions thereof are omitted for conciseness.

The slave section 206 includes the OAI gate 314, and the slave output node 316. The OAI gate 314 fetches the master feedback signal Mfb and provides the output 1 or 0. The slave output stage 316 provides the unbarred output Q based on the output of the OAI gate 314. The OAI gate 314 includes the sixteenth PMOS transistor 314*a*, the seventeenth PMOS transistor 314*b*, the eighteenth PMOS transistor 314*c*, the sixteenth NMOS transistor 314*d*, the seventeenth NMOS transistor 314*e*, and the eighteenth NMOS transistor 314*f*, for providing the output 0 or 1. The slave output stage 316 includes the nineteenth PMOS transistor 316*a*, the nineteenth NMOS transistor 316*b*, the twenty-fourth PMOS transistor 702*a*, and the twenty-fourth NMOS transistor 702*b* for providing the unbarred output Q. The configurations of the transistors of the OAI gate 314, and the slave output stage 316 and their intended functions are depicted in FIGS. 7A and 7B, and repeated descriptions thereof are omitted for conciseness.

In an embodiment, for enabling the flip-flop 200 with the unbarred output to perform the reset operation, the reset control signal R=1 (high logic level) may be applied to the gate of the twentieth PMOS transistor 402*a* and the gate of the twentieth NMOS transistor 402*b* of the master-slave stage 312, when the previously stored data Db=1. The master-slave stage 312 outputs the master feedback signal Mfb as Mfb=0, since the reset control signal R=1. The OAI gate 314 of the slave section 206 fetches the master feedback signal Mfb=0 from the master-slave stage 312, and provides 1 as the output. The slave output stage 316 of the slave section 206 receives the output of the OAI gate (i.e. 1) and provides the output Q as Q=0. Thus, performing the reset operation.

Figure 9A:
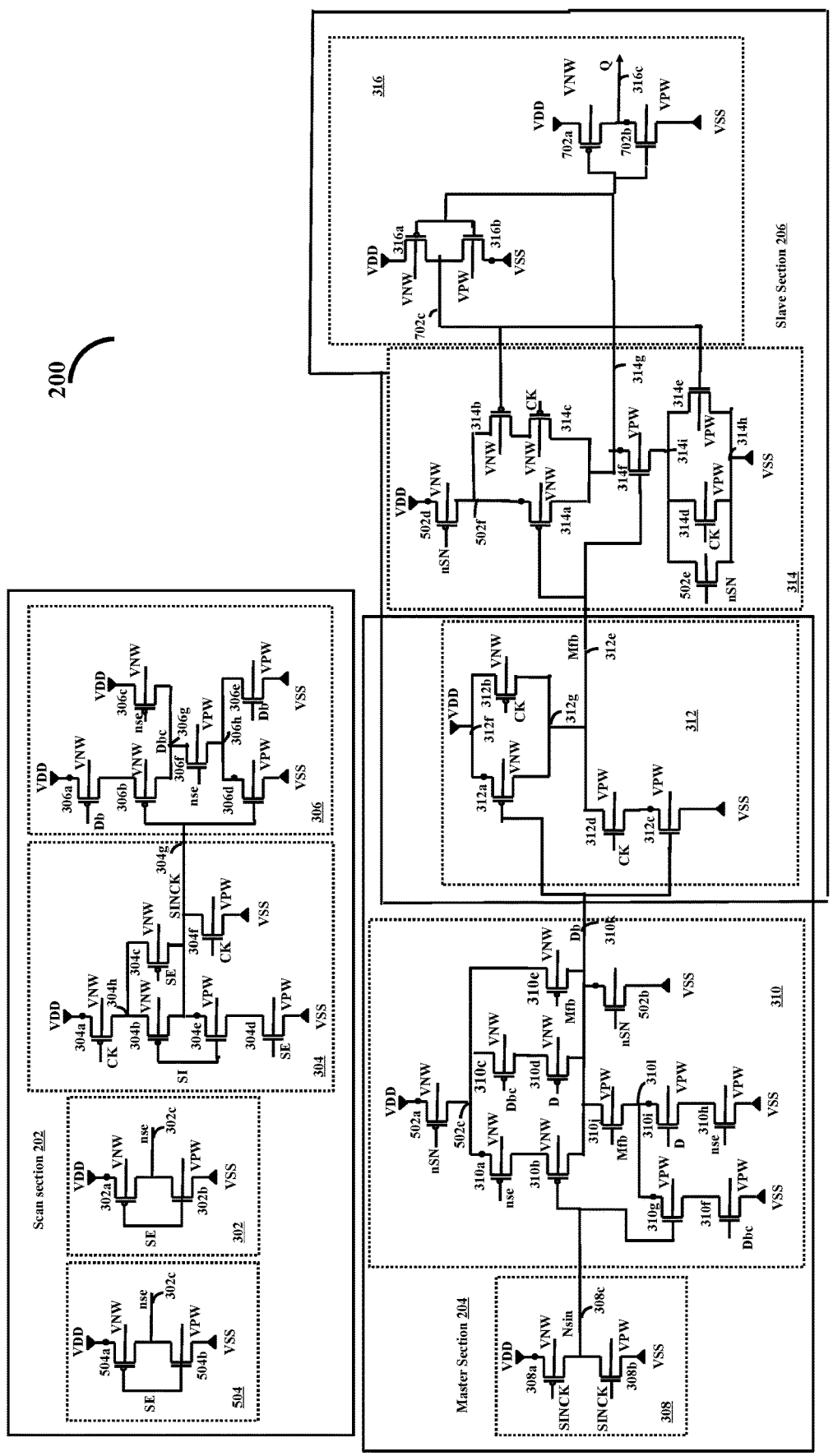
FIG. 9A is a circuit diagram depicting a flip-flop including the set functionality and the unbarred output, according to various embodiments.

FIG. 9A is a circuit diagram depicting the flip-flop 200 including the set functionality and the unbarred output, according to various embodiments.

The flip-flop 200 with the unbarred output to perform the set operation includes the scan section 202, the master section 204, and the slave section 206. The scan section 202 includes the peripheral section 504, the first scan stage 302, the second scan stage 304, and the third scan stage 306. The peripheral section 504 receives the set control signal SN, and outputs the inverted set control signal nSN on the peripheral output node 504c. The configurations of the transistors of the peripheral section 504, and their intended functions are depicted in FIG. 5B, and repeated descriptions thereof are omitted for conciseness.

The first scan stage 302 receives the scan enable signal SE, and outputs the inverted scan enable signal nse on the first scan-stage-output node 302c. The first scan stage 302 includes the first PMOS transistor 302a, and the first NMOS transistor 302b for outputting the inverted scan enable signal nse. The second scan stage 304 receives the scan enable signal SE, the scan input signal SI, and the clock signal CK, and outputs the internal signal SINCK on the second scan-stage output node 304g. The second scan stage 304 includes the second PMOS transistor 304a, the third PMOS transistor 304b, the fourth PMOS transistor 304c, the second NMOS transistor 304d, the third NMOS transistor 304e, and the fourth NMOS transistor 304f for outputting the internal signal SINCK. The third scan stage 306 receives the internal signal SINCK, the feedback data Db, and the inverted scan enable signal nse, and outputs the inverted feedback data Dbc on the third scan-stage output node 306g, which may be provided to the master section 204. The third scan stage 306 includes the fifth PMOS transistor 306a, the sixth PMOS transistor 306b, the seventh PMOS transistor 306c, the fifth NMOS transistor 306d, the sixth NMOS transistor 306e, and the seventh NMOS transistor 306f for outputting the inverted feedback data Dbc. The configurations of the transistors of the first scan stage 302, the second scan stage 304, and the third scan stage 306, and their intended functions are depicted in FIGS. 3B, 3C, and 5B, and repeated descriptions thereof are omitted for conciseness.

Figure 9B:
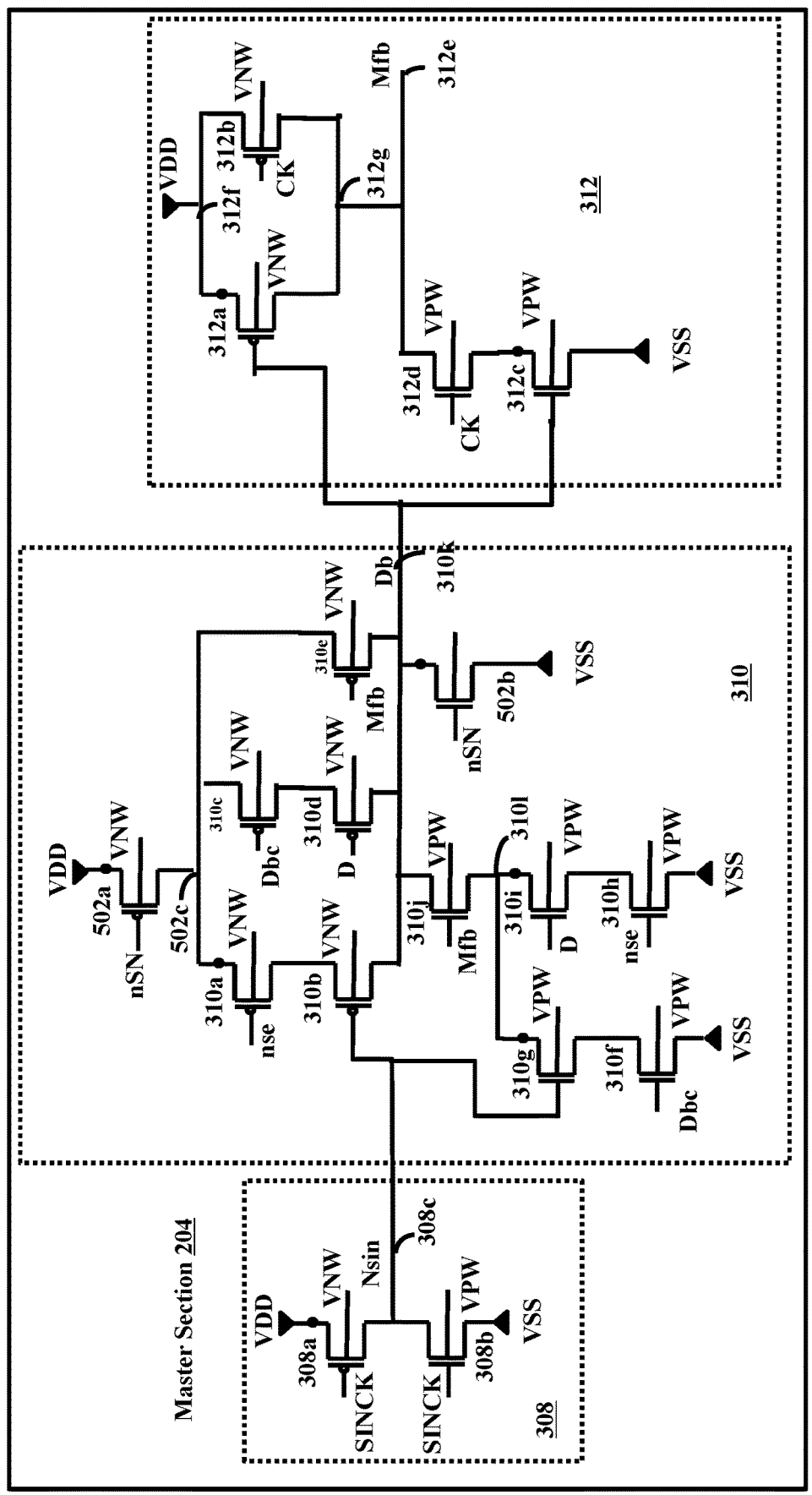
FIG. 9B is a circuit diagram depicting a master section of the flip-flop including the set functionality and the unbarred output, according to various embodiments.

As depicted in FIGS. 9A and 9B, the master section 204 includes the first master stage 308, the second master stage 310, and the master-slave stage 312. The first master stage 308 receives the internal signal SINCK, and outputs the inverted signal Nsin on the first master-stage output node 308c. The first master stage 308 includes the eighth PMOS transistor 308a, and the eighth NMOS transistor 308b for outputting the inverted signal Nsin.

The second master stage 310 receives Nsin, the inverted scan enable signal nse, the data input D, the inverted feedback data Dbc, the master feedback signal Mfb, and the inverted set control signal nSN and outputs the previously stored data/feedback data Db on the second master-stage output node 310k. The second master stage 310 includes the ninth PMOS transistor 310a, the tenth PMOS transistor 310b, the eleventh PMOS transistor 310c, the twelfth PMOS transistor 310d, the thirteenth PMOS transistor 310e, the twenty-first PMOS transistor 502a, the ninth NMOS transistor 310f, the tenth NMOS transistor 310g, the eleventh NMOS transistor 310h, the twelfth NMOS transistor 310i, the thirteenth NMOS transistor 310j, and the twenty-first NMOS transistor 502b for outputting the previously stored data Db. The configurations of the transistors of the second master stage 310 and their intended functions are described in FIG. 5B, and repeated descriptions thereof are omitted for conciseness.

The master-slave stage 312 receives the previously stored data/feedback data Db from the second master stage 310, and the clock signal CK, and outputs the master feedback signal Mfb. The master-slave stage 312 includes the fourteenth PMOS transistor 312a, the fifteenth PMOS transistor 312b, the fourteenth NMOS transistors 312c, and the fifteenth NMOS transistor 312d for outputting the master feedback signal Mfb. The components of the master-slave stage 312 and its associated connections are described in FIGS. 3B and 5B, and repeated descriptions thereof are omitted for conciseness.

Figure 9C:
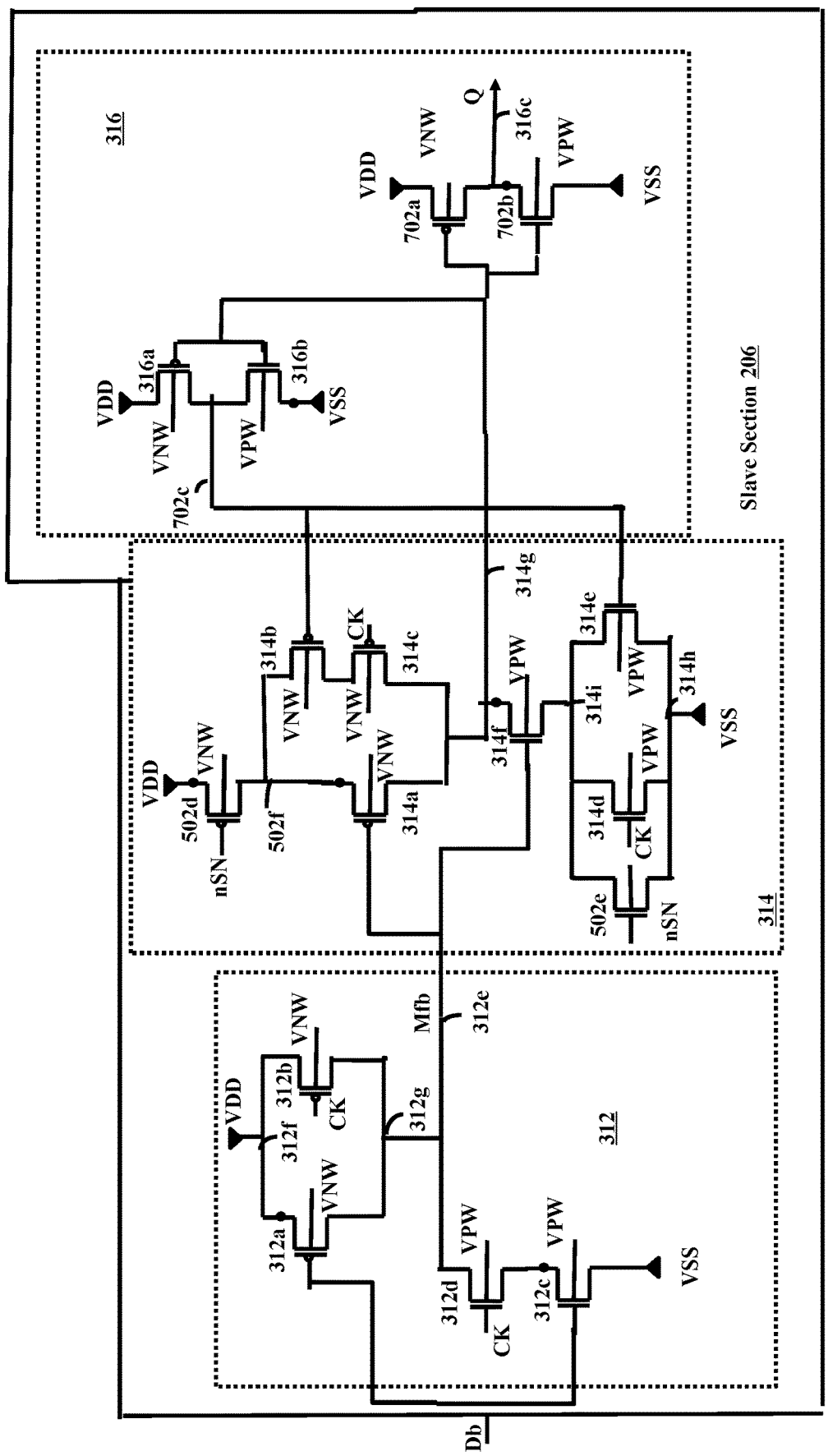
FIG. 9C is a circuit diagram depicting a slave section of the flip-flop including the set functionality and the unbarred output, according to various embodiments.

As depicted in FIGS. 9A and 9C, the slave section 206 includes the master-slave stage 312, the OAI gate 314, and the slave output stage 316.

The OAI gate 314 receives the master feedback signal Mfb from the master-slave stage 312, the inverted set control signal nSN and provides the output corresponding to 0 or 1 on the OAI gate output node 314g. The OAI gate 314 includes the sixteenth PMOS transistor 314a, the seventeenth PMOS transistor 314b, the eighteenth PMOS transistor 314c, the twenty-second PMOS transistor 502d, the sixteenth NMOS transistor 314d, the seventeenth NMOS transistor 314e, the eighteenth NMOS transistor 314f, and the twenty-second NMOS transistor 502e for providing the output 0 or 1. The sixteenth PMOS transistor 314a may be connected to the tenth conjunction node 502f, the master feedback signal Mfb, and the OAI gate output node 314g. The seventeenth PMOS transistor 314b may be connected to the tenth conjunction node 502f, the first output node 702 of the slave output stage 316, and the eighteenth PMOS transistor 314c. The eighteenth PMOS transistor 314c may be connected to the clock signal, and the OAI gate output node 314g. The twenty-second PMOS transistor 502d may be connected to the VDD voltage, the inverted set control signal nSN, and the tenth conjunction node 502f. The sixteenth PMOS transistor 314a includes the source connected to the tenth conjunction node 502f, the gate connected to the master feedback signal Mfb, and the drain connected to the OAI gate output node 314g. The seventeenth PMOS transistor 314b includes the source connected to the tenth conjunction node 502f, the gate connected to the first output node 702c of the slave output stage 316, and the drain connected to the source of the eighteenth PMOS transistor 314c. The eighteenth PMOS transistor 314c includes the gate connected to the clock signal CK, and the drain connected to the OAI gate output node 314g. The twenty-second PMOS transistor 502d includes the source connected to the VDD voltage, the gate connected to the inverted set control signal nSN, and the drain connected to the tenth conjunction node 502f.

The sixteenth NMOS transistor 314d may be connected to the sixth conjunction node 314h, the clock signal CK, and the seventh conjunction node 314i. The sixth conjunction node 314h may be connected to the VSS voltage. The seventeenth NMOS transistor 314e may be connected to the sixth conjunction node 314h, the first output node 702c of the slave output stage 316, and the seventh conjunction node 314i. The eighteenth NMOS transistor 314f may be connected to the seventh conjunction node 314i, the master feedback signal Mfb, and the OAI gate output node 314g. The twenty-second NMOS transistor 502e may be connected to the sixth conjunction node 314h, the inverted set control signal nSN, and the seventh conjunction node 314i.

The sixteenth NMOS transistor 314*d* includes the source connected to the sixth conjunction node 314*h*, the gate connected to the clock signal CK, and the drain connected to the seventh conjunction node 314*i*. The seventeenth NMOS transistor 314*e* includes the source connected to the sixth conjunction node 314*h*, the gate connected to the first output node 702*c* of the slave output stage 316, and the drain connected to the seventh conjunction node 314*i*. The eighteenth NMOS transistor 314*f* includes the source connected to the seventh conjunction node 314*i*, the gate connected to the master feedback signal Mfb, and the drain connected to the OAI gate output node 314*g*. The twenty-second NMOS transistor may include the source connected to the sixth conjunction node 314*h*, the gate connected to the inverted set control signal nSN, and the drain connected to the seventh conjunction node 314*i*.

The slave output stage 316 receives the output of the OAI gate 314 from the OAI gate output node 314*g*, and outputs the unbarred output Q on the output node 316*c*. The slave output stage 316 includes the nineteenth PMOS transistor 316*a*, the nineteenth NMOS transistor 316*b*, the twenty-fourth PMOS transistor 702*a*, and the twenty-fourth NMOS transistor 702*b* for outputting the unbarred output Q on the output node 316*c*. The configurations of the transistors of the slave output stage 316, and their intended functions are described in FIG. 7A, and repeated descriptions thereof are omitted for conciseness.

In an embodiment, for enabling the flip-flop 200 to perform the set operation, the set control signal SN=0 (logic low level) may be applied to the peripheral circuit 504, which outputs the inverted set control signal nSN=1. The inverted set control signal nSN=1 may be applied to the gate of the twenty-first PMOS transistor 502*a* and the gate of the twenty-first NMOS transistor 502*b* of the second master stage 310, which outputs the previously stored data Db as Db=0. The master-slave stage 312 of the master section 204 receives Db=0, and outputs the master feedback signal Mfb as Mfb=1. The master feedback signal Mfb=1 may be provided to the OAI gate 314. Also, the inverted set control signal nSN=1 may be applied to the gate of the twenty-second PMOS transistor 502*d* and the gate of the twenty-second NMOS transistor 502*d* of the second master stage 310. The OAI gate 314 provides the output as 0. The slave output stage 316 of the slave section 206 receives the output of the OAI gate (i.e. 0) and provides the unbarred output Q as Q=1. Thus, performing the set operation.

Figure 10A:
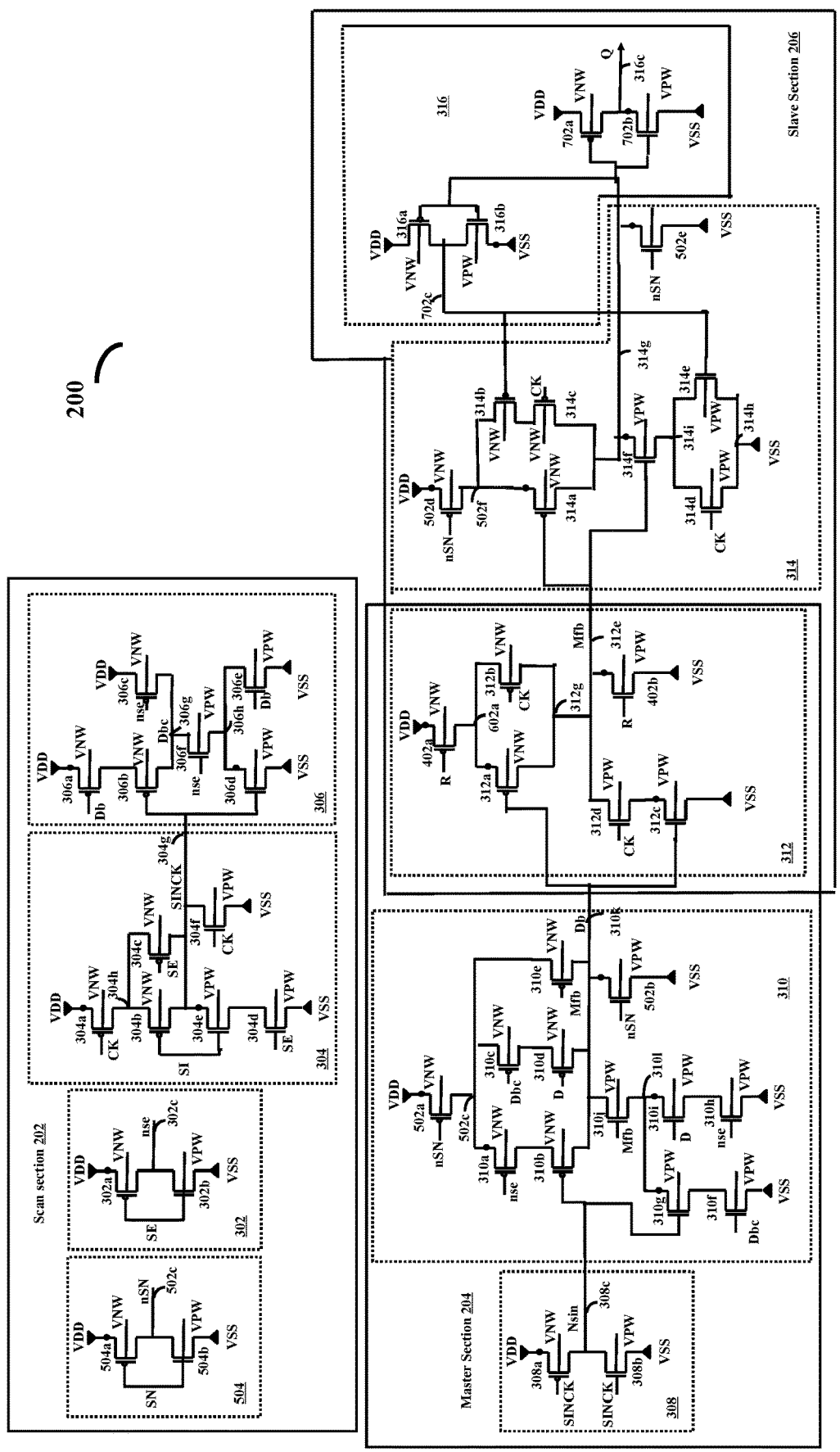
FIG. 10A is a circuit diagram depicting a flip-flop including the unbarred output and the set-reset functionality, according to various embodiments.

FIG. 10A is a circuit diagram depicting the flip-flop 200 including the unbarred output and the set-reset functionality with set priority, according to various embodiments.

The flip-flop 200 with the unbarred output to perform the set operation or reset operation includes the scan section 202, the master section 204, and the slave section 206. The scan section 202 includes the peripheral section 504, the first scan stage 302, the second scan stage 304, and the third scan stage 306. The peripheral section 504 receives the set control signal SN, and outputs the inverted set control signal nSN on the peripheral output node 504*c*. The configurations of the transistors of the peripheral section 504, and their intended functions are depicted in FIG. 5B, and repeated descriptions thereof are omitted for conciseness.

The first scan stage 302 receives the scan enable signal SE, and outputs the inverted scan enable signal nse on the first scan-stage-output node 302*c*. The first scan stage 302 includes the first PMOS transistor 302*a*, and the first NMOS transistor 302*b* for outputting the inverted scan enable signal nse. The second scan stage 304 receives the scan enable signal SE, the scan input signal SI, and the clock signal CK, and outputs the internal signal SINCK on the second scan-stage output node 304*g*. The second scan stage 304 includes the second PMOS transistor 304*a*, the third PMOS transistor 304*b*, the fourth PMOS transistor 304*c*, the second NMOS transistor 304*d*, the third NMOS transistor 304*e*, and the fourth NMOS transistor 304*f* for outputting the internal signal SINCK. The third scan stage 306 receives the internal signal SINCK, the feedback data Db, and the nse, and outputs the inverted feedback data Dbc on the third scan-stage output node 306*g*, which may be provided to the master section 204. The third scan stage 306 includes the fifth PMOS transistor 306*a*, the sixth PMOS transistor 306*b*, the seventh PMOS transistor 306*c*, the fifth NMOS transistor 306*d*, the sixth NMOS transistor 306*e*, and the seventh NMOS transistor 306*f* for outputting the inverted feedback data Dbc. The third scan stage 306 includes the fifth PMOS transistor 306*a*, the sixth PMOS transistor 306*b*, the seventh PMOS transistor 306*c*, the fifth NMOS transistor 306*d*, the sixth NMOS transistor 306*e*, and the seventh NMOS transistor 306*f* for outputting the inverted feedback data Dbc. The configurations of the transistors of the first scan stage 302, the second scan stage 304, and the third scan stage 306, and their intended functions are depicted in FIGS. 3B, 3C, and 5B, and repeated descriptions thereof are omitted for conciseness.

Figure 10B:
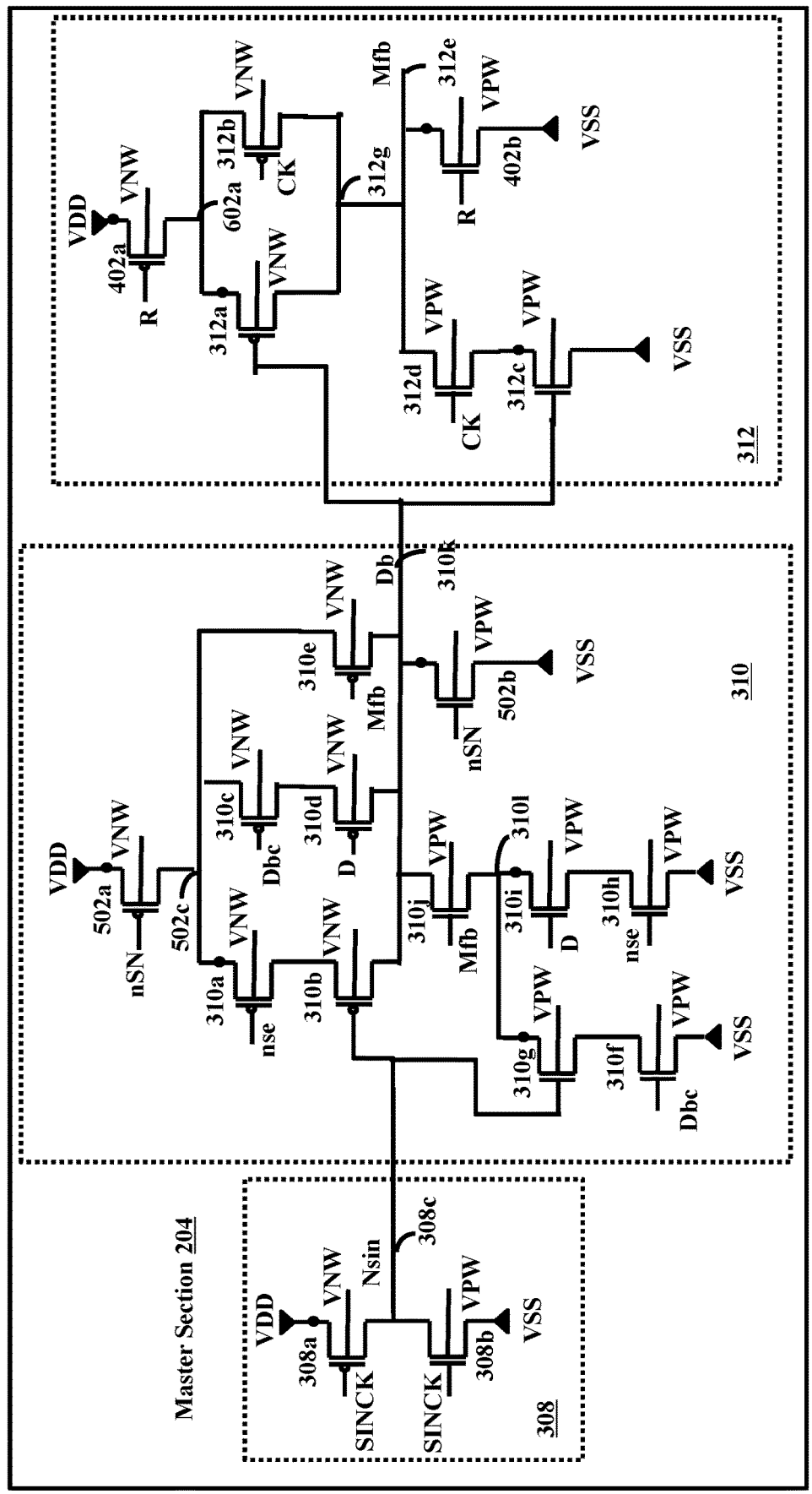
FIG. 10B is a circuit diagram depicting a master section of the flip-flop including the unbarred output and the set-reset functionality, according to various embodiments.

As depicted in FIGS. 10A and 10B, the master section 204 includes the first master stage 308, the second master stage 310, and the master-slave stage 312. The first master stage 308 receives the internal signal SINCK, and outputs the inverted signal Nsin on the first master-stage output node 308*c*. The first master stage 308 includes the eighth PMOS transistor 308*a*, and the eighth NMOS transistor 308*b* for outputting the inverted signal Nsin.

The second master stage 310 receives Nsin, the inverted scan enable signal nse, the data input D, the inverted feedback data Dbc, the master feedback signal Mfb, and the inverted set control signal nSN and outputs the previously stored data/feedback data Db on the second master-stage output node 310*k*. The second master stage 310 includes the ninth PMOS transistor 310*a*, the tenth PMOS transistor 310*b*, the eleventh PMOS transistor 310*c*, the twelfth PMOS transistor 310*d*, the thirteenth PMOS transistor 310*e*, the twenty-first PMOS transistor 502*a*, the ninth NMOS transistor 310*f*, the tenth NMOS transistor 310*g*, the eleventh NMOS transistor 310*h*, the twelfth NMOS transistor 310*i*, the thirteenth NMOS transistor 310*j*, and the twenty-first NMOS transistor 502*b* for outputting the previously stored data Db. The configurations of the transistors of the second master stage 310 and their intended functions are described in FIG. 5B, and repeated descriptions thereof are omitted for conciseness.

The master-slave stage 312 receives the feedback data/ previously stored data Db, the clock signal CK, and the reset control signal R, and outputs the master feedback signal Mfb on the common master-slave stage output node 312*e*. The master-slave stage 312 includes the fourteenth PMOS transistor 312*a*, the fifteenth PMOS transistor 312*b*, the fourteenth NMOS transistors 312*c*, the fifteenth NMOS transistor 312*d*, the twentieth PMOS transistor 402*a*, and the twentieth NMOS transistor 402*b*. The fourteenth PMOS transistor 312*a* may be connected to the eleventh conjunction node 602*a*, the previously stored data Db, and the fifth conjunction node 312*g*. The fifteenth PMOS transistor 312*b* may be connected to the eleventh conjunction node 602*a*, the clock signal CK, and the fifth conjunction node 312*g*. The twentieth PMOS transistor 402*a* may be connected to the VDD voltage, the reset control signal R, and the eleventh conjunction node 602a. The fourteenth NMOS transistor 312c may be connected to the VSS voltage, the previously stored data Db, and the fifteenth NMOS transistor 312d. The fifteenth NMOS transistor 312d may be connected to the clock signal, and the common master-slave stage output node 312e. The twentieth NMOS transistor 402b may be connected to the VSS voltage, the reset control signal, and the common master-slave stage output node 312e. The configurations of the transistors of the master-slave stage 312 and their intended functions are described in FIG. 6, and repeated descriptions thereof are omitted for conciseness.

Figure 10C:
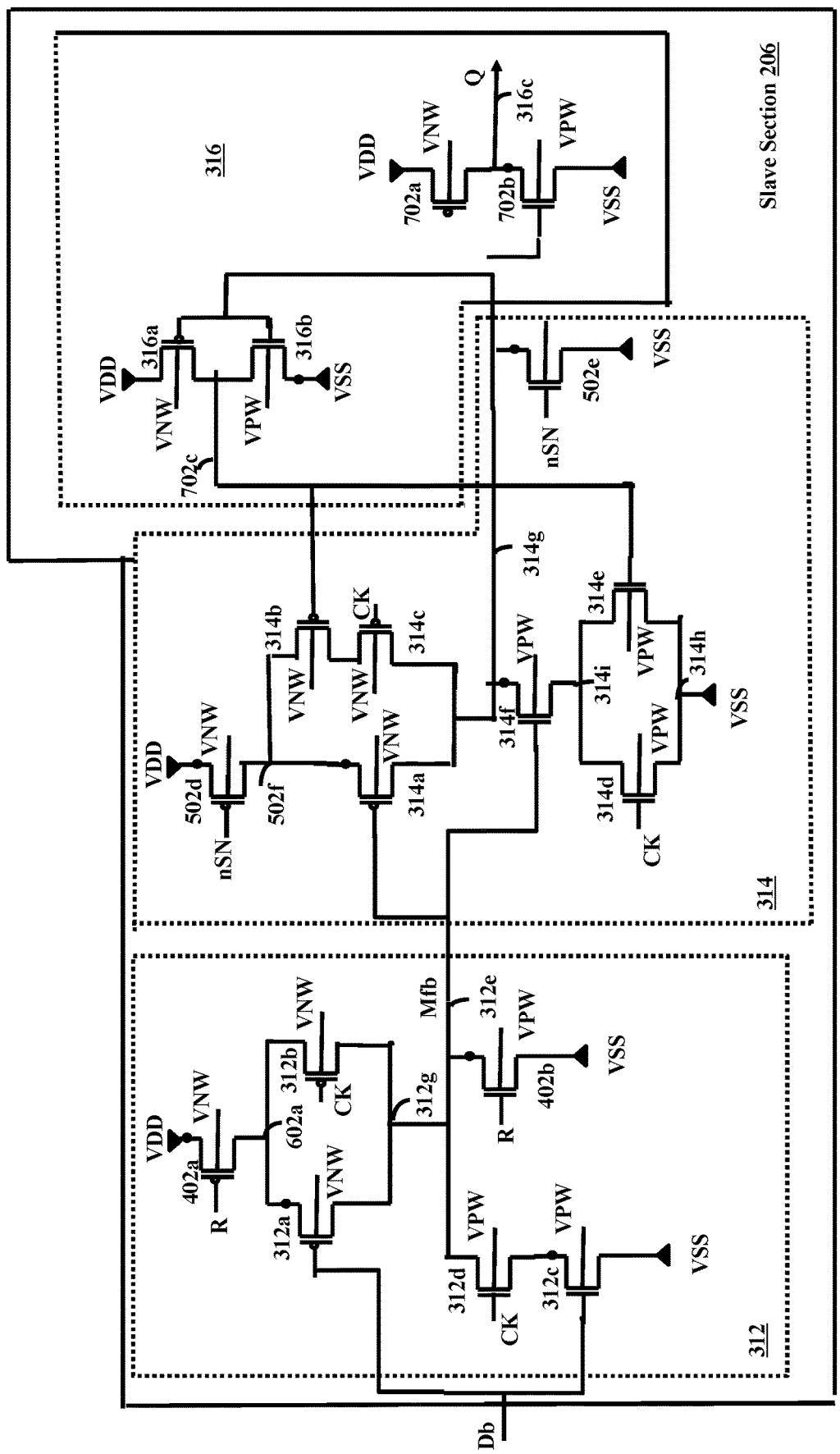
FIG. 10C is a circuit diagram depicting a slave section of the flip-flop including the unbarred output and the set-reset functionality, according to various embodiments.

As depicted in FIGS. 10A and 10C, the slave section 206 includes the OAI gate 314, and the slave output stage 316. The OAI gate 314 receives the master feedback signal Mfb from the master-slave stage 312, the clock signal CK, and the inverted set control signal nSN and provides the output corresponding to 0 or 1. The OAI gate 314 includes the sixteenth PMOS transistor 314a, the seventeenth PMOS transistor 314b, the eighteenth PMOS transistor 314c, the twenty-second PMOS transistor 502d, the sixteenth NMOS transistor 314d, the seventeenth NMOS transistor 314e, the eighteenth NMOS transistor 314f, and the twenty-second NMOS transistor 502e for providing the output 0 or 1. The sixteenth PMOS transistor 314a may be connected to the tenth conjunction node 502f, the master feedback signal Mfb, and the OAI gate output node 314g. The seventeenth PMOS transistor 314b may be connected to the tenth conjunction node 502f, the first output node 702c of the slave output stage 316, and the eighteenth PMOS transistor 314c. The eighteenth PMOS transistor 314c may be connected to the clock signal, and the OAI gate output node 314g. The twenty-second NMOS transistor 502e may be connected to the VDD voltage, the inverted set control signal nSN, and the tenth conjunction node 502f. The sixteenth PMOS transistor 314a includes the source connected to the tenth conjunction node 502f, the gate connected to the master feedback signal Mfb, and the drain connected to the OAI gate output node 314g. The seventeenth PMOS transistor 314b includes the source connected to the tenth conjunction node 502f, the gate connected to the first output node 702c of the slave output stage 316, and the drain connected to the source of the eighteenth PMOS transistor 314c. The eighteenth PMOS transistor 314c includes the gate connected to the clock signal CK, and the drain connected to the OAI gate output node 314g.

The sixteenth NMOS transistor 314d may be connected to the sixth conjunction node 314h, the clock signal CK, and the seventh conjunction node 314i. The sixth conjunction node 314h may be connected to the VSS voltage. The seventeenth NMOS transistor 314e may be connected to the sixth conjunction node 314h, the first output node 702c of the slave output stage 316, and the seventh conjunction node 314i. The eighteenth NMOS transistor 314f may be connected to the seventh conjunction node 314i, the master feedback signal Mfb, and the OAI gate output node 314g. The twenty-second NMOS transistor 502e may be connected to the VSS voltage, the inverted set control signal nSN, and the OAI gate output node 314g. The sixteenth NMOS transistor 314d includes the source connected to the seventh conjunction node 314i, the gate connected to the clock signal CK, and the drain connected to the sixth conjunction node 314h. The seventeenth NMOS transistor 314e includes the source connected to the seventh conjunction node 314i, the gate connected to the first output node 702c of the slave output stage 316, and the drain connected to the sixth conjunction node 314h. The eighteenth NMOS transistor 314f includes the source connected to the sixth conjunction node 314h, the gate connected to the master feedback signal Mfb, and the drain connected to the OAI gate output node 314g. The twenty-second NMOS transistor 502e includes the source connected to the VSS voltage, the gate connected to nSN, and the drain connected to the OAI gate output node 314g.

The slave output stage 316 receives the output of the OAI gate 314 from the OAI gate output node 314g, and outputs the unbarred output Q on the output node 316c. The slave output stage 316 includes the nineteenth PMOS transistor 316a, the nineteenth NMOS transistor N19 316b, the twenty-fourth PMOS transistor 702a, and the twenty-fourth NMOS transistor 702b for outputting the unbarred output Q on the output node 316c. The configurations of the transistors of the slave output stage 316, and their intended functions are described in FIG. 7A, and repeated descriptions thereof are omitted for conciseness.

In an embodiment, for enabling the flip-flop 200 with the unbarred output Q to perform the set operation with the set priority, the set control signal SN=0 (logic low level) may be applied to the peripheral circuit 504, which outputs the inverted set control signal nSN=1. The inverted set control signal nSN=1 may be applied to the gate of the twenty-first PMOS transistor 502a and the gate of the twenty-first NMOS transistor 502b of the second master stage 310, which outputs the previously stored data Db as Db=0. Db=0 may be provided to the master-slave stage 312. Further, the reset control signal R=0 may be applied to the gate of the twentieth PMOS transistor 402a and the gate of the twentieth NMOS transistor 402b of the master-slave stage 312. The master-slave stage 312 outputs the master feedback signal Mfb as Mfb=1, since Db=0, and R=0. The master feedback signal Mfb=1 may be provided to the OAI gate 314. Also, the inverted set control signal nSN=1 may be applied to the gate of the twenty-second PMOS transistor 502d and the gate of the twenty-second NMOS transistor 502d of the OAI gate 314. The OAI gate 314 provides the output as 0. The slave output stage 316 of the slave section 206 receives the output of the OAI gate (i.e. 0) and provides the output Q as Q=1. Thus, performing the set operation.

In an embodiment, for enabling the flip-flop 200 with the unbarred output to perform the reset operation with the set priority, the set control signal SN=1 (logic high level) may be applied to the peripheral circuit 504, which outputs the inverted set control signal nSN=0. The inverted set control signal nSN=0 may be applied to the gate of the twenty-first PMOS transistor 502a and the gate of the twenty-first NMOS transistor 502b of the second master stage 310, which outputs the previously stored data Db as Db=1. Db=1 may be provided to the master-slave stage 312. Further, the reset control signal R=1 may be applied to the gate of the twentieth PMOS transistor 402a and the gate of the twentieth NMOS transistor 402b of the master-slave stage 312. The master-slave stage 312 outputs the master feedback signal Mfb as Mfb=0, since Db=1, and R=1. The master feedback signal Mfb=0 may be provided to the OAI gate 314. Also, the inverted set control signal nSN=0 may be applied to the gate of the twenty-second PMOS transistor 502d and the gate of the twenty-second NMOS transistor 502d of the OAI gate 314. The OAI gate 314 provides the output as 1. The slave output stage 316 of the slave section 206 receives the output of the OAI gate (i.e. 1) and provides the output Q as Q=0. Thus, performing the reset operation.

In an embodiment, for enabling the flip-flop 200 with the unbarred output to perform the set operation with the set priority, the set control signal SN=0 (logic low level) may be applied to the peripheral circuit 504, which outputs the inverted set control signal nSN=1. The inverted set control signal nSN=1 may be applied to the gate of the twenty-first PMOS transistor 502a and the gate of the twenty-first NMOS transistor 502b of the second master stage 310, which outputs the previously stored data Db as Db=0. Db=0 may be provided to the master-slave stage 312. Further, the reset control signal R=1 may be applied to the gate of the twentieth PMOS transistor 402a and the gate of the twentieth NMOS transistor 402b of the master-slave stage 312. The master-slave stage 312 outputs the internal signal master feedback signal Mfb as Mfb=0, since Db=0, and R=1. The master feedback signal Mfb=0 may be provided to the OAI gate 314. Also, the inverted set control signal nSN=1 may be applied to the gate of the twenty-second PMOS transistor 502d and the gate of the twenty-second NMOS transistor 502d of the OAI gate 314. The OAI gate 314 provides the output as 0 due to nSN. The slave output stage 316 of the slave section 206 receives the output of the OAI gate (i.e. 0) and provides the output Q as Q=1. Thus, performing the set operation.

Figure 11A:
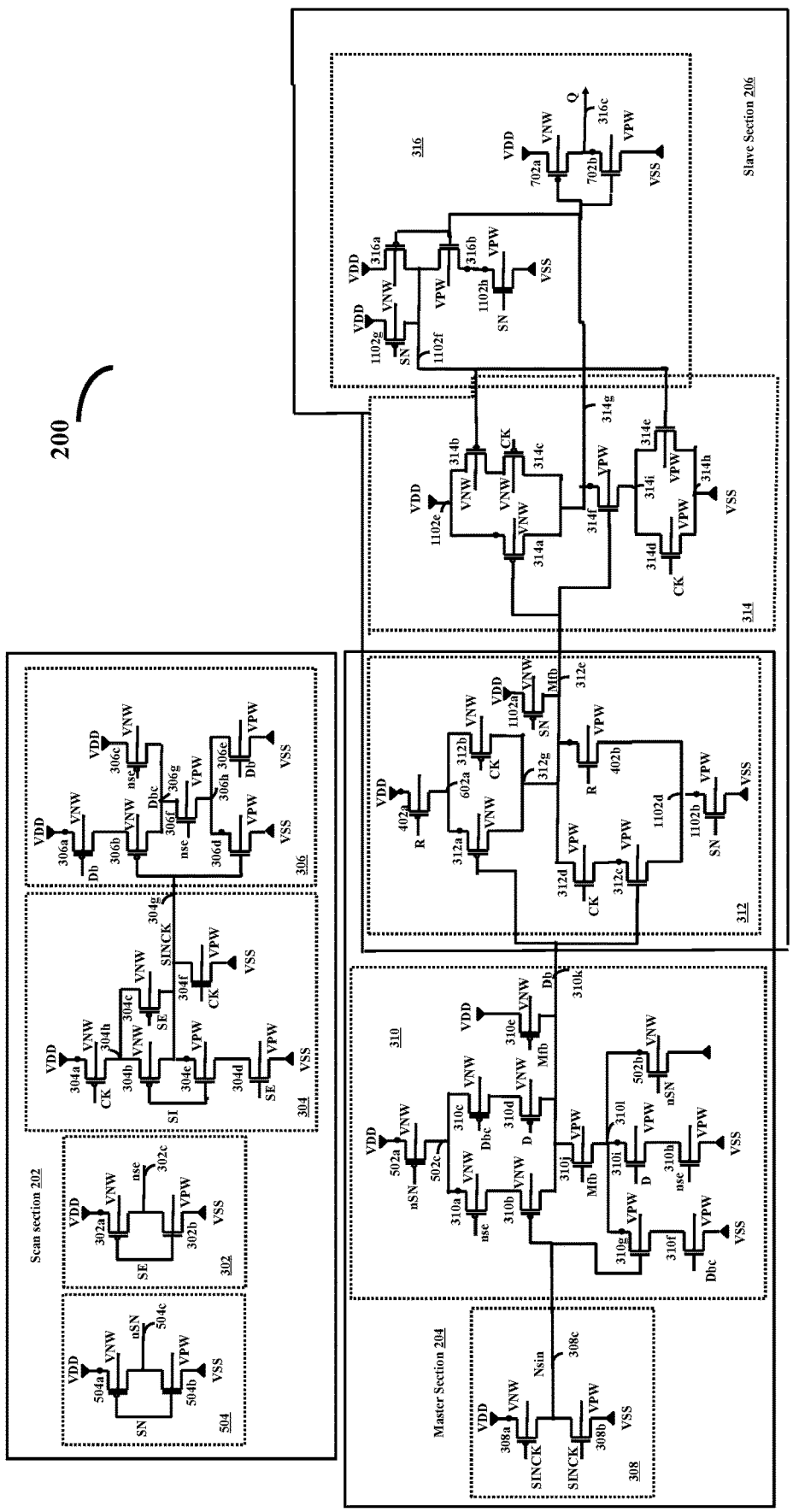
FIG. 11A is another circuit diagram depicting a flip-flop including the unbarred output, and the set-reset functionality, according to various embodiments.

FIG. 11A is another circuit diagram depicting the flip-flop 200 including the unbarred output and the set-reset functionality with the set priority, according to various embodiments.

The flip-flop 200 with the unbarred output to perform the set or reset operations with the set priority includes the scan section 202, the master section 204, and the slave section 206. The scan section 202 includes the peripheral section 504, the first scan stage 302, the second scan stage 304, and the third scan stage 306.

The peripheral section 504 receives the set control signal SN, and outputs the inverted set control signal nSN on the peripheral output node 504c. The configurations of the transistors of the peripheral section 504, and their intended functions are depicted in FIG. 5B, and repeated descriptions thereof are omitted for conciseness. The first scan stage 302 receives the scan enable signal SE, and outputs the inverted scan enable signal nse on the first scan-stage-output node 302c. The first scan stage 302 includes the first PMOS transistor 302a, and the first NMOS transistor 302b for outputting the inverted scan enable signal nse. The second scan stage 304 receives the scan enable signal SE, the scan input signal SI, and the clock signal CK, and outputs the internal signal SINCK on the second scan-stage output node 304g. The second scan stage 304 includes the second PMOS transistor 304a, the third PMOS transistor 304b, the fourth PMOS transistor 304c, the second NMOS transistor 304d, the third NMOS transistor 304e, and the fourth NMOS transistor 304f for outputting the internal signal SINCK. The third scan stage 306 receives the internal signal SINCK, the feedback data Db, and the nse, and outputs the inverted feedback data Dbc on the third scan-stage output node 306g, which may be provided to the master section 204. The third scan stage 306 includes the fifth PMOS transistor 306a, the sixth PMOS transistor 306b, the seventh PMOS transistor 306c, the fifth NMOS transistor 306d, the sixth NMOS transistor 306e, and the seventh NMOS transistor 306f for outputting the inverted feedback data Dbc. The configurations of the transistors of the first scan stage 302, the second scan stage 304, and the third scan stage 306, and their intended functions are depicted in FIGS. 3B, 3C, and 5B, and repeated descriptions thereof are omitted for conciseness.

Figure 11B:
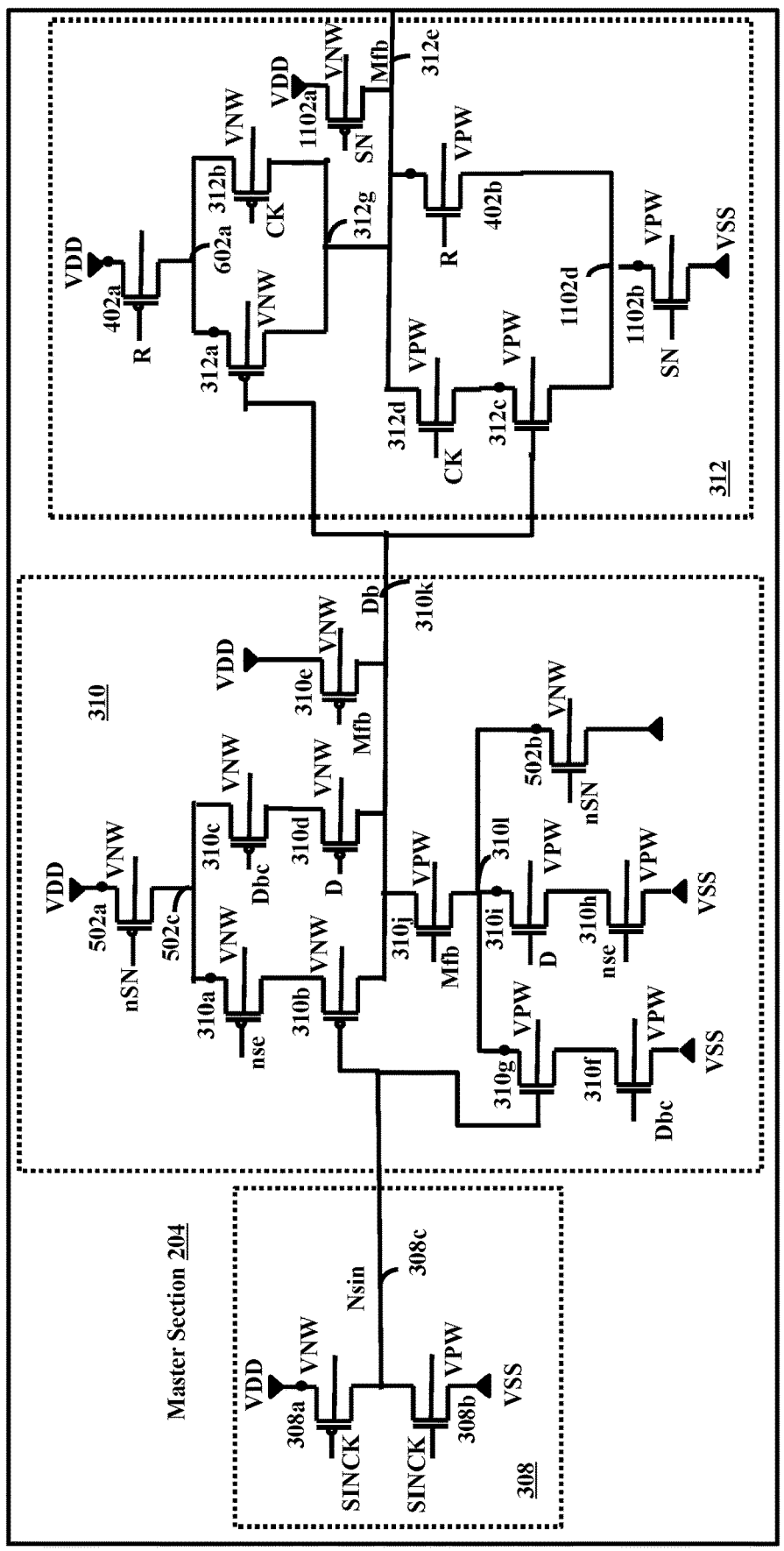
FIG. 11B is another circuit diagram depicting a master section of the flip-flop including the unbarred output and the set-reset functionality, according to various embodiments.

As depicted in FIGS. 11A and 11B, the master section 204 includes the first master stage 308, the second master stage 310, and the master-slave stage 312. The first master stage 308 receives the internal signal SINCK from the second scan-stage output node 304g of the scan section 202 and outputs the inverted signal Nsin on a first master-stage output node 308c. The first master stage 308c includes the eighth PMOS transistor 308a, and the eighth NMOS transistor 308b for outputting the inverted signal Nsin. The configurations of the transistors of the first master stage 308 and their intended functions are depicted in FIGS. 3B, 3C, and 5B, and repeated descriptions thereof are omitted for conciseness.

The second master stage 310 receives Nsin, the inverted scan enable signal nse, the data input D, the inverted feedback data Dbc, the master feedback signal Mfb, and the inverted set control signal nSN and outputs the previously stored data/feedback data Db on the second master-stage output node 310k. The second master stage 310 includes the ninth PMOS transistor 310a, the tenth PMOS transistor 310b, the eleventh PMOS transistor 310c, the twelfth PMOS transistor 310d, the thirteenth PMOS transistor 310e, and the twenty-first PMOS transistor 502a. The second master stage 310 also includes the ninth NMOS transistor 310f, the tenth NMOS transistor 310g, the eleventh NMOS transistor 310h, the twelfth NMOS transistor 310i, the thirteenth NMOS transistor 310j, and the twenty-first NMOS transistor 502b.

The ninth PMOS transistor 310a may be connected to the ninth conjunction node 502c, the inverted scan enable signal nse, and the tenth PMOS transistor 310b. The tenth PMOS transistor 310b may be connected to Nsin, and the second master-stage output node 310k. The eleventh PMOS transistor 310c may be connected to the ninth conjunction node 502c, the inverted feedback data Dbc, and the twelfth PMOS transistor 310d. The twelfth PMOS transistor 310d may be connected to the data input D, and the second master-stage output node 310k. The thirteenth PMOS transistor 310e may be connected to the VDD voltage, the master feedback signal Mfb, and the second master-stage output node 310k. The twenty-first PMOS transistor 502a may be connected to the ninth conjunction node 502c, the inverted set control signal nSN, and the VDD voltage. The ninth PMOS transistor 310a includes the source connected to the ninth conjunction node 502c, the gate connected to the inverted scan enable signal nse, and the drain connected to the source of the tenth PMOS transistor 310b. The tenth PMOS transistor 310b includes the gate connected to Nsin, and the drain connected to the second master-stage output node 310k. The eleventh PMOS transistor 310c includes the gate connected to the inverted feedback data Dbc, and the drain connected to the source of the twelfth PMOS transistor 310d. The twelfth PMOS transistor 310d includes the gate connected to the data input D, and the drain connected to the second master-stage output node 310k. The thirteenth PMOS transistor 310e includes the source connected to the VDD voltage, the gate connected to the master feedback signal Mfb, and the drain connected to the second master-stage output node 310k. The twenty-first PMOS transistor 502a includes the source connected to the VDD voltage, the gate connected to the inverted set control signal nSN, and the drain connected to the ninth conjunction node 502c.

The ninth NMOS transistor 310f may be connected to the VSS voltage, the inverted feedback data Dbc, and the tenth NMOS transistor 310g. The tenth NMOS transistor 310g may be connected to Nsin, and the third conjunction node 310l. The eleventh NMOS transistor 310h may be connected to the VSS voltage, the inverted scan enable signal nse, and the twelfth NMOS transistor 310i. The twelfth NMOS transistor 310i may be connected to the data input D, and the third conjunction node 310l. The thirteenth NMOS transistor 310j may be connected to the third conjunction node 310l, the master feedback signal Mfb, and the second master-stage output node 310k. The twenty-first NMOS transistor 502b may be connected to the VSS voltage, the inverted set control signal nSN, and the third conjunction node 310l. The ninth NMOS transistor 310f includes the source connected to the VSS voltage, the gate connected to the inverted feedback data Dbc, and the drain connected to the source of the tenth NMOS transistor 310g. The tenth NMOS transistor 310g includes the gate connected to Nsin, and the drain connected to the third conjunction node 310l. The eleventh NMOS transistor 310h includes the source connected to the VSS voltage, the gate connected to the inverted scan enable signal nse, and the drain connected to the source of the twelfth NMOS transistor 310i. The twelfth NMOS transistor 310i includes the gate connected to the data input D, and the drain connected to the third conjunction node 310l. The thirteenth PMOS transistor 310e includes the source connected to the third conjunction node 310l, the gate connected to the master feedback signal Mfb, and the drain connected to the second master-stage output node 310k. The twenty-first NMOS transistor 502b includes the source connected to the VSS voltage, the gate connected to the inverted set control signal nSN, and the drain connected to the third conjunction node 310l.

The master-slave stage 312 receives the feedback data/previously stored data Db, the clock signal CK, the reset control signal R, the set control signal SN, and outputs the master feedback signal Mfb on the common master-slave stage output node 312e. In an embodiment, if R=0 and SN=1, the master-slave stage 312 operates as similar to the master-slave stage 312 in the flip-flop 200 (as depicted in FIGS. 3A, 3B, and 3D). If R=0, and SN=1, the master-slave stage 312 outputs the master feedback signal Mfb as Mfb=0. If R=0/1 and SN=0, the master-slave stage 312 outputs the master feedback signal Mfb as Mfb=1. The master-slave stage 312 includes the fourteenth PMOS transistor 312a, the fifteenth PMOS transistor 312b, the fourteenth NMOS transistors 312c, the fifteenth NMOS transistor 312d, the twentieth PMOS transistor 402a, the twentieth NMOS transistor 402b, a twenty-fifth PMOS transistor 1102a, and a twenty-fifth NMOS transistor 1102b. The fourteenth PMOS transistor 312a may be connected to the eleventh conjunction node 602a, the feedback data Db, and the fifth conjunction node 312g. The fifteenth PMOS transistor 312b may be connected to the eleventh conjunction node 602a, the clock signal CK, and the fifth conjunction node 312g. The fifth conjunction node 312g may be connected to the common master-slave stage node 312e. The twentieth PMOS transistor 402a may be connected to the VDD voltage, the reset control signal R, and the eleventh conjunction node 602a. The twenty-fifth PMOS transistor 1002a may be connected to the VDD voltage, the set control signal SN, and the common master-slave stage output node 312e. The fourteenth PMOS transistor 312a includes the source connected to the eleventh conjunction node 602a, the gate connected to the feedback data Db, and the drain connected to the fifth conjunction node 312g. The fifteenth PMOS transistor 312b includes the source connected to the eleventh conjunction node 602a, the gate connected to the clock signal CK, and the drain connected to the fifth conjunction node 312g. The twentieth PMOS transistor 402a includes the source connected to the VDD voltage, the gate connected to the reset control signal R, and the drain connected to the eleventh conjunction node 602a. The twenty-fifth PMOS transistor 1102a includes a source connected to the VDD voltage, a gate connected to the set control signal SN, and a drain connected to the common master-slave stage output node 312e.

The fourteenth NMOS transistor 312c may be connected to a twelfth conjunction node 1102d, the feedback data Db, and the fifteenth NMOS transistor 312d. The fifteenth NMOS transistor 312d may be connected to the clock signal, and the common master-slave stage output node 312e. The twentieth NMOS transistor 402b may be connected to the twelfth conjunction node 1102d, the reset control signal R, and the common master-slave stage output node 312e. The twenty-fifth NMOS transistor 1102b may be connected to the VSS voltage, the set control signal SN, and the twelfth conjunction node 1102d. The fourteenth NMOS transistor 312c includes the source connected to the twelfth conjunction node 1102d, the gate connected to the feedback data Db, and the drain connected to the source of the fifteenth NMOS transistor 312d. The fifteenth NMOS transistor 312d includes the gate connected to the clock signal CK, and the drain connected to the common master-slave stage output node 312e. The twentieth NMOS transistor 402b includes the source connected to the twelfth conjunction node 1102d, the gate connected to the reset control signal R, and the drain connected to the common master-slave stage output node 312e. The twenty-fifth NMOS transistor 1102b includes a source connected to the VSS voltage, a gate connected to the set control signal SN, and the drain connected to the twelfth conjunction node 1102d.

Figure 11C:
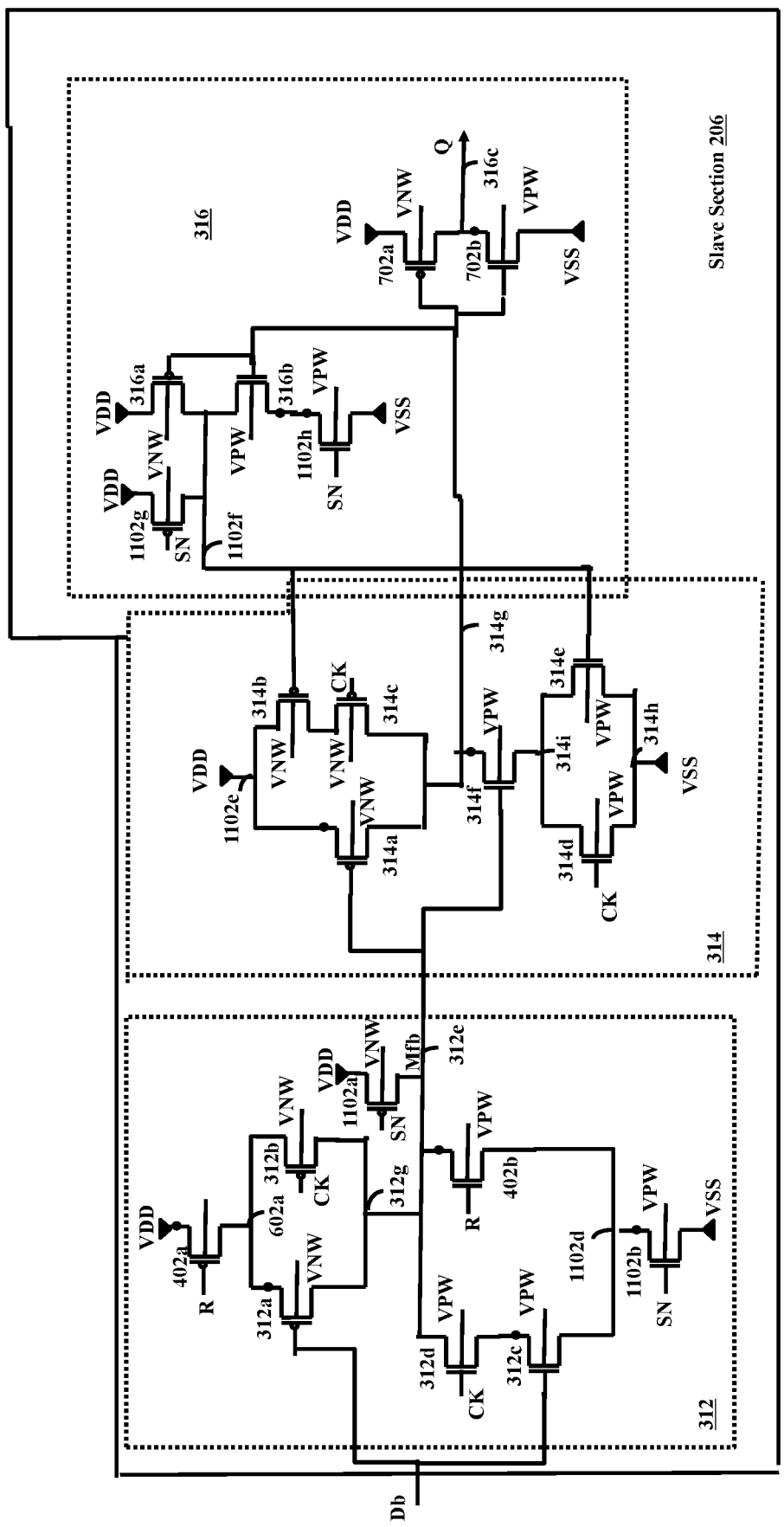
FIG. 11C is another circuit diagram depicting a slave section of the flip-flop including the unbarred output and the set-reset functionality, according to various embodiments.

As depicted in FIGS. 11A and 11C, the OAI gate 314 receives the master feedback signal Mfb from the master-slave stage 312, the clock signal CK, data present on a FQ output node 1102f of the slave output stage 316, and the inverted set control signal nSN and provides the output corresponding to 0 or 1 on the OAI gate output node 314g. The OAI gate 314 includes the sixteenth PMOS transistor 314a, the seventeenth PMOS transistor 314b, the eighteenth PMOS transistor 314c, the sixteenth NMOS transistor 314d, the seventeenth NMOS transistor 314e, and the eighteenth NMOS transistor 314f for providing the output 0 or 1. The sixteenth PMOS transistor 314a may be connected to a thirteenth conjunction node 1102e, the master feedback signal Mfb, and the OAI gate output node 314g. The thirteenth conjunction node 1102e may be connected to the VDD voltage. The seventeenth PMOS transistor 314b may be connected to the thirteenth conjunction node 1102e, the FQ output node 1102f, and the eighteenth PMOS transistor 314c. The eighteenth PMOS transistor 314c may be connected to the clock signal, and the OAI gate output node 314g. The sixteenth PMOS transistor 314a includes the source connected to the thirteenth conjunction node 1102e, the gate connected to the master feedback signal Mfb, and the drain connected to the OAI gate output node 314g. The seventeenth PMOS transistor 314b includes the source connected to the thirteenth conjunction node 1102e, the gate connected to the FQ output node 1102f of the slave output stage 316, and the drain connected to the source of the eighteenth PMOS transistor 314c. The eighteenth PMOS transistor 314c includes the gate connected to the clock signal CK, and the drain connected to the OAI gate output node 314g. The sixteenth NMOS transistor 314d may be connected to the sixth conjunction node 314h, the clock signal CK, and the seventh conjunction node 314i. The sixth conjunction node 314h may be connected to the VSS voltage. The seventeenth NMOS transistor 314e may be connected to the sixth conjunction node 314h, the FQ output node 1102f, and the seventh conjunction node 314i. The eighteenth NMOS transistor 314f may be connected to the OAI gate output node 314g, the master feedback signal Mfb, and the seventh conjunction node 314i. The sixteenth NMOS transistor 314d includes the source connected to the sixth conjunction node 314h, the gate connected to the clock signal CK, and the drain connected to the seventh conjunction node 314i. The seventeenth NMOS transistor 314e includes the source connected to the sixth conjunction node 314h, the gate connected to the FQ output node 1102f of the slave output stage 316, and the drain connected to the seventh conjunction node 314i. The eighteenth NMOS transistor 314f includes the source connected to the seventh conjunction node 314i, the gate connected to the master feedback signal Mfb, and the drain connected to the OAI gate output node 314g.

The slave output stage 316 receives the output of the OAI gate 314 from the OAI gate output node 314g, the set control signal SN and outputs the unbarred output Q on the output node 316c. In an embodiment, if SN=0, then the signal on the FQ output node 1102f=0, the output of the OAI gate on the OAI gate output node 314g=0, and the unbarred output Q=1. If SN=1, the slave output stage 316 performs normal functioning as depicted in FIG. 7A. The slave output stage 316 includes the nineteenth PMOS transistor 316a, the nineteenth NMOS transistor 316b, the twenty-fourth PMOS transistor 702a, the twenty-fourth NMOS transistor 702b, a twenty-sixth PMOS transistor 1102g, and a twenty-sixth NMOS transistor 1102h for outputting the unbarred output Q on the output node 316c. The twenty-sixth PMOS transistor 1102g may be connected to the VDD voltage, the set control signal SN, and the FQ output node 1102f. The nineteenth PMOS transistor 316a may be connected to the VDD voltage, the OAI gate output node 314g, and the FQ output node 1102f. The nineteenth NMOS transistor 316b may be connected to the FQ output node 1102f, the OAI gate output node 314g, and the twenty-sixth NMOS transistor 1102h. The twenty-sixth NMOS transistor 1102h may be connected to the VSS voltage, and the set control signal SN. The twenty-fourth PMOS transistor 702a may be connected to the VDD voltage, the OAI gate output node 314g, and the output node 316c. The twenty-fourth NMOS transistor 702b may be connected to the VSS voltage, the OAI gate output node 314g, and the output node 316c. The twenty-sixth PMOS transistor 1102g includes a source connected to the VDD voltage, a gate connected to the set control signal SN, and a drain connected to the FQ output node 1102f. The nineteenth PMOS transistor 316a includes the source connected to the VDD voltage, the gate connected to the OAI gate output node 314g, and the drain connected to the FQ output node 1102f. The nineteenth NMOS transistor 316b includes the source connected to a drain of the twenty-sixth NMOS transistor 1102h, the gate connected to the OAI gate output node 314g, and the drain connected to the FQ output node 1102f. The twenty-sixth NMOS transistor 1102h includes a source connected to the VSS voltage, and the gate connected to the set control signal SN. The twenty-fourth PMOS transistor 702a includes the source connected to the VDD voltage, the gate connected to the OAI gate output node 314g, and the drain connected to the output node 316c. The twenty-fourth NMOS transistor 702b includes the source connected to the VSS voltage, the gate connected to the OAI gate output node 314g, and the drain connected to the output node 316c.

In an embodiment, for enabling the flip-flop 200 with the unbarred output to perform the set operation with the set priority, the set control signal SN=0 (logic low level) may be applied to the peripheral circuit 504, which outputs the inverted set control signal nSN=1. The inverted set control signal nSN=1 may be applied to the gate of the twenty-first PMOS transistor 502a and the gate of the twenty-first NMOS transistor of the second master stage 310, which outputs the previously stored data Db as Db=0. Db=0 may be provided to the master-slave stage 312. Further, the reset control signal R=0 may be applied to the gate of the twentieth PMOS transistor 402a and the gate of the twentieth NMOS transistor 402b of the master-slave stage 312, and the set control signal SN=0 may be applied to the gate of the twenty-fifth PMOS transistor 1002a, and the twenty-fifth NMOS transistor 1102b. The master-slave stage 312 outputs the master feedback signal Mfb as Mfb=1, since Db=0, R=0, and SN=0. The master feedback signal Mfb=1, and an output of the FQ output node (FQ=1) may be provided to the OAI gate 314. The OAI gate 314 provides the output as 0, since the master feedback signal Mfb=1, and FQ=1. The output of the OAI gate 314 (i.e. 0) may be provided to the slave output stage 316 of the slave section 206. Also, the set control signal SN=0 may be applied to the gate of the twenty-sixth PMOS transistor 1102g, and the twenty-sixth NMOS transistor 1102h of the slave output stage 316. The slave output stage 316 provides the unbarred output Q as Q=1, since the output of the OAI gate 314 is 0, and SN=0. Thus, performing the set operation.

In an embodiment, for enabling the flip-flop 200 with the unbarred output to perform the reset operation with the set priority, the set control signal SN=1 (logic high level) may be applied to the peripheral circuit 504, which outputs the inverted set control signal nSN=0. The inverted set control signal nSN=0 may be applied to the gate of the twenty-first PMOS transistor 502a and the gate of the twenty-first NMOS transistor 502b of the second master stage 310, which outputs the previously stored data Db as Db=1. Db=1 may be provided to the master-slave stage 312. Further, the reset control signal R=1 may be applied to the gate of the twentieth PMOS transistor 402a and the gate of the twentieth NMOS transistor 402b of the master-slave stage 312, and the set control signal SN=1 may be applied to the gate of the twenty-fifth PMOS transistor 1002a, and the twenty-fifth NMOS transistor 1102b. The master-slave stage 312 outputs the master feedback signal Mfb as Mfb=0, since Db=1, R=1, and SN=1. The master feedback signal Mfb=0 may be provided to the OAI gate 314. The OAI gate 314 provides the output as 1, since the master feedback signal Mfb=0. The output of the OAI gate 314 (i.e. 1) may be provided to the slave output stage 316 of the slave section 206. Also, the set control signal SN=1 may be applied to the gate of the twenty-sixth PMOS transistor 1102g and the twenty-sixth NMOS transistor 1102h of the slave output stage 316. The slave output stage 316 provides the unbarred output Q as Q=0, since the output of the OAI gate 314 is 0 and SN=0. Thus, performing the reset operation.

In an embodiment, for enabling the flip-flop 200 with the unbarred output to perform the set operation with the set priority, the set control signal SN=0 (logic low level) may be applied to the peripheral circuit 504, which outputs the inverted set control signal nSN=1. The inverted set control signal nSN=1 may be applied to the gate of the twenty-first PMOS transistor 502a and the gate of the twenty-first NMOS transistor 502b of the second master stage 310, which outputs the previously stored data Db as Db=0. Db=0 may be provided to the master-slave stage 312. Further, the reset control signal R=1 may be applied to the gate of the twentieth PMOS transistor 402a and the gate of the twentieth NMOS transistor 402b of the master-slave stage 312, and the set control signal SN=0 may be applied to the gate of the twenty-fifth PMOS transistor 1002a and the twenty-fifth NMOS transistor N25 1102b. The master-slave stage 312 outputs the master feedback signal Mfb as Mfb=1, since Db=0, R=1, and SN=0. The master feedback signal Mfb=1, and an output of the FQ output node FQ=1 may be provided to the OAI gate 314. The OAI gate 314 provides the output as 0, since the Mfb=1 and FQ=1. The output of the OAI gate 314 (i.e. 0) may be provided to the slave output stage 316 of the slave section 206. Also, the set control signal SN=0 may be applied to the gate of the twenty-sixth PMOS transistor 1102g, and the twenty-sixth NMOS transistor 1102h of the slave output stage 316. The slave output stage 316 provides the unbarred output Q as Q=1, since the output of the OAI gate 314 is 0, and SN=0. Thus, performing the set operation.

Figure 12A:
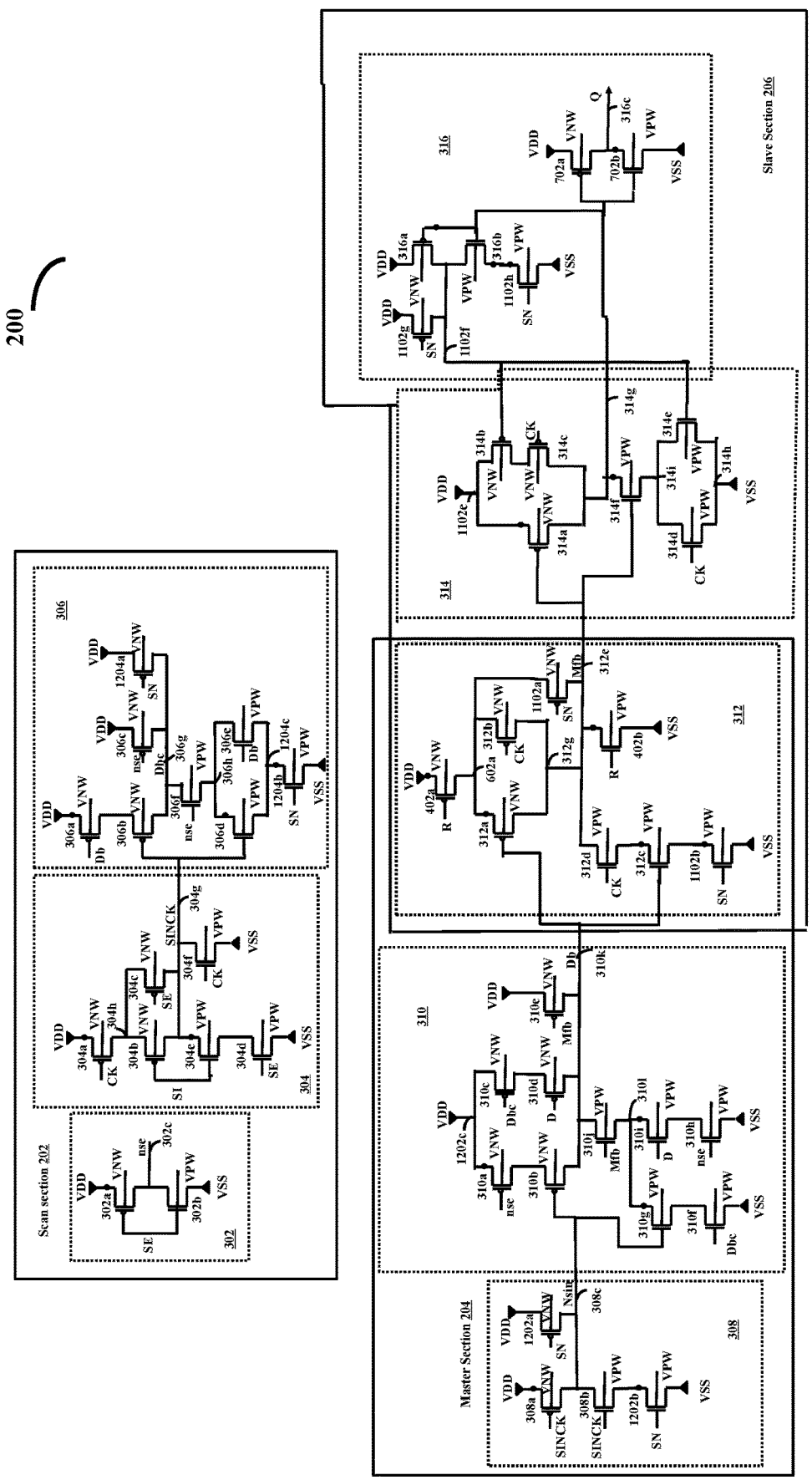
FIG. 12A is a circuit diagram depicting a flip-flop including the unbarred output and the set-reset functionality with reset priority, according to various embodiments.

FIG. 12A is a circuit diagram depicting the flip-flop 200 including the unbarred output and the set-reset functionality with the reset priority, according to various embodiments.

The flip-flop 200 with the unbarred output to perform the set or reset operation with the reset priority includes the scan section 202, the master section 204, and the slave section 206. The flip-flop 200 for providing the inverted output QN includes the scan section 202, the master section 204, and the slave section 206.

Figure 12B:
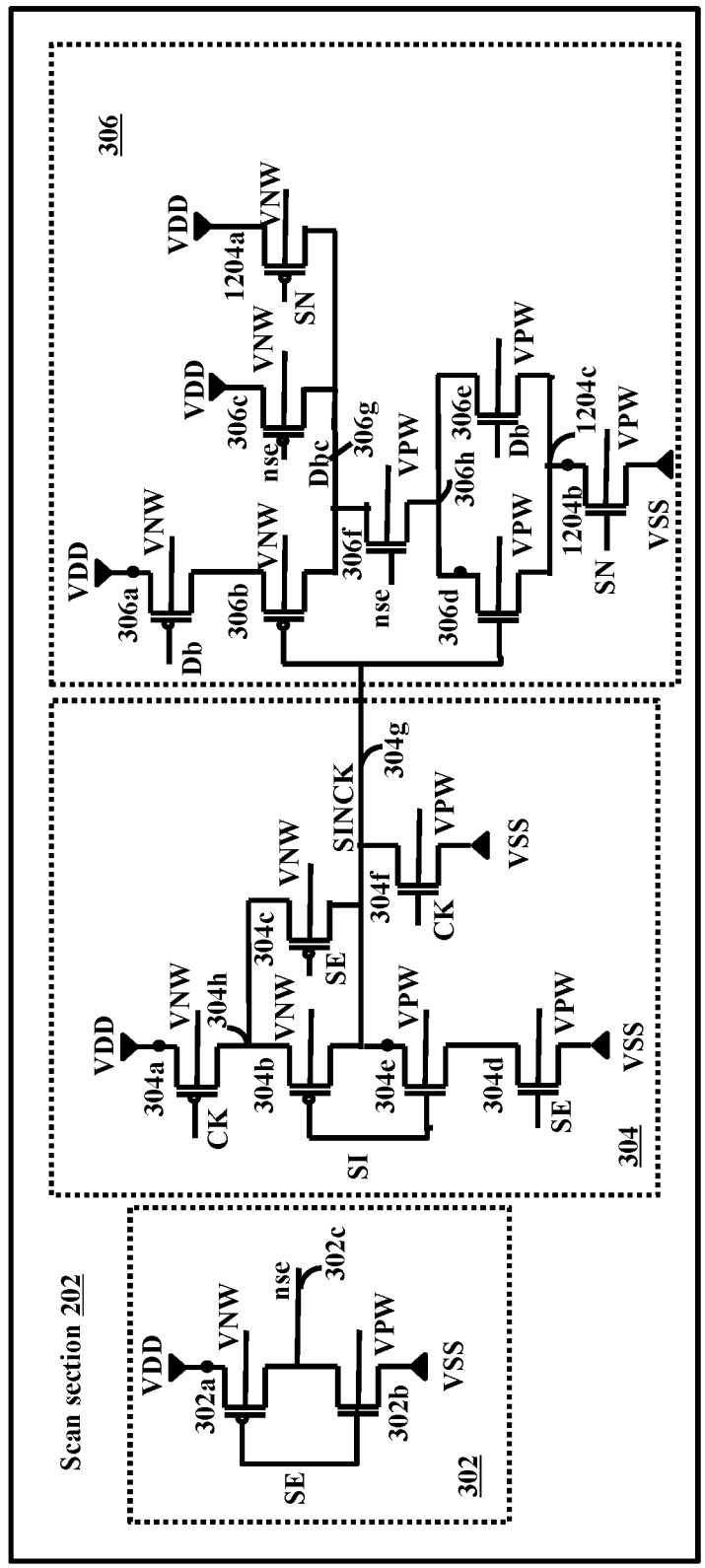
FIG. 12B is a circuit diagram depicting a scan section of the flip-flop including the unbarred output and the set-reset functionality with reset priority, according to various embodiments.

As depicted in FIGS. 12A and 12B, the scan section 202 includes the first scan stage 302, the second scan stage 304, and the third scan stage 306. The first scan stage 302 receives the scan enable signal SE, and outputs the inverted scan enable signal nse on the first scan-stage-output node 302c. The first scan stage 302 includes the first PMOS transistor 302a, and the first NMOS transistor 302b for outputting the inverted scan enable signal nse. The second scan stage 304 receives the scan enable signal SE, the scan input signal SI, and the clock signal CK, and outputs the internal signal SINCK on the second scan-stage output node 304g. The second scan stage 304 includes the second PMOS transistor 304a, the third PMOS transistor 304b, the fourth PMOS transistor 304c, the second NMOS transistor 304d, the third NMOS transistor 304e, and the fourth NMOS transistor 304f for outputting the internal signal SINCK. The configurations of the transistors of the first scan stage 302, and the second scan stage 304, and their intended functions are depicted in FIGS. 3B and 3C, and repeated descriptions thereof are omitted for conciseness.

The third scan stage 306 receives the internal signal SINCK, the inverted scan enable signal nse (from the first scan stage 302), the set control signal SN, and the feedback data Db from the master section 204, and outputs an inverted feedback data Dbc on the third scan-stage output node 306g. As depicted in FIG. 12A, the third scan stage 306 includes the fifth PMOS transistor 306a, the sixth PMOS transistor 306b, the seventh PMOS transistor 306c, the fifth NMOS transistor 306d, the sixth NMOS transistor 306e, the seventh NMOS transistor 306f, a twenty-ninth PMOS transistor 1204a, and a twenty-ninth NMOS transistor 1204b for outputting the inverted feedback data Dbc on the third scan-stage output node 306g.

The fifth PMOS transistor 306a may be connected to the VDD voltage, the feedback data Db from the master section 204, and the sixth PMOS transistor 306b. The sixth PMOS transistor 306b may be connected to the internal signal SINCK on the second scan-stage output node 304g, and the third scan-stage output node 306g. The seventh PMOS transistor 306c may be connected to the VDD voltage, the inverted scan enable signal nse outputted on the first scan-stage output node 302c, and the third scan-stage output node 306g. The twenty-ninth PMOS transistor 1204a may be connected to the VDD voltage, the set control signal SN, and the third scan-stage output node 306g. The fifth PMOS transistor 306a includes the source connected to the VDD voltage, the gate connected to the feedback data Db of the master section 204, and the drain connected to the source of the sixth PMOS transistor 306b. The sixth PMOS transistor 306b includes the gate connected to the internal signal SINCK, and the drain connected to the third scan-stage output node 306g. The seventh PMOS transistor 306c includes the source connected to the VDD voltage, the gate connected to the inverted scan enable signal nse, and a drain connected to the third scan-stage output node 306g. The twenty-ninth PMOS transistor 1204a includes a source connected to the VDD voltage, a gate connected to the set control signal SN, and the drain connected to the third scan-stage output node 306g.

The fifth NMOS transistor 306d may be connected to a fifteenth conjunction node 1204c, the internal signal SINCK outputted on the second scan-stage output node 304g, and the second conjunction node 306h. The sixth NMOS transistor 306e may be connected to the VSS voltage, the feedback data Db of the master section 204, and the second conjunction node 306h. The seventh NMOS transistor 306f may be connected to the second conjunction node 306h, the inverted scan enable signal nse outputted on the first scan-stage output node 302c, and the third scan-stage output node 306g. The twenty-ninth NMOS transistor 1204b may be connected to the VSS voltage, the set control signal SN, and the fifteenth conjunction node 1204c. The fifth NMOS transistor 306d includes the source connected to the VSS voltage, the gate connected to the internal signal SINCK, and the drain connected to the second conjunction node 306h. The sixth NMOS transistor 306e includes the source connected to the VSS voltage, the gate connected to the feedback data Db, and the drain connected to the second conjunction node 306h. The seventh NMOS transistor 306f includes the source connected to the second conjunction node 306h, the gate connected to the scan inverted scan enable signal nse, and the drain connected to the third scan-stage output node 306h. The twenty-ninth NMOS transistor includes a source connected to the VSS voltage, a gate connected to the set control signal SN, and a drain connected to the fifteenth conjunction node 1204c.

Figure 12C:
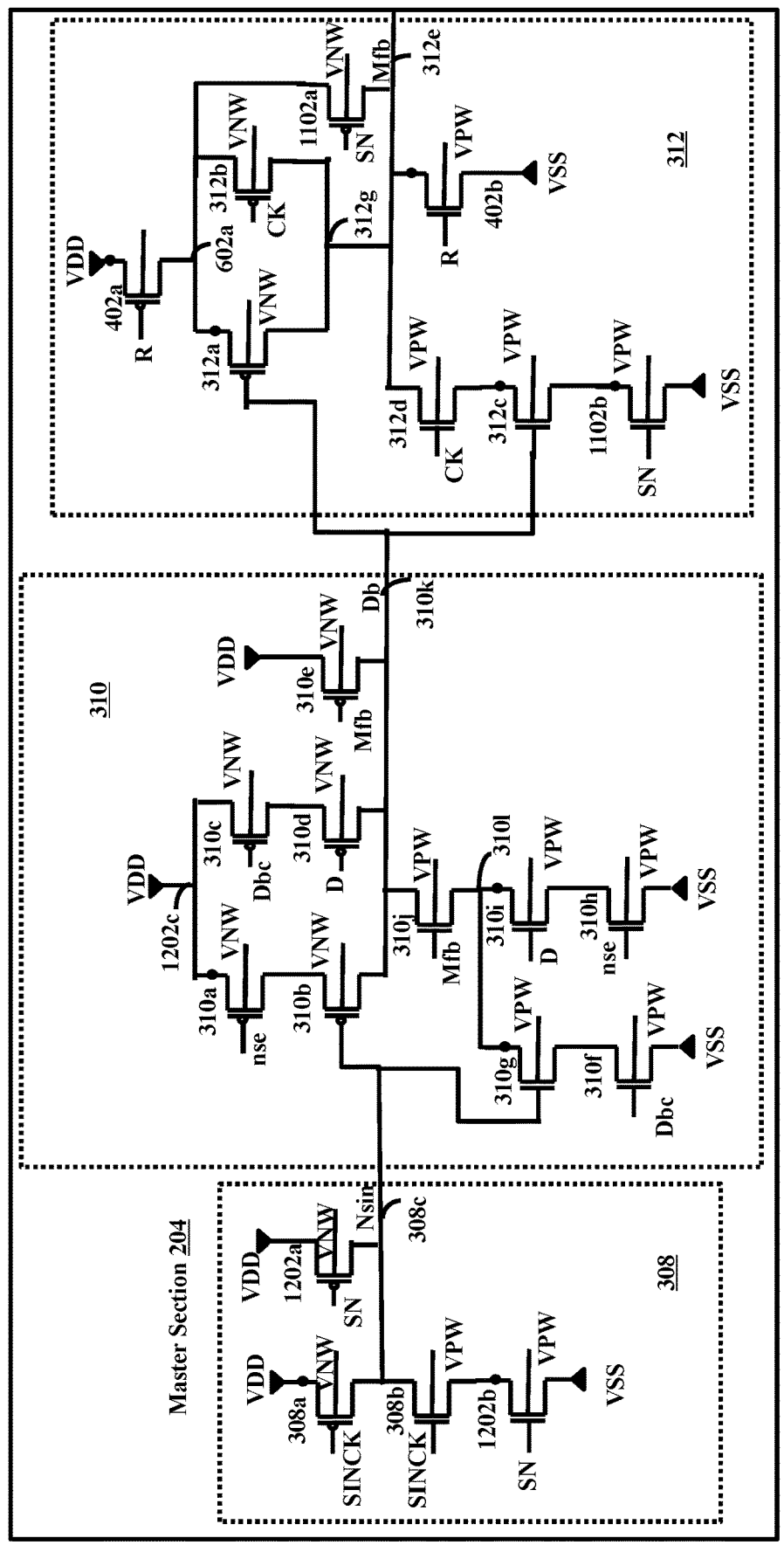
FIG. 12C is a circuit diagram depicting a master section of the flip-flop including the unbarred output and the set-reset functionality with reset priority, according to various embodiments.

As depicted in FIGS. 12A and 12C, the master section 204 includes the first master stage 308, the second master stage 310, and the master-slave stage 312.

The first master stage 308 receives the internal signal SINCK from the second scan-stage output node 304g of the scan section 202, the set control signal SN, and outputs the inverted signal Nsin on the first master-stage output node 308c. In an embodiment, if SN=0, the first master stage 308 outputs Nsin as Nsin=1. If SN=1, the first master stage 308 performs normal functioning as depicted in FIGS. 3A, 3B, and 3D. The first master stage 308 includes the eighth PMOS transistor 308a, a twenty-seventh PMOS transistor 1202a, the eighth NMOS transistor 308b, and a twenty-seventh NMOS transistor 1202b for outputting the inverted signal Nsin on the first master-stage output node 308c. The eighth PMOS transistor 308a may be connected to the VDD voltage, the internal signal SINCK, and the first master-stage output node 308c. The twenty-seventh PMOS transistor 1202a may be connected to the VDD voltage, the set control signal SN, and the first master-stage output node 308c. The eighth NMOS transistor 308b may be connected to the first master-stage output node 308c, the internal signal SINCK, and the twenty-seventh NMOS transistor 1202b. The eighth PMOS transistor 308a includes the source connected to the VDD voltage, the gate connected to the internal signal SINCK, and the drain connected to the first master-stage output node 308c. The twenty-seventh PMOS transistor 1202a includes a source connected to the VDD voltage, a gate connected to the set control signal SN, and a drain connected to the first master-stage output node 308c. The eighth NMOS transistor 308b includes the source connected to the drain of the twenty-seventh NMOS transistor 1202b, the gate connected to the internal signal SINCK, and the drain connected to the first master-stage output node 308c. The twenty-seventh NMOS transistor 1202b includes a source connected to the VSS voltage, and a gate connected to the set control signal SN.

The second master stage 310 receives Nsin, the inverted scan enable signal nse, the data input D, the inverted feedback data Dbc, and the master feedback signal Mfb, and outputs the previously stored data/feedback data Db on the second master-stage output node 310k. The second master stage 310 includes the ninth PMOS transistor 310a, the tenth PMOS transistor 310b, the eleventh PMOS transistor 310c, the twelfth PMOS transistor 310d, and the thirteenth PMOS transistor 310e. The second master stage 310 also includes the ninth NMOS transistor 310f, the tenth NMOS transistor 310g, the eleventh NMOS transistor 310h, the twelfth NMOS transistor 310i, and the thirteenth NMOS transistor 310j.

The ninth PMOS transistor 310a may be connected to a fourteenth conjunction node 1202c, the inverted scan enable signal nse, and the tenth PMOS transistor 310b. The fourteenth conjunction node 1202c may be connected to the VDD voltage. The tenth PMOS transistor 310b may be connected to the fourteenth conjunction node 1202c, the Nsin, and the second master-stage output node 310k. The eleventh PMOS transistor 310c may be connected to the fourteenth conjunction node 1202c, the inverted feedback data Dbc, and the twelfth PMOS transistor 310d. The twelfth PMOS transistor 310d may be connected to the data input D, and the second master-stage output node 310k. The thirteenth PMOS transistor 310e may be connected to the fourteenth conjunction node 1202c, the master feedback signal, and the second master-stage output node 310k. The ninth PMOS transistor 310a includes the source connected to the fourteenth conjunction node 1202c, the gate connected to the inverted scan enable signal nse, and the drain connected to the source of the tenth PMOS transistor 310b. The tenth PMOS transistor 310b includes the gate connected to the Nsin, and the drain connected to the second master-stage output node 310k. The eleventh PMOS transistor 310c includes the source connected to the fourteenth conjunction node 1202c, the gate connected to the inverted feedback data Dbc, and the drain connected to the source of the twelfth PMOS transistor 310d. The twelfth PMOS transistor 310d includes the gate connected to the data input D, and the drain connected to the second master-stage output node 310k. The thirteenth PMOS transistor 310e includes the source connected to the fourteenth conjunction node 1202c, the gate connected to the master feedback signal Mfb, and the drain connected to the second master-stage output node 310k. The ninth NMOS transistor 310f may be connected to the VSS voltage, the inverted feedback data Dbc, and the tenth NMOS transistor 310g. The tenth NMOS transistor 310g may be connected to Nsin, and the third conjunction node 310l. The eleventh NMOS transistor 310h may be connected to the VSS voltage, the inverted scan enable signal nse, and the twelfth NMOS transistor 310i. The twelfth NMOS transistor 310i may be connected to the data input D, and the third conjunction node 310l. The thirteenth NMOS transistor 310j may be connected to the third conjunction node 310l, the master feedback signal, and the second master-stage output node 310k. The ninth NMOS transistor 310f includes the source connected to the VSS voltage, the gate connected to the inverted feedback data Dbc, and the drain connected to the source of the tenth NMOS transistor 310g. The tenth NMOS transistor 310g includes the gate connected to Nsin, and the drain connected to the third conjunction node 310l. The eleventh NMOS transistor includes the source connected to the VSS voltage, the gate connected to the inverted scan enable signal nse, and the drain connected to the source of the twelfth NMOS transistor 310i. The twelfth NMOS transistor 310i includes the gate connected to the data input D, and the drain connected to the third conjunction node 310l. The thirteenth PMOS transistor 310e includes the source connected to the third conjunction node 310l, the gate connected to the Mfb, and the drain connected to the second master-stage output node 310k.

The master-slave stage 312 receives Db, the clock signal CK, the reset control signal R, the set control signal SN, and outputs the master feedback signal Mfb on the common master-slave stage output node 312e. In an embodiment, if R=1 and SN=0, the master-slave stage 312 outputs the master feedback signal Mfb as Mfb=0. In an embodiment, If R=1 and SN=1, the master-slave stage 312 outputs the master feedback signal Mfb as Mfb=0. In an embodiment, if R=0 and SN=0, the master-slave stage 312 outputs the master feedback signal Mfb as Mfb=1. In an embodiment, if R=0 and SN=1, the master-slave stage 312 performs the normal functions as depicted in FIGS. 3A, 3B, and 3D.

The master-slave stage 312 includes the fourteenth PMOS transistor 312a, the fifteenth PMOS transistor 312b, the fourteenth NMOS transistors 312c, the fifteenth NMOS transistor 312d, the twentieth PMOS transistor 402a, the twentieth NMOS transistor 402b, the twenty-fifth PMOS transistor 1002a, and the twenty-fifth NMOS transistor 1102b. The fourteenth PMOS transistor 312a may be connected to the eleventh conjunction node 602c, the feedback data Db, and the fifth conjunction node 312g. The fifteenth PMOS transistor 312b may be connected to the eleventh conjunction node 602c, the clock signal CK, and the fifth conjunction node 312g. The fifth conjunction node 312g may be connected to the common master-slave stage node 312e. The twentieth PMOS transistor 402a may be connected to the VDD voltage, the reset control signal R, and the eleventh conjunction node 602c. The twenty-fifth PMOS transistor 1002a may be connected to the eleventh conjunction node 602a, the set control signal, and the common master-slave stage output node 312e. The fourteenth PMOS transistor 312a includes the source connected to the eleventh conjunction node 1102a, the gate connected to the master feedback signal, and the drain connected to the fifth conjunction node 312g. The fifteenth PMOS transistor 312b includes the source connected to the eleventh conjunction node 602a, the gate connected to the clock signal, and the drain connected to the fifth conjunction node 312g. The twentieth PMOS transistor 402a includes the source connected to the VDD voltage, the gate connected to the reset control signal R, and the drain connected to the eleventh conjunction node 602a. The twenty-fifth PMOS transistor 1102a includes the source connected to the eleventh conjunction node 602a, the gate connected to the set control signal SN, and the drain connected to the common master-slave stage output node 312e.

The fourteenth NMOS transistor 312c may be connected to the twenty-fifth NMOS transistor 1102b, the master feedback signal Mfb, and the fifteenth NMOS transistor 312d. The fifteenth NMOS transistor 312d may be connected to the clock signal, and the common master-slave stage output node 312e. The twentieth NMOS transistor 402b may be connected to the VSS voltage, the reset control signal R, and the common master-slave stage output node 312e. The twenty-fifth NMOS transistor 1102b may be connected to the VSS voltage, the set control signal, and the fourteenth NMOS transistor 312c. The fourteenth NMOS transistor 312c includes the source connected to the drain of the twenty-fifth NMOS transistor 1102b, the gate connected to the feedback data Db, and the drain connected to the source of the fifteenth NMOS transistor 312d. The fifteenth NMOS transistor 312d includes the gate connected to the clock signal CK, and the drain connected to the common master-slave stage output node 312e. The twentieth NMOS transistor 402b includes the source connected to the VSS voltage, the gate connected to the reset control signal R, and the drain connected to the common master-slave stage output node 312e. The twenty-fifth NMOS transistor 1002b includes the source connected to the VSS voltage, the gate connected to the set control signal SN, and the drain connected to the source of the fourteenth NMOS transistor 312c.

Figure 12D:
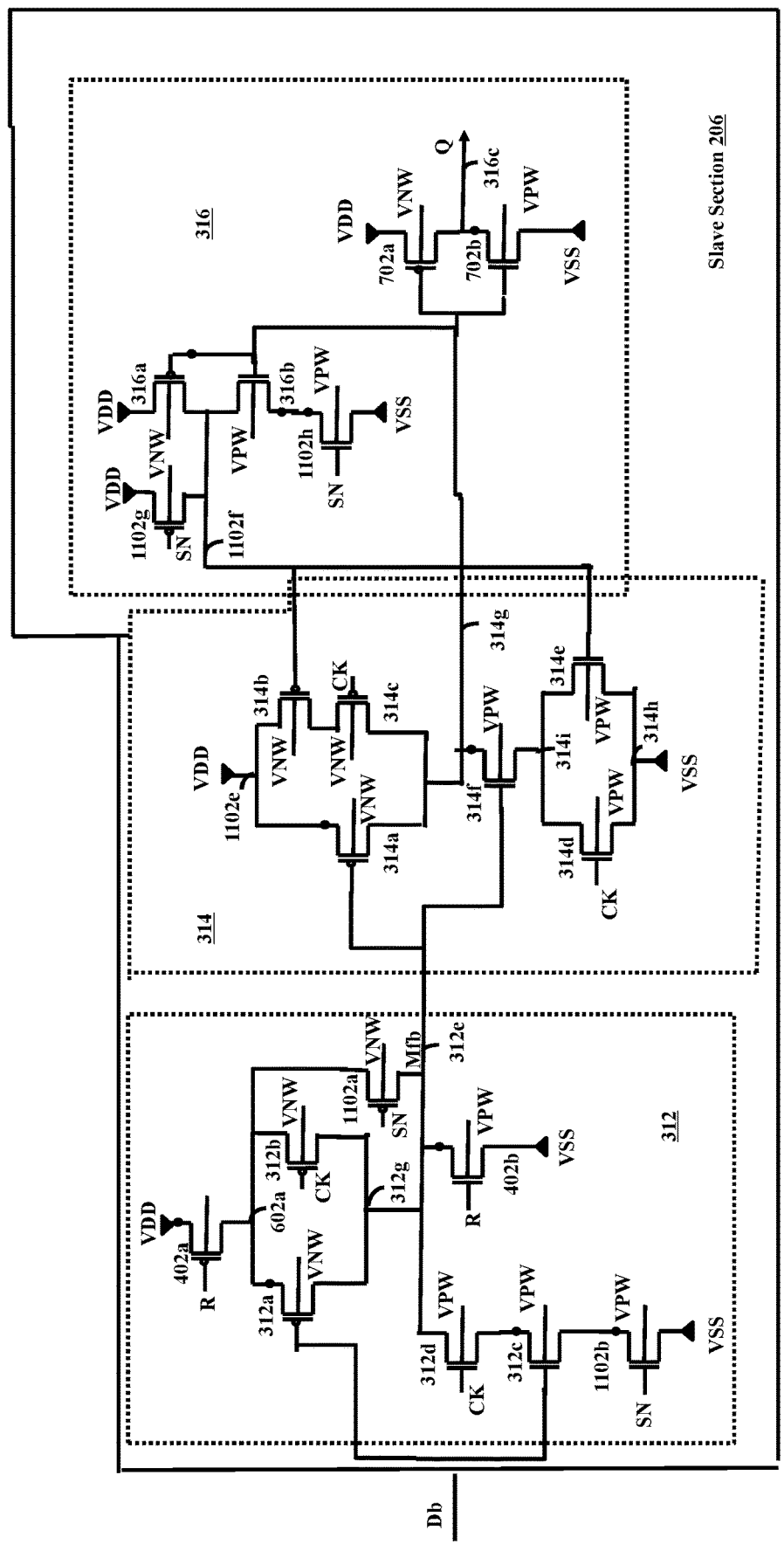
FIG. 12D is a circuit diagram depicting a slave section of the flip-flop including the unbarred output and the set-reset functionality with reset priority, according to various embodiments.

As depicted in FIGS. 12A and 12D, the slave stage 206 includes the OAI gate 314, and the slave output stage 316. The OAI gate 314 receives the master feedback signal Mfb from the master-slave stage 312, the clock signal CK, and the output of the FQ output node and provides the output corresponding to 0 or 1 on the OAI gate output node 314g. The OAI gate 314 includes the sixteenth PMOS transistor 314a, the seventeenth PMOS transistor 314b, the eighteenth PMOS transistor 314c, the sixteenth NMOS transistor 314d, the seventeenth NMOS transistor 314e, and the eighteenth NMOS transistor 314f for providing the output 0 or 1. The sixteenth PMOS transistor 314a may be connected to the thirteenth conjunction node 1102e, the master feedback signal Mfb, and the OAI gate output node 314g. The thirteenth conjunction node 1102e may be connected to the VDD voltage. The seventeenth PMOS transistor 314b may be connected to the thirteenth conjunction node 1102e, the FQ output node 1102f, and the eighteenth PMOS transistor 314c. The eighteenth PMOS transistor 314c may be connected to the clock signal, and the OAI gate output node 314g. The sixteenth PMOS transistor 314a includes the source connected to the thirteenth conjunction node 1102e, the gate connected to the master feedback signal Mfb, and the drain connected to the OAI gate output node 314g. The seventeenth PMOS transistor 314b includes the source connected to the thirteenth conjunction node 1102g, the gate connected to the FQ output node 1102f of the slave output stage 316, and the drain connected to the source of the eighteenth PMOS transistor 314c. The eighteenth PMOS transistor 314c includes the gate connected to the clock signal CK, and the drain connected to the OAI gate output node 314g. The sixteenth NMOS transistor 314d may be connected to the sixth conjunction node 314h, the clock signal CK, and the seventh conjunction node 314i. The sixth conjunction node 314h may be connected to the VSS voltage. The seventeenth NMOS transistor 314e may be connected to the sixth conjunction node 314h, the FQ output node 1102f, and the seventh conjunction node 314i. The eighteenth NMOS transistor 314f may be connected to the seventh conjunction node 314i, the master feedback signal Mfb, and the OAI gate output node 314g. The sixteenth NMOS transistor 314d includes the source connected to the sixth conjunction node 314h, the gate connected to the clock signal CK, and the drain connected to the seventh conjunction node 314i. The seventeenth NMOS transistor 314e includes the source connected to the sixth conjunction node 314h, the gate connected to the FQ output node 1102f of the slave output stage 316, and the drain connected to the seventh conjunction node 314i. The eighteenth NMOS transistor 314f includes the source connected to the seventh conjunction node 314i, the gate connected to the internal signal Mfb, and the drain connected to the OAI gate output node 314g.

The slave output stage 316 receives the output of the OAI gate 314 from the OAI gate output node 314g, the set control signal SN and outputs the unbarred output Q on the output node 316c. In an embodiment, if SN=0 and R=0, the signal on FQ output node 1102f=1, the output of the OAI gate 314 on the OAI gate output node 314g=0, and then the output Q=1. Otherwise, the slave output stage 316 performs the normal functioning as depicted in FIG. 7A. The slave output stage 316 includes the nineteenth PMOS transistor 316a, the nineteenth NMOS transistor 316b, the twenty-fourth PMOS transistor 702a, the twenty-fourth NMOS transistor 702b, the twenty-sixth PMOS transistor 1102g, and the twenty-sixth NMOS transistor 1102h for outputting the unbarred output Q on the output node 316c. The twenty-sixth PMOS transistor 1102g may be connected to the FQ output node 1102f, the set control signal SN, and the VDD voltage. The nineteenth PMOS transistor 316a may be connected to VDD voltage, the OAI gate output node 314g, and the FQ output node 1102f. The nineteenth NMOS transistor 316b may be connected to the FQ output node 1102f, the OAI gate output node 314g, and the twenty-sixth NMOS transistor 1102h. The twenty-sixth NMOS transistor 1102h may be connected to the VSS voltage, and the set control signal SN. The twenty-fourth PMOS transistor 702a may be connected to the VDD voltage, the OAI gate output node 314g, and the output node 316c. The twenty-fourth NMOS transistor 702b may be connected to the VSS voltage, the OAI gate output node 314g, and the output node 316c. The twenty-sixth PMOS transistor 1102g includes the source connected to the VDD voltage, the gate connected to the set control signal SN, and the drain connected to the FQ output node 1102f. The nineteenth PMOS transistor 316a includes the source connected to the VDD voltage, the gate connected to the OAI gate output node 314g, and the drain connected to the FQ output node 1102f. The nineteenth NMOS transistor 316b includes the source connected to a drain of the twenty-sixth NMOS transistor 1102h, the gate connected to the OAI gate output node 314g, and the drain connected to the FQ output node 314g. The twenty-sixth NMOS transistor 1102h includes the source connected to the VSS voltage, and the gate connected to the set control signal SN. The twenty-fourth PMOS transistor 702a includes the source connected to the VDD voltage, the gate connected to the OAI gate output node 314g, and the drain connected to the output node 316c. The twenty-fourth NMOS transistor 702b includes the source connected to the VSS voltage, the gate connected to the OAI gate output node 314g, and the drain connected to the output node 316c.

In an embodiment, for enabling the flip-flop 200 with the unbarred output to perform the reset operation with the reset priority, the set control signal SN=1 (logic low level) may be applied to the gate of the twenty-seventh PMOS transistor 1202a, and the twenty-seventh NMOS transistor 1202b. Also, the internal signal SINCK may be applied to the first master stage 308. The master stage 308 outputs Nsin=0, since SN=1. Nsin=1 may be provided to the second master stage 310. The second master stage 310 outputs the feedback data Db as Db=1, since Nsin=0. Db=1 may be provided to the master-slave stage 312. Further, the reset control signal R=1 may be applied to the gate of the twentieth PMOS transistor 402a and the gate of the twentieth NMOS transistor 402b of the master-slave stage 312, and the set control signal SN=1 may be applied to the gate of the twenty-fifth PMOS transistor 1002a, and the twenty-fifth NMOS transistor 1102b of the master-slave stage 312. The master-slave stage 312 outputs the master feedback signal Mfb as Mfb=0, since Db=1, R=1, and SN=1. The master feedback signal Mfb=0 and the output of the FQ output node FQ=0 may be provided to the OAI gate 314. The OAI gate 314 provides the output as 1, since the master feedback signal Mfb=0 and FQ=0. The output of the OAI gate 314 (i.e. 1) may be provided to the slave output stage 316 of the slave section 206. Also, the set control signal SN=1 may be applied to the gate of the twenty-sixth PMOS transistor 1102g, and the twenty-sixth NMOS transistor 1102h of the slave output stage 316. The slave output stage 316 provides the unbarred output Q as Q=0, since the output of the OAI gate 314 is 1, and SN=1. Thus, performing the reset operation.

In an embodiment, for enabling the flip-flop 200 with the unbarred output to perform the set operation with the reset priority, the set control signal SN=0 (logic low level) may be applied to the gate of the twenty-seventh PMOS transistor 1202a, and the twenty-seventh NMOS transistor 1202b. Also, the internal signal SINCK may be applied to the first master stage 308. The master stage 308 outputs Nsin=1, since SN=0. Nsin=0 may be provided to the second master stage 310. The second master stage 310 outputs the feedback data Db as Db=0, since Nsin=1. Db=0 may be provided to the master-slave stage 312. Further, the reset control signal R=0 may be applied to the gate of the twentieth PMOS transistor 402a and the gate of the twentieth NMOS transistor 402b of the master-slave stage 312, and the set control signal SN=0 may be applied to the gate of the twenty-fifth PMOS transistor 1002a, and the twenty-fifth NMOS transistor 1102b of the master-slave stage 312. The master-slave stage 312 outputs the master feedback signal Mfb as Mfb=1, since Db=0, R=0, and SN=0. The master feedback signal Mfb=1 and the output of the FQ output node FQ=1 may be provided to the OAI gate 314. The OAI gate 314 provides the output as 0, since the master feedback signal Mfb=1 and FQ=1. The output of the OAI gate 314 (i.e. 0) may be provided to the slave output stage 316 of the slave section 206. Also, the set control signal SN=0 may be applied to the gate of the twenty-sixth PMOS transistor 1102g, and the twenty-sixth NMOS transistor 1102h of the slave output stage 316. The slave output stage 316 provides the unbarred output Q as Q=1, since the output of the OAI gate 314 is 0, and SN=0. Thus, performing the set operation.

In an embodiment, for enabling the flip-flop 200 with the unbarred output to perform the reset operation with the reset priority, the set control signal SN=0 (logic low level) may be applied to the gate of the twenty-seventh PMOS transistor 1202a, and the twenty-seventh NMOS transistor 1202b. Also, the internal signal SINCK may be applied to the first master stage 308. The master stage 308 outputs Nsin=1, since SN=0. Nsin=1, and Dbc=1 may be provided to the second master stage 310. The second master stage 310 outputs the feedback data Db as Db=1, since Nsin=1. Db=1 may be provided to the master-slave stage 312. Further, the reset control signal R=1 may be applied to the gate of the twentieth PMOS transistor 402a and the gate of the twentieth NMOS transistor 402b of the master-slave stage 312, and the set control signal SN=0 may be applied to the gate of the twenty-fifth PMOS transistor 1002a, and the twenty-fifth NMOS transistor 1102b of the master-slave stage 312. The master-slave stage 312 outputs the master feedback signal Mfb as Mfb=0, since Db=1, R=1, and SN=0. The master feedback signal Mfb=0, and the output of the FQ output node FQ=0 may be provided to the OAI gate 314. The OAI gate 314 provides the output as 1, since the master feedback signal Mfb=0 and FQ=0. The output of the OAI gate 314 (i.e. 1) may be provided to the slave output stage 316 of the slave section 206. Also, the set control signal SN=0 may be applied to the gate of the twenty-sixth PMOS transistor 1102g and the twenty-sixth NMOS transistor 1102h of the slave output stage 316. The slave output stage 316 provides the unbarred output Q as Q=0, since the output of the OAI gate 314 is 1, and SN=1. Thus, performing the reset operation.

Figure 13A:
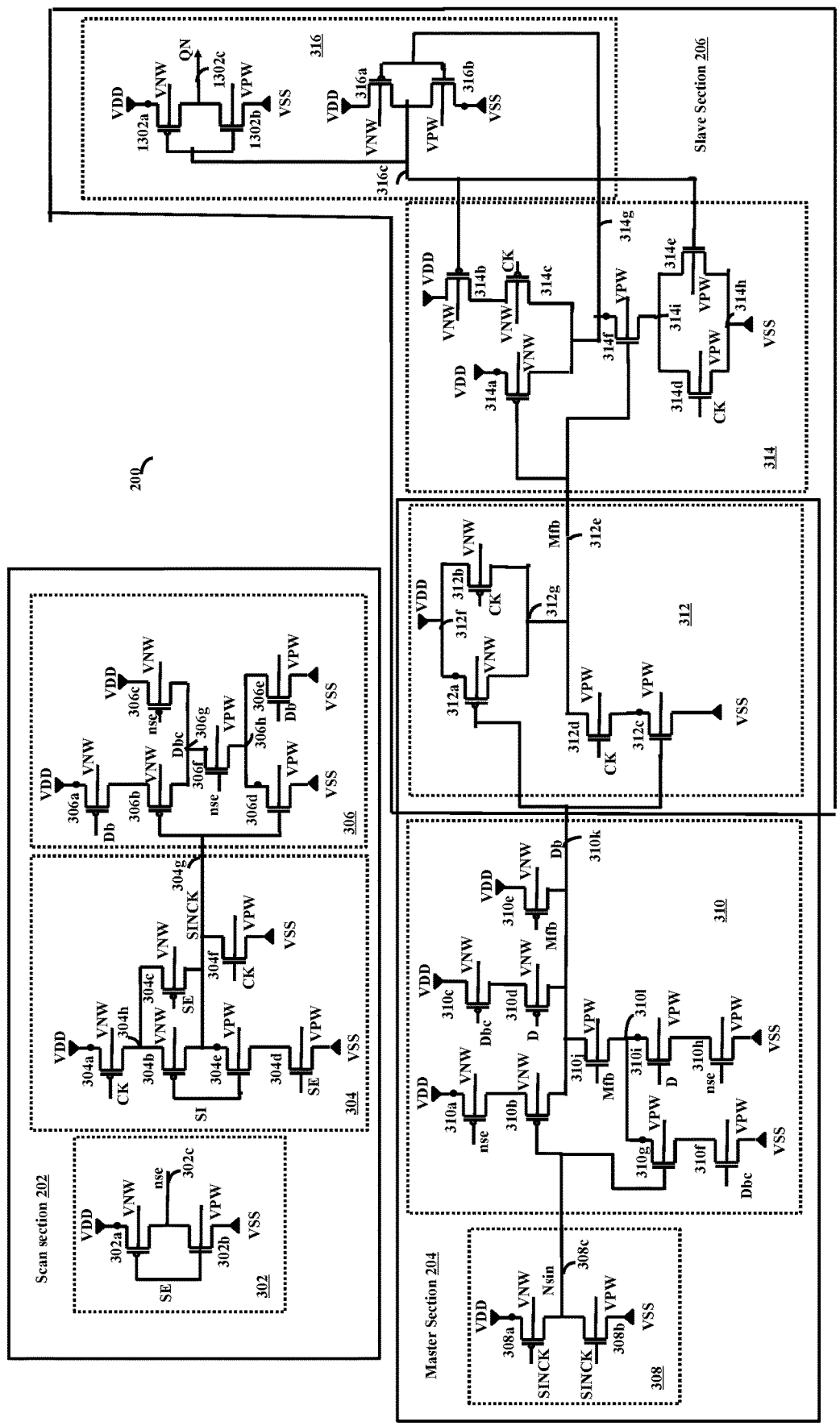
FIG. 13A is a circuit diagram depicting a flip-flop with an inverted output QN, according to various embodiments.

FIG. 13A is a circuit diagram depicting the flip-flop 200 with an inverted output QN, according to various embodiments. The flip-flop 200 for providing the inverted output QN includes the scan section 202, the master section 204, and the slave section 206.

The scan section 202 includes the first scan stage 302, the second scan stage 304, and the third scan stage 306. The first scan stage 302 receives the scan enable signal SE, and outputs the inverted scan enable signal nse on the first scan-stage-output node 302c. The first scan stage 302 includes the first PMOS transistor 302a, and the first NMOS transistor 302b for outputting the inverted scan enable signal nse. The second scan stage 304 receives the scan enable signal SE, the scan input signal SI, and the clock signal CK, and outputs the internal signal SINCK on the second scan-stage output node 304g. The second scan stage 304 includes the second PMOS transistor 304a, the third PMOS transistor 304b, the fourth PMOS transistor 304c, the second NMOS transistor 304d, the third NMOS transistor 304e, and the fourth NMOS transistor 304f for outputting the internal signal SINCK. The third scan stage 306 receives the internal signal SINCK, the feedback data Db, and the inverted scan enable signal nse, and outputs the inverted feedback data Dbc on the third scan-stage output node 306g, which may be provided to the master section 204. The third scan stage 306 includes the fifth PMOS transistor 306a, the sixth PMOS transistor 306b, the seventh PMOS transistor 306c, the fifth NMOS transistor 306d, the sixth NMOS transistor 306e, and the seventh NMOS transistor 306f for outputting the inverted feedback data Dbc. The configurations of the transistors of the first scan stage 302, the second scan stage 304, and the third scan stage 306, and their intended functions are depicted in FIGS. 3B and 3C, and repeated descriptions thereof are omitted for conciseness.

The master section 204 includes the first master stage 308, the second master stage 310, and the master-slave stage 312. The first master stage 308 receives the internal signal SINCK, and outputs the inverted signal Nsin on the first master-stage output node 308c. The first master stage 308 includes the eighth PMOS transistor 308a, and the eighth NMOS transistor 308b for outputting the inverted signal Nsin. The second master stage 310 receives Nsin, the inverted scan enable signal nse, the data input D, the master feedback signal Mfb, and the inverted feedback data Dbc, and outputs the previously stored data Db on the second master-stage output node 310k. The second master stage 310 includes the ninth PMOS transistor 310a, the tenth PMOS transistor 310b, the eleventh PMOS transistor 310c, the twelfth PMOS transistor 310d, the thirteenth PMOS transistor 310e, the ninth NMOS transistor 310f, the tenth NMOS transistor 310g, the eleventh NMOS transistor 310h, the twelfth NMOS transistor 310i, and the thirteenth NMOS transistor 310j for outputting the previously stored data/feedback data Db. The master-slave stage 312 receives the previously stored data Db, and the clock signal CK, and outputs the master feedback signal Mfb on the common master-slave output node 312e. The configurations of the transistors of the first master stage 308, the second master stage 310, and the master-slave stage 312, and their intended functions are described in FIGS. 3A, 3B and 3D, and repeated descriptions thereof are omitted for conciseness.

Figure 13B:
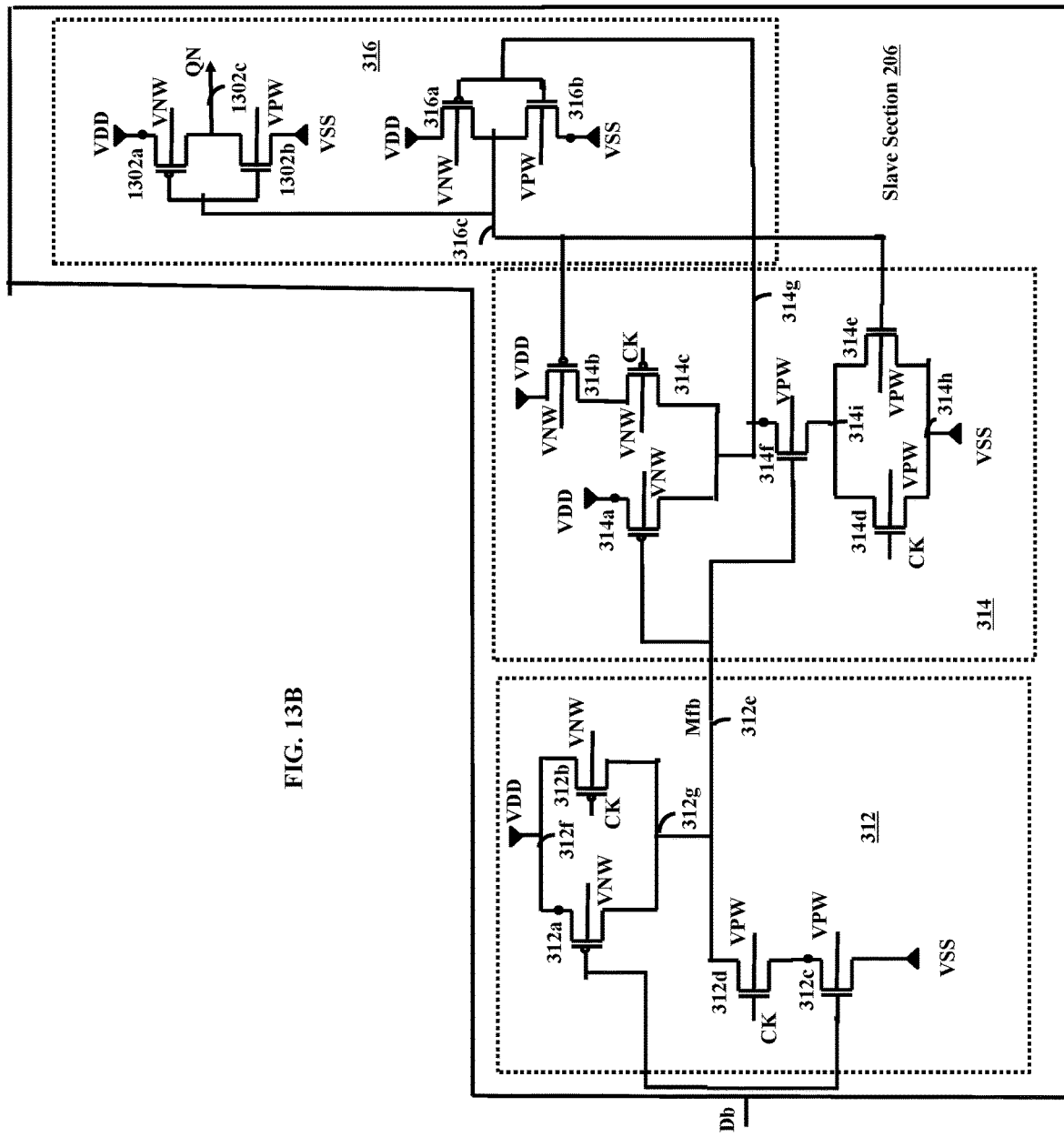
FIG. 13B is a circuit diagram depicting a slave section of the flip-flop with the inverted output QN, according to various embodiments.

As depicted in FIGS. 13A and 13B, the slave section 206 includes the OAI gate 314, and the slave output stage 316. The OAI gate 314 fetches the master feedback signal Mfb and provides the output on the OAI gate output node 314g based on the clock signal CK, the fetched master feedback signal Mfb, and the data present on the FQ output node 1102f, wherein the output corresponds to 1 or 0. The OAI gate 314 includes the sixteenth PMOS transistor 314a, the seventeenth PMOS transistor 314b, the eighteenth PMOS transistor 314c, the sixteenth NMOS transistor 314d, the seventeenth NMOS transistor 314e, and the eighteenth NMOS transistor 314f for providing the output 0 or 1.

The sixteenth PMOS transistor 314a may be connected to the VDD voltage, the master feedback signal Mfb, and the OAI gate output node 314g. The seventeenth PMOS transistor 314b may be connected to the VDD voltage, the FQ output node 1102f, and the eighteenth PMOS transistor 314c. The eighteenth PMOS transistor 314c may be connected to the clock signal CK, and the OAI gate output node 314g. The sixteenth PMOS transistor 314a includes the source connected to the VDD voltage, the gate connected to the master feedback signal Mfb, and the drain connected to the OAI gate output node 314g. The seventeenth PMOS transistor 314b includes the source connected to the VDD voltage, the gate connected to the FQ output node 1102f, and the drain connected to the source of the eighteenth PMOS transistor 314c. The eighteenth PMOS transistor 314c includes the gate connected to the clock signal CK, and the drain connected to the OAI gate output node 314g. The sixteenth NMOS transistor 314d may be connected to the sixth conjunction node 314h, the clock signal CK, and the seventh conjunction node 314i. The sixth conjunction node 314h may be connected to the VSS voltage. The seventeenth NMOS transistor 314e may be connected to the sixth conjunction node 314h, the FQ output node 1102f and the seventh conjunction node 314i. The eighteenth NMOS transistor 314f may be connected to the OAI gate output node 314g, the master feedback signal Mfb, and the seventh conjunction node 314i. The sixteenth NMOS transistor 314d includes the source connected to the sixth conjunction node 314h, the gate connected to the clock signal CLK, and the drain connected to the seventh conjunction node 314i. The seventeenth NMOS transistor 314e includes the source connected to the sixth conjunction node 314h, the gate connected to the FQ output node 1102f, and the drain connected to the seventh conjunction node 314i. The eighteenth NMOS transistor 314f includes the source connected to the seventh conjunction node 314i, the gate connected to the Mfb, and the drain connected to the OAI gate output node 314g.

The slave output stage 316 receives the output of the OAI gate 314 from the OAI gate output node 314g, and provides the inverted output QN on an inverted output node 1302c. In an embodiment, if the output of the OAI gate is 1, then the signal on the FQ output node 1102f may be 0 and the inverted output QN may be 1. In an embodiment, if the output of the OAI gate is 0, then the signal on the FQ output node 1102f may be 1 and the inverted output QN may be 0.

The slave output stage 316 includes the nineteenth PMOS transistor 316a, the nineteenth NMOS transistor 316b, a twenty-eighth PMOS transistor 1302a, and a twenty-eighth NMOS transistor 1302b. The nineteenth PMOS transistor 316a may be connected to the VDD voltage, the OAI gate output node 314g, and the FQ output node 1102f. The nineteenth NMOS transistor 316b may be connected to the VSS voltage, the OAI gate output node 314g, and the FQ output node 1102f. The twenty-eighth PMOS transistor 1302a may be connected to the VDD voltage, the FQ output node 1102f, and the inverted output node 1302c. The twenty-eighth NMOS transistor 1302b may be connected to the VDD voltage, the FQ output node 1102f, and the inverted output node 1302c. The nineteenth PMOS transistor 316a includes the source connected to the VDD voltage, the gate connected to the OAI gate output node 314g, and the drain connected to the FQ output node 1102f. The nineteenth NMOS transistor 316b includes the source connected to the VSS voltage, the gate connected to the OAI gate output node 314g, and the drain connected to the FQ output node 1102f. The twenty-eighth PMOS transistor 1302a includes a source connected to the VDD voltage, a gate connected to the FQ output node 1102f, and a drain connected to the inverted output node 1302c. The twenty-eighth NMOS transistor 1302b includes a source connected to the VSS voltage, a gate connected to the FQ output node 1102f, and a drain connected to the inverted output node 1302c.

Figure 14A:
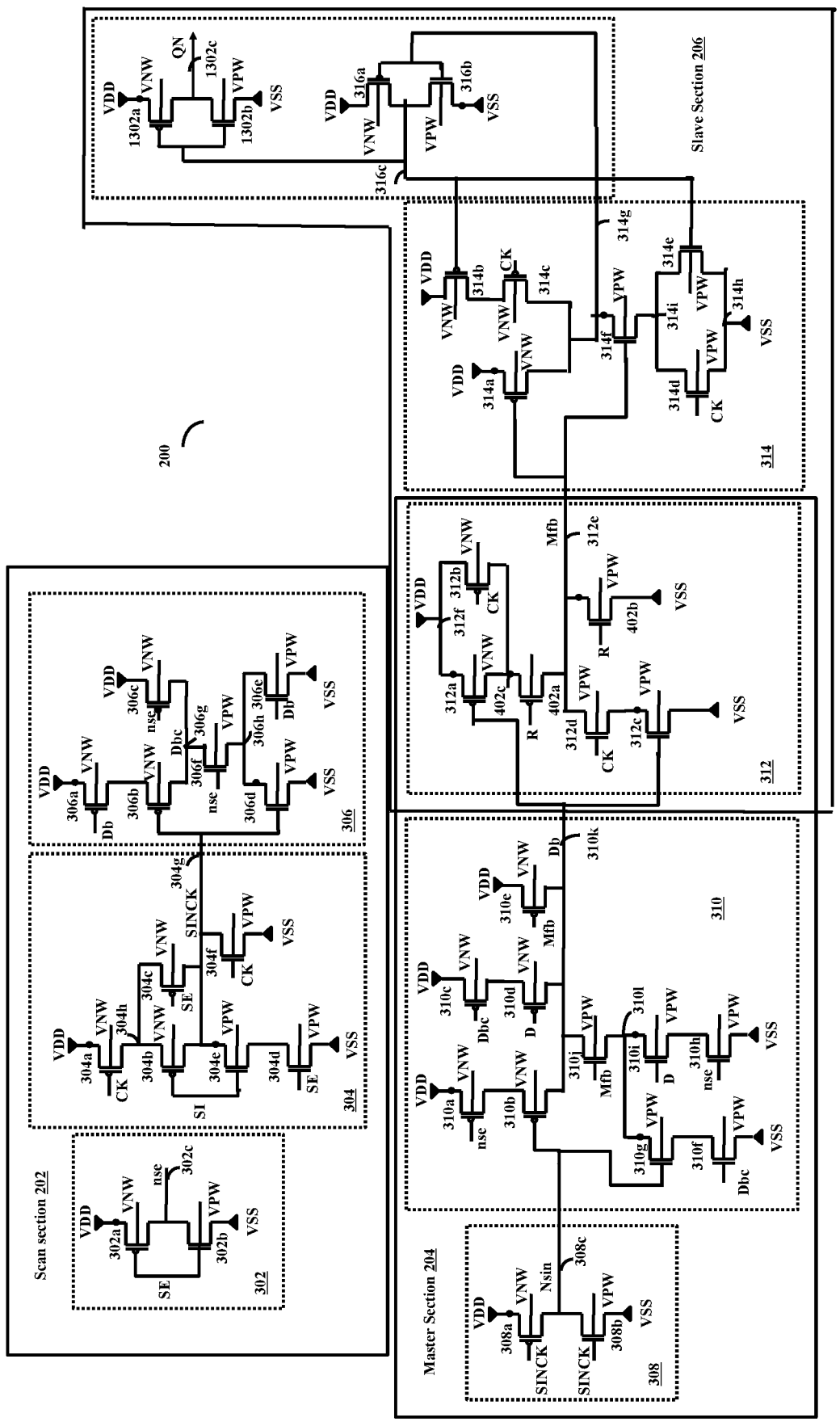
FIG. 14A is a circuit diagram depicting a flip-flop including the inverted output QN, and the reset functionality, according to various embodiments.

FIG. 14A is a circuit diagram depicting the flip-flop 200 including the inverted output QN, and the reset functionality, according to various embodiments.

The flip-flop 200 includes the scan section 202, the master section 204, and the slave section 206. The scan section 202 includes the first scan stage 302, the second scan stage 304, and the third scan stage 306. The first scan stage 302 receives the scan enable signal SE, and outputs the inverted scan enable signal nse on the first scan-stage-output node 302c. The first scan stage 302 includes the first PMOS transistor 302a, and the first NMOS transistor 302b for outputting the inverted scan enable signal nse. The second scan stage 304 receives the scan enable signal SE, the scan input signal SI, and the clock signal CK, and outputs the internal signal SINCK on the second scan-stage output node 304g. The second scan stage 304 includes the second PMOS transistor 304a, the third PMOS transistor 304b, the fourth PMOS transistor 304c, the second NMOS transistor 304d, the third NMOS transistor 304e, and the fourth NMOS transistor 304f for outputting the internal signal SINCK. The third scan stage 306 receives the internal signal SINCK, the feedback data Db, and the inverted scan enable signal nse, and outputs the inverted feedback data Dbc on the third scan-stage output node 306g, which may be provided to the master section 204. The third scan stage 306 includes the fifth PMOS transistor 306a, the sixth PMOS transistor 306b, the seventh PMOS transistor 306c, the fifth NMOS transistor 306d, the sixth NMOS transistor 306e, and the seventh NMOS transistor 306f for outputting the inverted feedback data Dbc. The configurations of the transistors of the first scan stage 302, the second scan stage 304, and the third scan stage 306, and their intended functions are depicted in FIGS. 3B, 3C and 4B, and repeated descriptions thereof are omitted for conciseness.

The master section 204 includes the first master stage 308, the second master stage 310, and the master-slave stage 312. The first master stage 308 receives the internal signal SINCK, and outputs the inverted signal Nsin on the first master-stage output node 308c. The first master stage 308 includes the eighth PMOS transistor 308a, and the eighth NMOS transistor 308b for outputting the inverted signal Nsin. The second master stage 310 receives Nsin, the inverted scan enable signal nse, the data input D, the master feedback signal Mfb, and the inverted feedback data Dbc, and outputs the previously stored data Db on the second master-stage output node 310k. The second master stage 310 includes the ninth PMOS transistor 310a, the tenth PMOS transistor 310b, the eleventh PMOS transistor 310c, the twelfth PMOS transistor 310d, the thirteenth PMOS transistor 310e, the ninth NMOS transistor 310f, the tenth NMOS transistor 310g, the eleventh NMOS transistor 310h, the twelfth NMOS transistor 310i, and the thirteenth NMOS transistor 310j for outputting the previously stored data/feedback data Db. The configurations of the transistors of the first master stage 308, and the second master stage 310, and their intended functions are described in FIGS. 3A, 3B and 3D, and repeated descriptions thereof are omitted for conciseness.

The master-slave stage 312 receives the previously stored data Db, the reset control signal R and the clock signal CK, and outputs the master feedback signal Mfb on the common master-slave output node 312e. The master-slave stage 312 includes the fourteenth PMOS transistor 312a, the fifteenth PMOS transistor 312b, the fourteenth NMOS transistors 312c, the fifteenth NMOS transistor 312d, the twentieth PMOS transistor 402a, and the twentieth NMOS transistor 402b for outputting the master feedback signal Mfb. The configurations of the transistors of the master-slave stage 312, and their intended functions are described in FIG. 4B, and repeated descriptions thereof are omitted for conciseness.

Figure 14B:
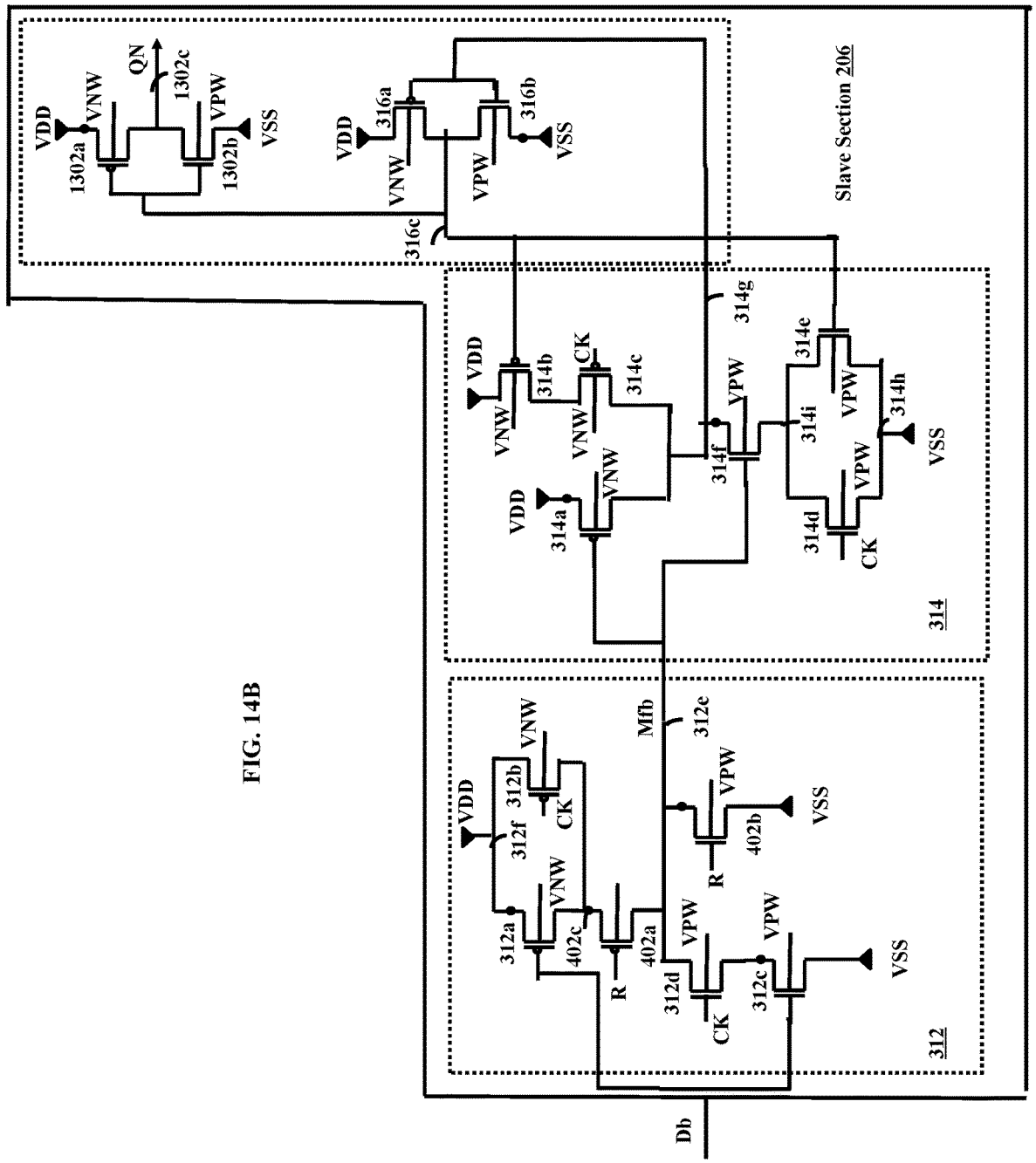
FIG. 14B is a circuit diagram depicting a slave section of the flip-flop with the inverted output QN and the reset functionality, according to various embodiments.

As depicted in FIGS. 14 and 14B, the slave section 206 includes the OAI gate 314, and the slave output stage 316. The OAI gate 314 fetches the master feedback signal Mfb from the master section 204 and provides the output on the OAI gate output node 314g based on the clock signal CK, the fetched master feedback signal Mfb, and the data present on the FQ output node 1102f, wherein the output corresponds to 1 or 0. The OAI gate 314 includes the sixteenth PMOS transistor 314a, the seventeenth PMOS transistor 314b, the eighteenth PMOS transistor 314c, the sixteenth NMOS transistor 314d, the seventeenth NMOS transistor 314e, and the eighteenth NMOS transistor 314f for providing the output 0 or 1. The configurations of the transistors of the OAI gate 314, and their intended functions are depicted in FIG. 13A, and repeated descriptions thereof are omitted for conciseness.

The slave output stage 316 receives the output of the OAI gate 314 from the OAI gate output node 314g, and provides the inverted output QN on the inverted output node 1302c. The slave output stage 316 includes the nineteenth PMOS transistor P19 316a, the nineteenth NMOS transistor 316b, the twenty-eighth PMOS transistor 1302a, and the twenty-eighth NMOS transistor 1302b for outputting the inverted QN on the inverted output node 1302c. The configurations of the transistors of the slave output stage 316, and their intended functions are depicted in FIG. 13A, and repeated descriptions thereof are omitted for conciseness.

In an embodiment, for enabling the flip-flop 200 with the unbarred output to perform the reset operation, the reset control signal R=1 may be applied to the gate of the twentieth PMOS transistor P20 402a and the gate of the twentieth NMOS transistor N20 402b of the master-slave stage 312. The master-slave stage 312 outputs the master feedback signal Mfb as Mfb=0, if Db=1 and R=1. The master feedback signal Mfb=0, and the output of the FQ output node FQ=0 may be provided to the OAI gate 314. The OAI gate 314 provides the output as 1, since the Mfb=0 and FQ=0. The output of the OAI gate 314 (i.e. 1) may be provided to the slave output stage 316 of the slave section 206. The slave output stage 316 provides the inverted output QN Q as QN=1, since the output of the OAI gate 314 is 1, and R=1. Thus, performing the reset operation.

Figure 15A:
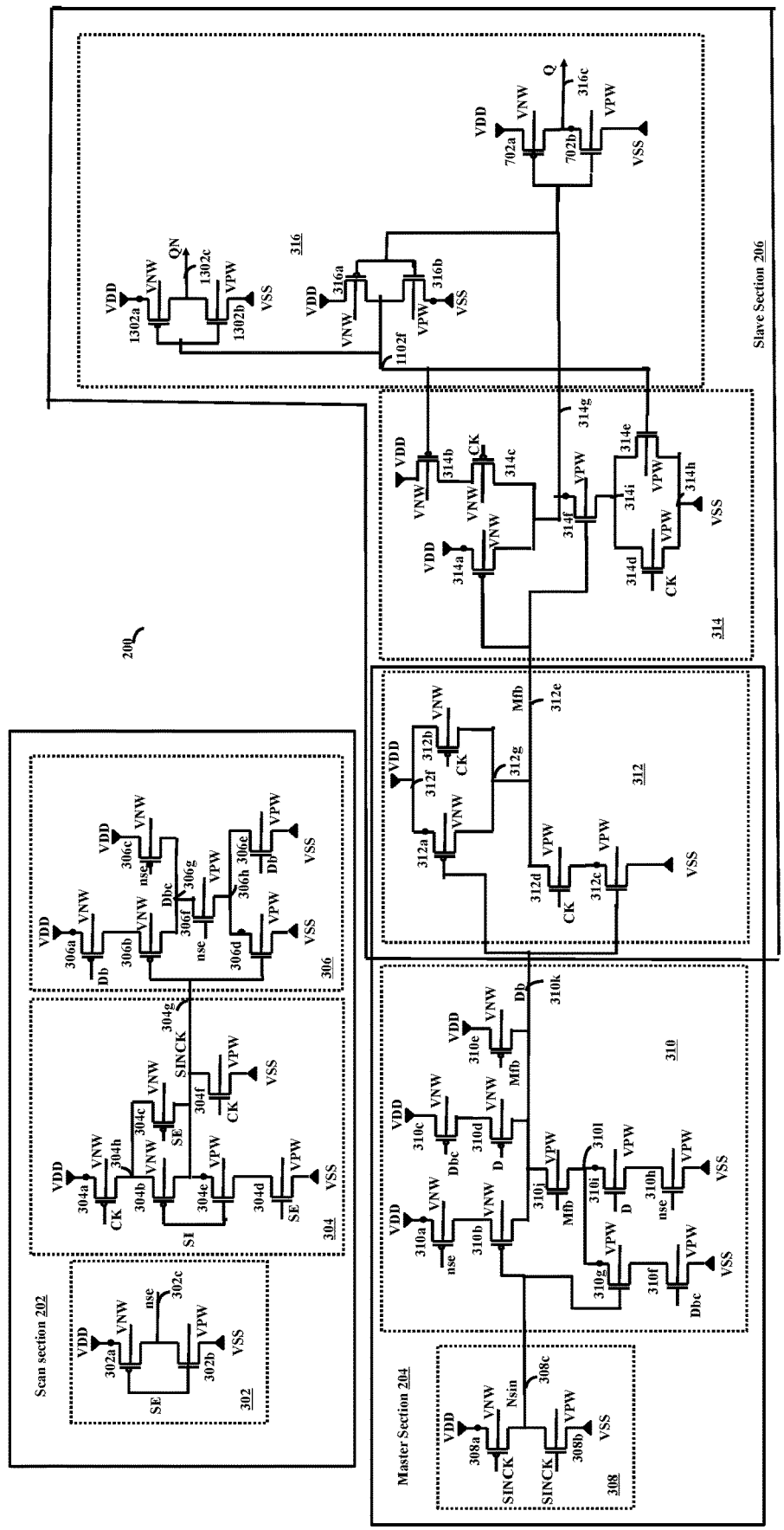
FIG. 15A is a circuit diagram depicting a flip-flop including both an output Q (non-inverted output), and the inverted output QN, according to various embodiments.

FIG. 15A is a circuit diagram depicting the flip-flop 200 including both the non-inverted output Q and the inverted output QN, according to various embodiments.

The flip-flop 200 includes the scan section 202, the master section 204, and the slave section 206. The scan section 202 includes the first scan stage 302, the second scan stage 304, and the third scan stage 306. The first scan stage 302 receives the scan enable signal SE, and outputs the inverted scan enable signal nse on the first scan-stage-output node 302c. The first scan stage 302 includes the first PMOS transistor 302a, and the first NMOS transistor 302b for outputting the inverted scan enable signal nse. The second scan stage 304 receives the scan enable signal SE, the scan input signal SI, and the clock signal CK, and outputs the internal signal SINCK on the second scan-stage output node 304g. The second scan stage 304 includes the second PMOS transistor 304a, the third PMOS transistor 304b, the fourth PMOS transistor 304c, the second NMOS transistor 304d, the third NMOS transistor 304e, and the fourth NMOS transistor 304f for outputting the internal signal SINCK. The third scan stage 306 receives the internal signal SINCK, the feedback data Db, and the inverted scan enable signal nse, and outputs the inverted feedback data Dbc on the third scan-stage output node 306g, which may be provided to the master section 204. The third scan stage 306 includes the fifth PMOS transistor 306a, the sixth PMOS transistor 306b, the seventh PMOS transistor 306c, the fifth NMOS transistor 306d, the sixth NMOS transistor 306e, and the seventh NMOS transistor 306f for outputting the inverted feedback data Dbc. The configurations of the transistors of the first scan stage 302, the second scan stage 304, and the third scan stage 306, and their intended functions are depicted in FIGS. 3B, 3C and 4B, and repeated descriptions thereof are omitted for conciseness.

The master section 204 includes the first master stage 308, the second master stage 310, and the master-slave stage 312. The first master stage 308 receives the internal signal SINCK, and outputs the inverted signal Nsin on the first master-stage output node 308c. The first master stage 308 includes the eighth PMOS transistor 308a, and the eighth NMOS transistor 308b for outputting the inverted signal Nsin. The second master stage 310 receives Nsin, the inverted scan enable signal nse, the data input D, the master feedback signal Mfb, and the inverted feedback data Dbc, and outputs the previously stored data Db on the second master-stage output node 310k. The second master stage 310 includes the ninth PMOS transistor 310a, the tenth PMOS transistor 310b, the eleventh PMOS transistor 310c, the twelfth PMOS transistor 310d, the thirteenth PMOS transistor 310e, the ninth NMOS transistor 310f, the tenth NMOS transistor 310g, the eleventh NMOS transistor 310h, the twelfth NMOS transistor 310i, and the thirteenth NMOS transistor 310j for outputting the previously stored data/feedback data Db. The master-slave stage 312 receives the previously stored data Db, and the clock signal CK, and outputs the master feedback signal Mfb on the common master-slave output node 312e. The master-slave stage 312 includes the fourteenth PMOS transistor 312a, the fifteenth PMOS transistor 312b, the fourteenth NMOS transistors 312c, and the fifteenth NMOS transistor 312d for outputting the master feedback signal Mfb. The configurations of the transistors of the first master stage 308, the second master stage 310, and the master-slave stage 312, and their intended functions are described in FIGS. 3A, 3B and 3D, and repeated descriptions thereof are omitted for conciseness.

Figure 15B:
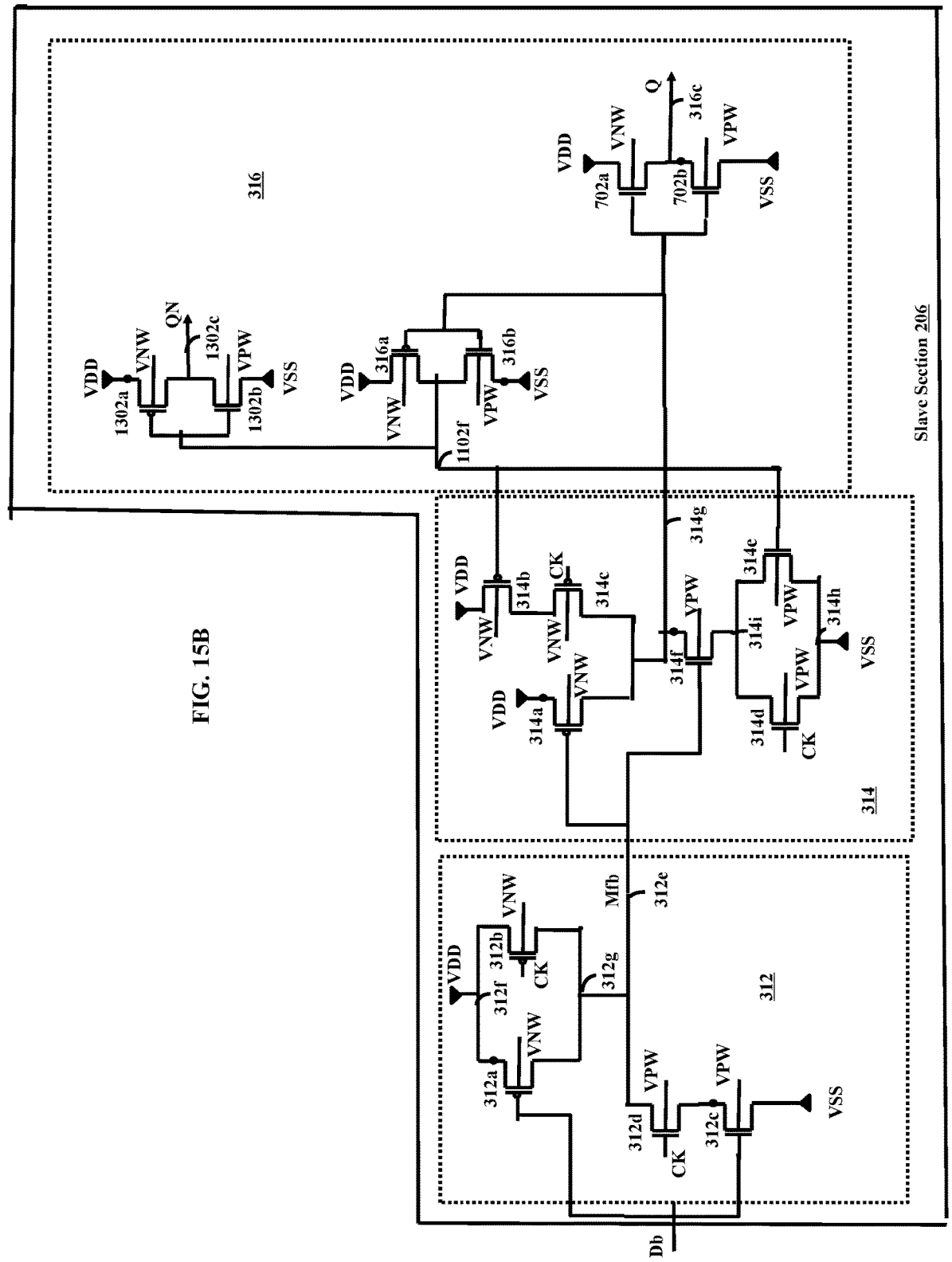
FIG. 15B is a circuit diagram depicting a slave section of the flip-flop including the output Q and the inverted output QN, according to various embodiments.

As depicted in FIGS. 15A and 15B, the slave section 206 includes the OAI gate 314, and the slave output stage 316. The OAI gate 314 fetches the master feedback signal Mfb and provides the output on the OAI gate output node 314g based on the clock signal CK, the fetched master feedback signal Mfb, and the data present on the FQ output node 1102f, wherein the output corresponds to 1 or 0. The OAI gate 314 includes the sixteenth PMOS transistor 314a, the seventeenth PMOS transistor 314b, the eighteenth PMOS transistor 314c, the sixteenth NMOS transistor 314d, the seventeenth NMOS transistor 314e, and the eighteenth NMOS transistor 314f for providing the output 0 or 1. The configurations of the transistors of the OAI gate 314, and their intended functions are depicted in FIG. 13.

The slave output stage 316 receives the output of the OAI gate 314 from the OAI gate output node 314g, and provides the inverted output Q on the inverted output node 1302c. In an embodiment, if the output of the OAI gate is 1, then the signal on the FQ output node 1102f may be 0, the inverted output QN may be 1, and the output Q may be 0. In an embodiment, if the output of the OAI gate is 0, then the signal on the FQ output node 1102f may be 1, the inverted output QN may be 0, and the output Q may be 1.

The slave output stage 316 includes the nineteenth PMOS transistor 316a, the twenty-fourth PMOS transistor 702a, the twenty-eighth PMOS transistor 1302b, the nineteenth NMOS transistor 316b, the twenty-eighth NMOS transistor 1302c, and the twenty-fourth NMOS transistor 702b. The nineteenth PMOS transistor 316a may be connected to the VDD voltage, the OAI gate output node 314g, and the FQ output node 1102f The nineteenth NMOS transistor 316b may be connected to the VSS voltage, the OAI gate output node 314g, and the FQ output node 1102f The twenty-eighth PMOS transistor 1302a may be connected to the VDD voltage, the FQ output node 1102f, and the inverted output node 1302c. The twenty-eighth NMOS transistor 1302b may be connected to the VDD voltage, the FQ output node 1102f, and the inverted output node 1302c. The twenty-fourth PMOS transistor 702a may be connected to the VDD voltage, the OAI gate output node 314g, and the output node 316c. The twenty-fourth NMOS transistor 702b may be connected to the VSS voltage, the OAI gate output node 314g, and the output node 316c.

The nineteenth PMOS transistor 316a includes the source connected to the VDD voltage, the gate connected to the OAI gate output node 314g, and the drain connected to the FQ output node 1102f The nineteenth NMOS transistor 316b includes the source connected to the VSS voltage, the gate connected to the OAI gate output node 314g, and the drain connected to the FQ output node 1102f The twenty-eighth PMOS transistor 1302a includes the source connected to the VDD voltage, the gate connected to the FQ output node 1102f, and the drain connected to the inverted output node 1302c. The twenty-eighth NMOS transistor 1302b includes the source connected to the VSS voltage, the gate connected to the FQ output node 1102f, and the drain connected to the inverted output node 1302c. The twenty-fourth PMOS transistor 702a includes the source connected to the VDD voltage, the gate connected to the OAI gate output node 314g, and the drain connected to the output node 316c. The twenty-fourth NMOS transistor 702b includes the source connected to the VSS voltage, the gate connected to the OAI gate output node 314g, and the drain connected to the output node 316c.

Figure 16:
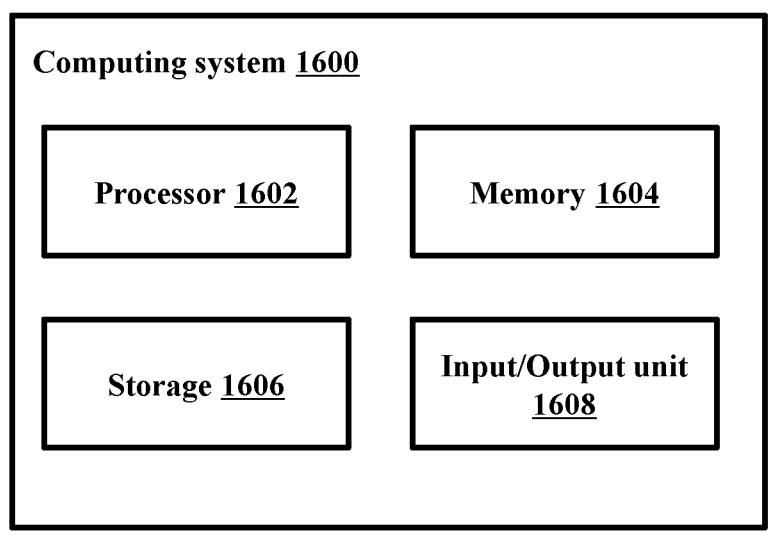
FIG. 16 depicts an exemplary computing system including a flip-flop, according to various embodiments.

FIG. 16 depicts an exemplary computing system 1600 including the flip-flop 200, according to various embodiments. The computing system 1600 includes a processor 1602, a memory 1604, a storage 1606, an input/output unit 1606, and so on. In embodiment, at least one of a plurality of semiconductor devices, integrated circuits, sequential logic circuits, and so on, which are included in the processor 1602, the memory 1604, the storage 1606, and the input/output unit 1608 may include the flip-flop 200.

The processor 1602 may perform certain arithmetic operations or tasks. In an embodiment, the processor 1602 may be at least one of a single processer, a plurality of processors, multiple homogenous cores, multiple heterogeneous cores, multiple Central Processing Unit (CPUs) of different kinds and so on. The processor 1602 may communicate with the memory 1604, the storage 1606, and the input/output unit 1608 through a bus such as an address bus, a control bus, a data bus, and/or the like. The processor 1602 may also be connected to an extension bus such as a peripheral component interconnect (PCI) bus or the like.

The memory 1604 may store data necessary for an operation of the computing system 1602. The memory 1604 may include one or more computer-readable storage media. The memory 102 may include non-volatile storage elements. Examples of such non-volatile storage elements may include magnetic hard discs, optical discs, floppy discs, flash memories, or forms of electrically programmable memories (EPROM) or electrically erasable and programmable (EEPROM) memories. In addition, the memory 1604 may, in some examples, be considered a non-transitory storage medium. The term "non-transitory" may indicate that the storage medium is not embodied in a carrier wave or a propagated signal. However, the term "non-transitory" should not be interpreted to mean that the memory 1604 is non-movable. In certain examples, a non-transitory storage medium may store data that may, over time, change (e.g., in Random Access Memory (RAM) or cache). In addition, the memory 1604 may include, but is not limited to, a dynamic random access memory (DRAM), a mobile DRAM, a static random access memory (SRAM), a phase-change random access memory (PRAM), a ferroelectric random access memory (FRAM), a resistive random access memory (RRAM), a magnetic random access memory (MRAM), and so on.

The storage 1606 may include a solid state drive, a hard disk drive, a CD-ROM, and/or the like. The input/output unit 1608 may include an input means, such as a keyboard, keypad, a mouse, and/or the like, and an output means such as a printer, a display, and/or the like.

The embodiments disclosed herein may be implemented through at least one software program running on at least one hardware device and performing network management functions to control the elements. Each of the elements shown in FIGS. 2A-16 may be at least one of a hardware device, or a combination of hardware device and software module.

The foregoing description of the specific embodiments will so fully reveal the general nature of the embodiments herein that others may, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of embodiments, those skilled in the art will recognize that the embodiments herein may be practiced with modification within the spirit and scope of the embodiments as described herein.

We claim:

1. A flip-flop comprising:
a scan section;
a master section; and
a slave section,
wherein the scan section is configured to receive a scan enable signal, a scan input signal, a clock signal, and feedback data from the master section, and output an internal signal to the master section based on the scan enable signal, the scan input signal, the clock signal, and the feedback data,
wherein the master section is coupled to the scan section and is configured to receive the internal signal and a data input, and output a master feedback signal to the slave section based on the internal signal, the data input, and the feedback data,
wherein the slave section is coupled to the master section and configured to generate an output by latching the master feedback signal received from the master section according to the clock signal, and
wherein the clock signal is a True-Single-Phase-Clock (TSPC).

2. The flip-flop of claim 1, wherein the flip-flop is a scan D flip-flop configured to perform at least one of a data storage operation or a scan test operation.

3. The flip-flop of claim 1, wherein nodes of the flip-flop are pre-charged to a high voltage level to enable faster passage of the data input to the output at a positive edge of the clock signal.

4. The flip-flop of claim 1, wherein the scan section comprises:
a first scan stage configured to receive the scan enable signal, and output an inverted scan enable signal to a first scan-stage output node;
a second scan stage configured to receive the clock signal, the scan input signal, and the scan enable signal, and output a signal SINCK as an AND-OR function of the clock signal, the scan input signal, and the scan enable signal to a second scan-stage output node; and
a third scan stage configured to receive the signal SINCK from the second scan stage, the inverted scan enable signal from the first scan stage, and the feedback data from the master section, the feedback data corresponding to previously stored data in the master section, and output inverted feedback data to a third scan-stage output node,
wherein the internal signal that is output to the master section comprises the inverted feedback data.

5. The flip-flop of claim 4, wherein:
the first scan stage comprises a first P-type metal-oxide-semiconductor (PMOS) transistor, and a first N-type metal-oxide-semiconductor (NMOS) transistor which output the inverted scan enable signal to the first scan-stage output node;
the second scan stage comprises a second PMOS transistor, a third PMOS transistor, a fourth PMOS transistor, a second NMOS transistor, a third NMOS transistor, and a fourth NMOS transistor which output the signal SINCK to the second scan-stage output node; and
the third scan stage comprises a fifth PMOS transistor, a sixth PMOS transistor, a seventh PMOS transistor, a fifth NMOS transistor, a sixth NMOS transistor, and a seventh NMOS transistor which output the inverted feedback data to the third scan-stage output node.

6. The flip-flop of claim 5, wherein:
the first PMOS transistor includes a source connected to a VDD voltage, a gate that receives the scan enable signal, and a drain connected to the first scan-stage output node; and
the first NMOS transistor includes a source connected to a VSS voltage, a gate that receives the scan enable signal, and a drain connected to the first scan-stage output node.

7. The flip-flop of claim 5, wherein
the second PMOS transistor includes a source connected to a VDD voltage, a gate that receives the clock signal, and a drain connected to a first conjunction node;
the third PMOS transistor includes a source connected to the first conjunction node, a gate that receives the scan input signal, and a drain connected to the second scan-stage output node;
the fourth PMOS transistor includes a source connected to the first conjunction node, a gate that receives the scan enable signal, and the drain connected to the second scan-stage output node;
the second NMOS transistor includes a source connected to a VSS voltage, a gate that receives the scan enable signal, and a drain connected to a source of the third NMOS transistor;
the third NMOS transistor includes a gate that receives the scan input signal, and a drain connected to the second scan-stage output node; and
the fourth NMOS transistor includes a source connected to the VSS voltage, a gate that receives the clock signal, and the drain connected to the second scan-stage output node.

8. The flip-flop of claim 5, wherein
the fifth PMOS transistor includes a source connected to a VDD voltage, a gate that receives the feedback data of the master section, and a drain connected to a source of the sixth PMOS transistor;
the sixth PMOS transistor includes a gate connected to the second scan-stage output node, and a drain connected to the third scan-stage output node;
the seventh PMOS transistor includes a source connected to the VDD voltage, a gate connected to the first scan-stage output node, and a drain connected to the third scan-stage output node;
the fifth NMOS transistor includes a source connected to a VSS voltage, a gate connected to the second scan-stage output node, and a drain connected to a second conjunction node;
the sixth NMOS transistor includes a source connected to the VSS voltage, a gate that receives the feedback data of the master section, and a drain connected to the second conjunction node; and
the seventh NMOS transistor includes a source connected to the second conjunction node, a gate connected to the first scan-stage output node, and a drain connected to the third scan-stage output node.

9. The flip-flop of claim 1, wherein the master section is configured to output the master feedback signal by:
retaining the feedback data by latching the internal signal received from the scan section, when the clock signal is at a high logic level; and
transferring at least one of the data input or the scan input signal to the slave section based on the scan enable signal, when the clock signal is at a low logic level.

10. The flip-flop of claim 9, wherein the master section comprises:
a first master stage;
a second master stage; and
a master-slave stage,
wherein the first master stage is configured to receive a signal SINCK and output an inverted signal Nsin, which is an inversion of the signal SINCK, to a first master-stage output node;
wherein the second master stage is configured to receive the inverted signal Nsin from the first master stage, an inverted scan enable signal, the data input, inverted feedback data, the master feedback signal from the master-slave stage, and output the feedback data to a second master-stage output node; and
wherein the master-slave stage is configured to receive the feedback data from the second master stage, and the clock signal, and output the master feedback signal to a common master-slave stage output node.

11. The flip-flop of claim 10, wherein
the first master stage comprises an eighth PMOS transistor, and an eighth NMOS transistor to output the inversion of the signal SINCK on the first master-stage output node;
the second master stage comprises a ninth PMOS transistor, a tenth PMOS transistor, an eleventh PMOS transistor, a twelfth PMOS transistor, and a thirteenth PMOS transistor, a ninth NMOS transistor, a tenth NMOS transistor, an eleventh NMOS transistor, a twelfth NMOS transistor, and a thirteenth NMOS transistor to output the feedback data on the second master-stage output node; and
the master-slave stage comprises a fourteenth PMOS transistor, a fifteenth PMOS transistor, a fourteenth NMOS transistor, and a fifteenth NMOS transistor to output the master feedback signal on the common master-slave stage output node.

12. The flip-flop of claim 11, wherein
the eighth PMOS transistor includes a source connected to a VDD voltage, a gate that receives the signal SINCK, and a drain connected to the first master-stage output node; and
the eighth NMOS transistor includes a source connected to a VSS voltage, a gate that receives the signal SINCK, and a drain connected to the first master-stage output node.

13. The flip-flop of claim 11, wherein:
the ninth PMOS transistor includes a source connected to a VDD voltage, a gate connected to a first scan-stage output node, and a drain connected to a source of the tenth PMOS transistor;
the tenth PMOS transistor includes a gate connected to the first master-stage output node, and a drain connected to the second master-stage output node;
the eleventh PMOS transistor includes a source connected to the VDD voltage, a gate connected to a third scan-stage output node, and a drain connected to a source of the twelfth PMOS transistor;
the twelfth PMOS transistor includes a gate that receives the data input, and a drain connected to the second master-stage output node;
the thirteenth PMOS transistor includes a source connected to the VDD voltage, a gate connected to the common master-slave stage output node, and a drain connected to the second master-stage output node;
the ninth NMOS transistor includes a source connected to a VSS voltage, a gate connected to the third scan-stage output node, and a drain connected to a source of the tenth NMOS transistor;
the tenth NMOS transistor includes a gate connected to the first master-stage output node, and a drain connected to a third conjunction node;
the eleventh NMOS transistor includes a source connected to the VSS voltage, a gate connected to the first scan-stage output node, and a drain connected to a source of the twelfth NMOS transistor;
the twelfth NMOS transistor includes a gate that receives the data input, and a drain connected to the third conjunction node; and
the thirteenth NMOS transistor includes a source connected to the third conjunction node, a gate connected to the common master-slave stage output node, and a drain connected to the second master-stage output node.

14. The flip-flop of claim 11, wherein:
the fourteenth PMOS transistor includes a source connected to a fourth conjunction node, a gate connected to the second master-stage output node, and a drain connected to a fifth conjunction node, wherein the fourth conjunction node is connected to a VDD voltage, and the fifth conjunction node is connected to the common master-slave stage output node;
the fifteenth PMOS transistor includes a source connected to the fourth conjunction node, a gate that receives the clock signal, and a drain connected to the fifth conjunction node;
the fourteenth NMOS transistor includes a source connected to a VSS voltage, a gate connected to the second master-stage output node, and a drain connected to a source of the fifteenth NMOS transistor; and
the fifteenth NMOS transistor includes a gate that receives the clock signal, and a drain connected to the common master-slave stage output node.

15. The flip-flop of claim 11, wherein the slave section comprises:
an OR-AND-Invert logic (OAI) gate configured to receive the master feedback signal from the master-slave stage and the clock signal, and to provide an OAI output to an OAI gate output node, wherein the OAT output corresponds to 1 or 0; and
a slave output stage configured to receive the OAT output of the OAT gate from the OAT gate output node, and generate the output to an output node.

16. The flip-flop of claim 15, wherein:
the OAI gate comprises a sixteenth PMOS transistor, a seventeenth PMOS transistor, an eighteenth PMOS transistor, a sixteenth NMOS transistor, a seventeenth NMOS transistor, and an eighteenth NMOS transistor to output the OAI output on the OAI gate output node; and
the slave output stage comprises a nineteenth PMOS transistor, and a nineteenth NMOS transistor to generate the output on the output node.

17. The flip-flop of claim 16, wherein
the sixteenth PMOS transistor includes a source connected to a VDD voltage, a gate connected to the master-slave stage, and a drain connected to the OAI gate output node;
the seventeenth PMOS transistor includes a source connected to the VDD voltage, a gate connected to the output node of the slave output stage, and a drain connected to a source of the eighteenth PMOS transistor;

the eighteenth PMOS transistor includes a gate that receives the clock signal, and a drain connected to the OAI gate output node;

the sixteenth NMOS transistor includes a source connected to a sixth conjunction node, a gate that receives the clock signal, and a drain connected to a seventh conjunction node, wherein the sixth conjunction node is connected to a VSS voltage;

the seventeenth NMOS transistor includes a source connected to the sixth conjunction node, a gate connected to the output node of the slave output stage, and a drain connected to the seventh conjunction node; and the eighteenth NMOS transistor includes a source connected to the seventh conjunction node, a gate connected to the common master-slave stage output node, and a drain connected to the OAI gate output node.

18. The flip-flop of claim 16, wherein the nineteenth PMOS transistor includes a source connected to a VDD voltage, a gate connected to the OAI gate output node, and a drain connected to the output node; and the nineteenth PMOS transistor includes a source connected to a VSS voltage, a gate connected to the OAI gate output node, and a drain connected to the output node.

19. A flip-flop comprising:

a scan section;

a master section; and a slave section, wherein the scan section comprises:
  a first scan stage configured to receive a scan enable signal, and output an inverted scan enable signal to a first scan-stage output node;
  a second scan stage configured to receive a clock signal, a scan input signal, and the scan enable signal, and output a signal SINCK as an AND-OR function of the clock signal, the scan input signal, and the scan enable signal to a second scan-stage output node; and
  a third scan stage configured to receive the signal SINCK from the second scan stage, the inverted scan enable signal from the first scan stage, and feedback data from the master section, the feedback data corresponding to previously stored data in the master section, and output inverted feedback data to a third scan-stage output node, wherein the master section comprises:
  a first master stage configured to receive the signal SINCK from the second scan stage and output an inverted signal Nsin, which is an inversion of the signal SINCK, to a first master-stage output node;
  a second master stage configured to receive the inverted signal Nsin from the first master stage, the inverted scan enable signal from the first scan stage, a data input, the inverted feedback data from the third scan stage, a master feedback signal, and output the feedback data to a second master-stage output node; and
  a master-slave stage configured to receive the feedback data from the second master stage, and the clock signal, and output the master feedback signal to a common master-slave stage output node, wherein the slave section comprises:
an OR-AND-Invert logic (OAI) gate configured to receive the master feedback signal from the master-slave stage and the clock signal, and to provide an OAI output to an OAI gate output node, wherein the OAI output corresponds to 1 or 0; and a slave output stage configured to receive the OAI output of the OAI gate from the OAI gate output node, and generate an output to an output node, and wherein the clock signal is a True-Single-Phase-Clock (TSPC).

20. A flip-flop comprising:

a scan section;

a slave section;

a master section connected between the scan section and the slave section; and a True-Single-Phase-Clock (TSPC) connected to the scan section, the slave section and the master section, wherein the master section receives a data input from outside the flip-flop and at least one internal signal from the scan section, and outputs feedback data to the scan section and master feedback signal to the slave section, wherein the scan section receives a scan enable signal, a scan input signal, and the feedback data, and outputs the at least one internal signal to the master section based on the scan enable signal, the scan input signal, the TSPC, and the feedback data, and wherein the slave section generates an output by latching the master feedback signal according to the TSPC.

* * * * *